United States Patent [19]

Ernst et al.

[11] Patent Number: 5,381,348
[45] Date of Patent: Jan. 10, 1995

[54] TOKEN RING LOCAL AREA NETWORK TESTING APPARATUS USING TIME DELAY REFLECTORY

[75] Inventors: Steve Ernst; Gordon A. Jensen, both of Colorado Springs, Colo.

[73] Assignee: Fluke Corporation, Everett, Wash.

[21] Appl. No.: 3,250

[22] Filed: Jan. 11, 1993

[51] Int. Cl.⁶ .............................................. G06K 7/00
[52] U.S. Cl. ..................... 364/514; 324/533
[58] Field of Search ............... 364/514, 533, 534; 379/6

[56] References Cited

U.S. PATENT DOCUMENTS

| | | | |
|---|---|---|---|
| 4,739,276 | 4/1988 | Graube | 324/534 |
| 4,943,993 | 7/1990 | Fore | 379/6 |
| 4,970,466 | 11/1990 | Bolles et al. | 324/533 |
| 5,046,025 | 9/1991 | Harper et al. | 364/514 |
| 5,121,342 | 6/1992 | Szymborski et al. | 364/514 |

*Primary Examiner*—Emanuel T. Voeltz
*Assistant Examiner*—Thomas Peeso
*Attorney, Agent, or Firm*—Sheridan Ross & McIntosh

[57] ABSTRACT

A token ring local area network (LAN) testing apparatus is provided. The apparatus utilizes time delay reflectory (TDR) in testing cable conductors that link or interconnect stations on the token ring with the token ring media access unit (MAU). In making the TDR related measurements, a directional coupler device is used in transmitting and receiving signals relative to the cable conductor. Information related to the magnitude and location of any cable conductor fault that is obtained. A TDR measurement can be used to determine the existence of a fault at the end of a cable conductor. A single matching impedance element is selected to match the impedance of the cable conductor before conducting any TDR measurement.

19 Claims, 31 Drawing Sheets

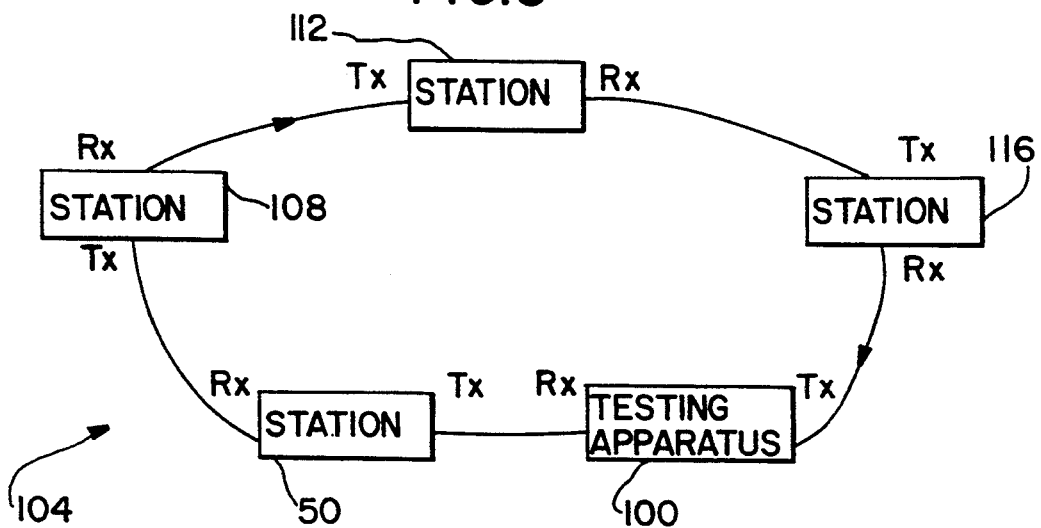
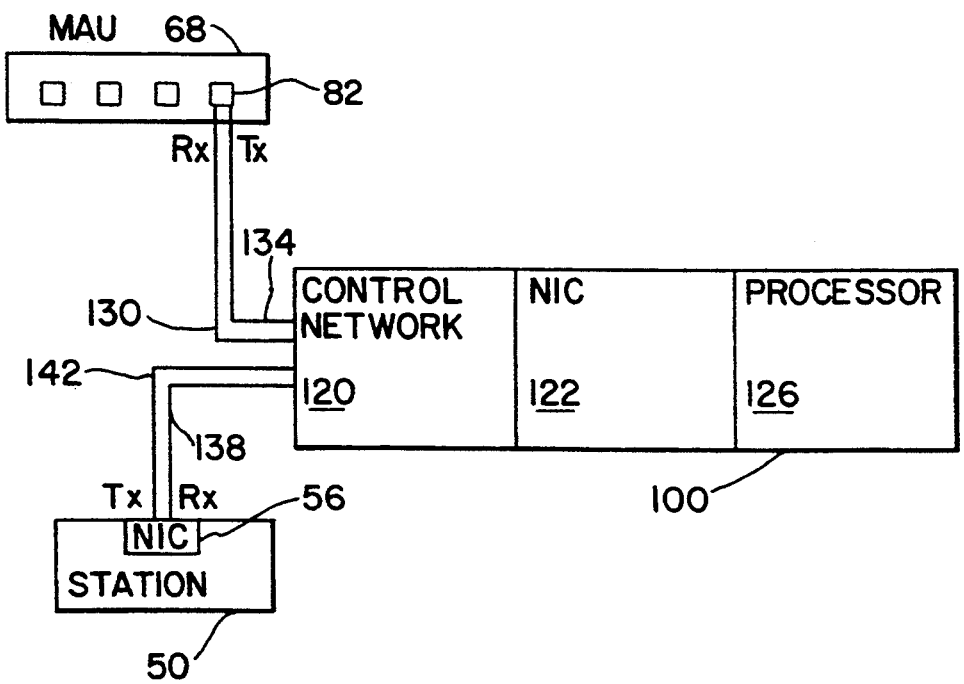

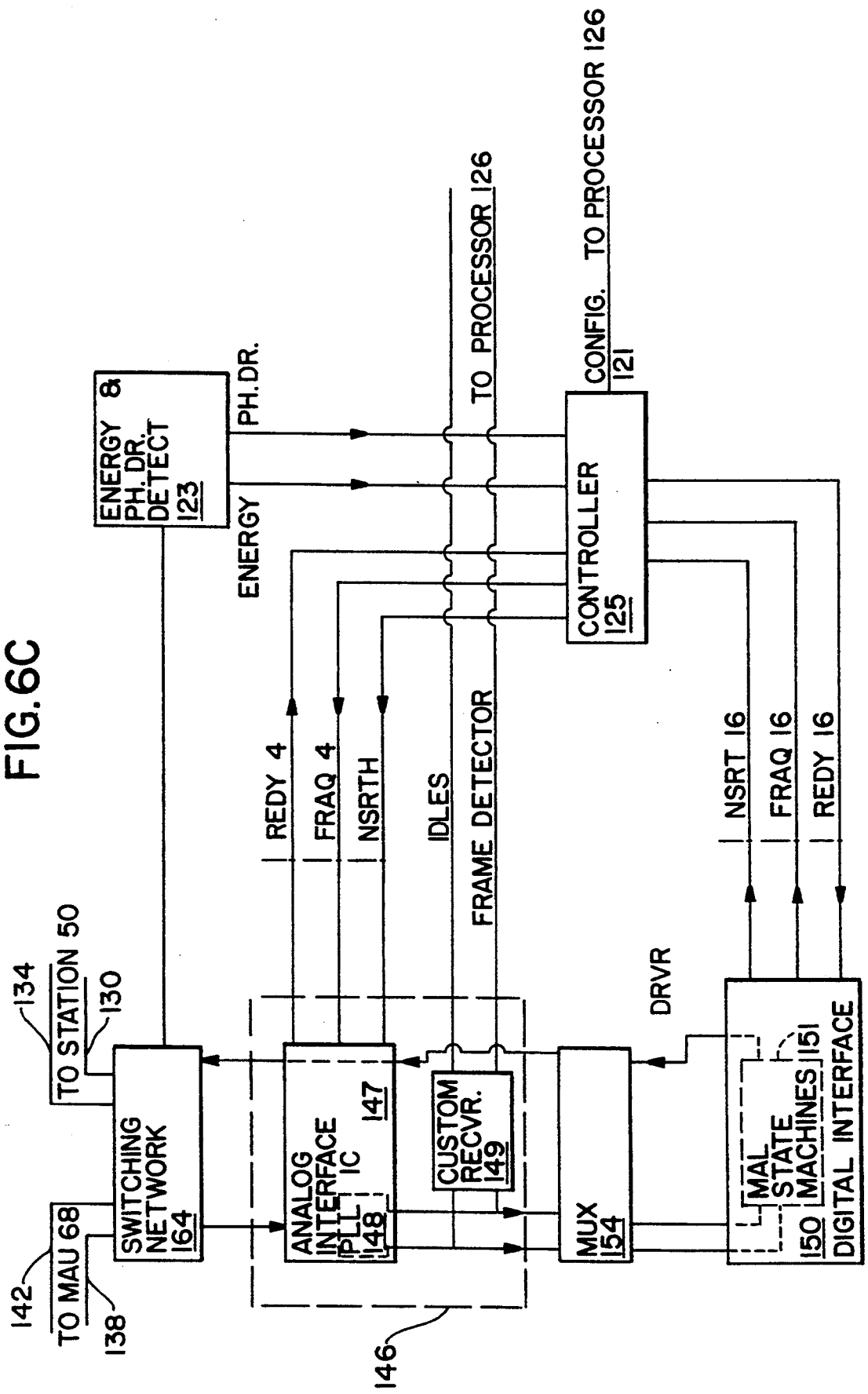

FIG.17A RECOVERED CLOCK DERIVED SIGNAL
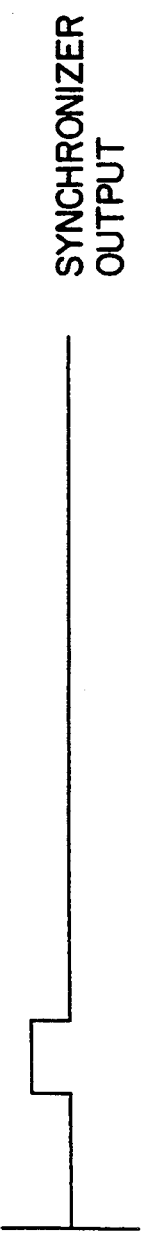
FIG.17B SYNCHRONIZER OUTPUT
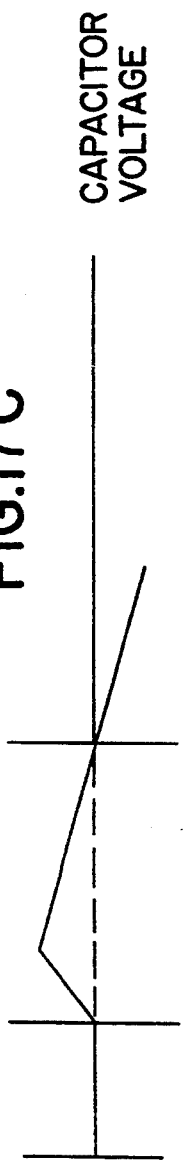
FIG.17C CAPACITOR VOLTAGE
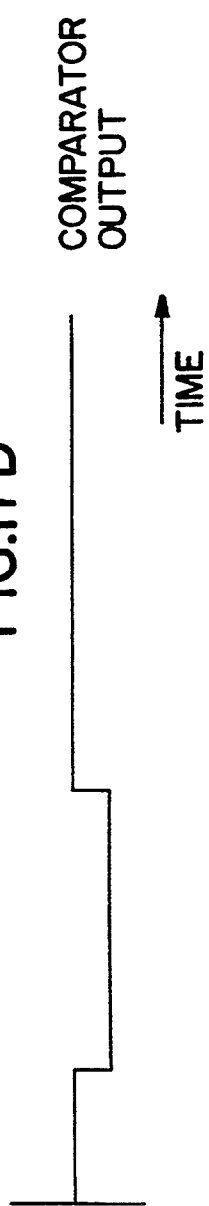
FIG.17D COMPARATOR OUTPUT
TIME

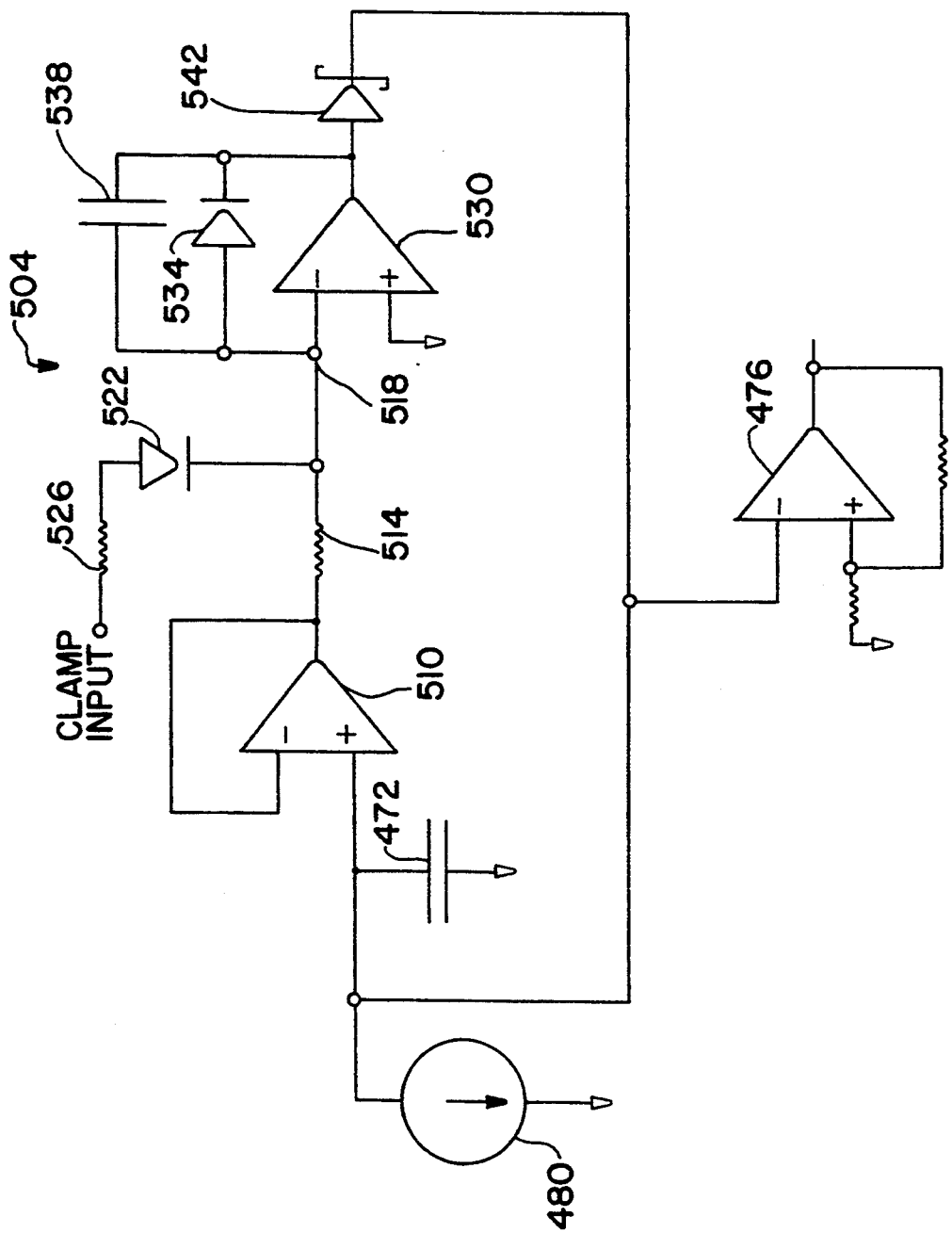

FIG. 30A

| CURRENT | LAST |
|---------|------|
| 400     | 400  |
| 100     | 100  |
| 200     | 200  |

FIG. 30B

| CURRENT | LAST |
|---------|------|
| 400     | 400  |
| 100     | 100  |
| 200     | 200  |

FIG. 30C

| CURRENT | LAST |
|---------|------|
| 400     | 400  |
| 100     | 100  |
| 200     | 200  |
| !300    |      |

FIG. 30D

| CURRENT | LAST |
|---------|------|
| 400     | 400  |
| ?100    | 100  |
| 200     | 200  |
| !300    | !300 |

FIG. 30E

| CURRENT | LAST |
|---------|------|
| 400     | 400  |
| *100    | ?100 |
| 200     | 200  |
| !300    | !300 |

TOKEN RING LOCAL AREA NETWORK TESTING APPARATUS USING TIME DELAY REFLECTORY

FIELD OF THE INVENTION

The present invention relates to network testers and, in particular, to a testing apparatus connectable to a token ring local area network.

BACKGROUND OF THE INVENTION

In general two types of local area networks (LANS) are presently available: collision based and token-ring.

Collision based LANs are wired in "parallel" so that each station on the LAN is logically connected to the same cable as every other station. As a result when any one station transmits, its signal reaches all the other stations at roughly the same time, allowing for propagation delays. Each station on the LAN watches the destination address of the transmitted frame and determines if it is the intended receiver, if it is, the station copies the frame. If two or more stations transmissions overlap in time they will interfere with each other additively and the data will be lost. This is called a collision.

Stations attempt to avoid collisions by looking for an idle state on the line before transmitting. However, due to speed of light delays, a station will not always be able to immediately detect if another station is transmitting because that station's signal might not have reached it across the cable yet. The extreme case of this is when each station begins transmitting simultaneously. When any station detects a collision it will stop transmitting, pick a random time interval, wait that interval, and then attempt to retransmit.

In a network where a high volume of frames are being sent collisions can significantly limit the usable data bandwidth on a network.

Token ring LANs avoid this limitation by allowing only one station on the network to transmit at any one time. Token ring LANs are wired in a logical ring with a transmit output from each station connected to a receive input on the next station. As long as no station has a frame to transmit a special frame called a token is circulated around the ring passed from station to station. When a station needs to transmit a frame it must wait until it receives the token. The station then removes the token from the ring, transmits its frame, then releases a new token. Thus, there can be only one token on the ring at a time and therefore only one station can be transmitting at a time.

While logically connected in a ring, the physical wiring of token ring LAN forms a star with the transmit and receive pairs for each station, combined in a single cable, running to a central point where they are connected to a media access unit (MAU). The MAU merely provides the connection of one station's transmitter to the next station's receiver to complete the logical ring. A station that is not currently part of the ring (also referred to as being DEINSERTED from the ring) will be bypassed by relays in the MAU. When that station wishes to become part of the ring (when it INSERTS) it will provide a steady DC voltage signal to cause the relays in the MAU to switch and insert it into the ring.

The protocol that describes the operation of the particular token ring LANs of interest is defined by the IEEE standard 802.5. Each station on the ring implements the Media Access Control (MAC) level of the 802.5 standard in a combination of hardware and software. Acquiring the token before transmitting as described above is one of the basic operations defined by the MAC protocol. Once a station acquires the token, it may transmit data addressed to one or more of the other stations on the ring.

Each station examines data on its receiver to determine if the data is addressed to it. If not, the data is merely buffered and regenerated through its transmitter to the next station downstream on the ring. In this way, each station acts as a repeater. If a station determines that data is addressed to itself, it will copy the data and change a "frame copied" bit in the data frame to indicate that the data has been copied. The data frame with the copied bit set is then sent to the next station downstream on the ring. Thus, when the station which originally sent the data eventually receives its own data frame back, it is able to determine that the data was successfully copied. At that point the originating station strips its transmitted frame from the ring and releases a new token. Now another station which has data to transmit may acquire the token and send data over the ring.

Part of MAC protocol requires that one station assume a leadership role of "active monitor." The active monitor can be any of the active stations on the ring and can change if the current station acting as active monitor deinserts itself from the ring or is otherwise unable to perform the duties of the active monitor. The active monitor performs several key functions in maintaining the MAC protocol. For instance, it watches for certain protocol violations and initiates recovery procedures if they are necessary. It also initiates a "neighbor notification" process by periodically sending (default of every seven seconds) an "active monitor present" frame which causes each station in turn to identify itself to its next downstream station. Neighbor notification allows network management software to obtain a map of the ring topology and inform each station of its nearest upstream active neighbor (NAUN) which is useful information in error recovery and trouble shooting. Most importantly, the active monitor provides the master or reference clock with which every station on the network must synchronize.

A typical station on a token ring network is illustrated in prior art FIG. 1. A station 50 normally comprises a processor 52, monitor 54, and a network interface card (NIC) 56. It is critical that each station include a NIC 56 since the MAC code as well as the hardware which allows a station to insert into the network are normally stored on the NIC. Each NIC is connected to the MAU by a receive pair and transmit pair, in this case 60 and 64, respectively.

As shown in prior art FIG. 2, MAU 68 includes a plurality of relays and ports to connect stations on the token ring. For example, the transmit pair from port 72 is connected to the receive pair of port 76, and the transmit pair of port 76 is connected to the receive pair of port 80 and the transmit pair from port 80 is connected to the receive pair of port 82. Each port also contains relays including relays 84, 86, which connect to incoming transmit and receive pairs from a station's NIC. Relays 84, 86 remain connected to each other, thereby looping the transmit and receive pair from a station back on each other, until the station 50 applies a "phantom voltage" of +5 v to open the relays 84, 86 and insert the station 50 into the network. Until the phantom voltage is applied, the transmit and receive pairs of a port are electrically connected to each other.

Occasionally, problems arise in the operation of a token ring. For instance, sometimes the ring will enter a "beacon state" in which the entire operation of the ring will be shut down until the problem is solved. One example of an error which would cause a beaconing ring is if a station on the ring has a bad NIC and is not correctly repeating frames. This could cause the token to be lost, and no station could then send data. Another problem that occasionally arises relates to the inability of a station to insert into the ring. In order to troubleshoot problems such as these, testers have been developed to try to focus in on the cause or source of the error(s).

A variety of tests are currently performed during a trouble-shooting procedure. Testers can currently measure phase jitter over a ring and test the continuity of cables used to connect stations in the ring. Prior art testers can also determine the speed at which the network is operating and not insert if the station is not at the correct speed. Prior art tempters are also able to detect if a station, which has been unable to insert into the network, is trying to use an address that is already taken by a station on the ring. However, in order to perform these tests with prior art testers one or all of the users on the network are sometimes inconvenienced and/or the tests are not always conclusive.

For instance, in the case where it is desired to perform tests on the network when all of the ports in the MAU are full, one of the stations must be disconnected to allow for access to the network by the tester. This situation is illustrated in prior art FIG. 3. Station 50 had to be disconnected from MAU 68 in order for prior art tester 90 to have access to the network. Depending on the tests being performed, the user of station 50 might be off the network for a substantial period of time. Also, if station 50 had been the cause of the error and it was removed from the network to make room for a prior art tester, it would not be clear to the user of the prior art tester 90 whether the problem was merely intermittent or if the removal of station 50 rectified the error.

Prior art testers which measure phase jitter on the token ring require that the ring be rendered inoperable for the duration of the test. Depending on the size and usage of the ring, a delay of such a duration could be very undesirable if not intolerable.

Prior art testers are also deficient in a number of other respects. In testing for a fault at the end of a conductor cable adjacent to the tester, an intermediate cable of several feet must be inserted between the tester and the cable conductor end when using time delay reflectory (TDR) to determine whether a fault exists in the cable connector end. In using TDR to identify faults along the cable conductor, prior art testers typically require a number of circuit elements to be changed in matching the tester's input impedance to the cable conductor impedance in order to avoid unwanted multiple return or reflected signals. Prior art testers also lack the ability to check and modify the speed at which they transmit frames into the token ring so that this rate conforms to the operating speed of the token ring. Prior art testers also lack certain information gathering techniques that are useful in isolating faults on the token ring. In addition, in order to perform the necessary token ring tests, prior art testers are required to be configured in a variety of ways. Prior art testers do not have the capability to perform all of these tests from one location in the network.

SUMMARY OF THE INVENTION

In accordance with the present invention, a testing apparatus is provided for use with a token ring local area network (LAN). The testing apparatus includes hardware to enable it to be connected between a token ring media access unit (MAU) and a station on the ring. Because of this insertion by the testing apparatus into the token ring, the station remains on the ring since both the station and the testing apparatus utilize the same MAU port in communicating with other stations on the ring. The hardware includes a control network comprised of a field programmable gate array (FPGA) and switches. In connection with the insertion of the testing apparatus into the token ring, the control network is used in controlling the procedures and tests associated with a proper insertion. In that regard, an electrical connection is first made between the testing apparatus and the MAU, while the station is electrically disconnected from the MAU. A lobe test is conducted between the testing apparatus and the MAU. Depending upon the results of this test, a further test might be run to check the integrity of the cable conductor between the testing apparatus and the MAU. The testing apparatus also determines whether a beacon state exists on the token ring, as well as determining whether the data transmission rates for the station and the ring match. Subsequent to these tests and checks, a lobe test is then conducted by the station after electrical connectivity is established between the station and the testing apparatus. If the station should fail this test, a check is made of the integrity of the cable conductor between the testing apparatus and the station. If the lobe test passes, the control network electrically connects the station to the MAU. Simultaneously, the control network also reconfigures itself so that the testing apparatus is electrically connected in series with the station and the MAU.

The testing apparatus also includes a measuring apparatus for use in measuring phase jitter on the token ring. Because of the insertion capability of the testing apparatus, the measuring apparatus is able to conduct phase jitter tests without disruption of normal token ring operation. That is, while the phase jitter test is being performed, normal ring traffic can continue. The measuring apparatus transmits frames having special data associated with conducting the phase jitter test. Accompanying the phase jitter test data is address information. Such address information includes the source address of the phase jitter test data and the destination address thereof. The testing apparatus address can be used as both the source and destination address. The measuring apparatus includes hardware for becoming the active monitor on the token ring. Once it has become active monitor, the measuring apparatus, such as the NIC of the testing apparatus, is able to transmit the phase jitter test pattern. The measuring apparatus also includes a state machine for determining when this pattern has returned to the testing apparatus from the token ring. In that regard, the state machine compares address information in the pattern with a predetermined pattern. The measuring apparatus includes a dual slope interpolation circuit for increasing the resolution of any difference between the token ring reference clock signal and the clock signal that accompanies the returned phase jitter test pattern. Phase jitter is a function of the difference between the rising or falling edge of the token ring reference clock signal and the corresponding rising or falling edge of the recovered clock signal. The interpolation circuit is useful in enhancing the determination of any difference between these two signals. The interpolation circuit communicates with an interpolation counter that monitors the time duration that is enhanced or interpolated by the interpolation circuit. The output of the interpolation counter is indicative of one sample of the phase jitter test. The measuring apparatus also includes a clamp circuit for use in ensuring that the interpolation process always begins at the same reference voltage. The clamp circuit controls an input to a comparator, which comparator is used in controlling the counting of pulses or the monitoring of time by the interpolation counter. The clamp circuit also includes circuitry for making sure that the comparator changes state when an interpolation cycle is completed whereby the interpolation counter does not erroneously continue to count pulses when the interpolation cycle has finished.

With regard to testing the integrity of cable conductors, the testing apparatus includes time delay reflectory (TDR) circuitry for matching its impedance with the impedance of the cable conductor. Impedances of cable conductors used in the token ring are commonly either 150 ohms or 100 ohms. The impedance matching circuitry includes a single impedance element such as a resistor, that can be changed or switchably included in the circuitry in order to match the cable conductor impedance. The single impedance matching element communicates with a directional coupler for enabling the circuitry to require only a single impedance element that is used in matching the cable conductor impedance.

In connection with conducting TDR tests on a cable conductor, the directional coupler transmits a TDR signal and, when a cable conductor fault exists, a reflected or returned signal is coupled in only one direction where it is detected by a detecting resistor. This capability also enables the TDR circuitry to test for faults in the cable conductor end that is directly connected to the testing apparatus without the need for extra or lengthy intermediate cable between the testing apparatus and the cable conductor being tested. That is, when a fault exists in the cable conductor end, this TDR related circuitry and particularly the directional coupler is able to receive the reflected pulse that occurs substantially simultaneously upon transmission of the inputted TDR test pulse. TDR circuitry also includes a masking device for obtaining information on cable conductor integrity when more than one fault is present. The masking device is able to take into account faults that may exist in the cable conductor upstream of another cable conductor fault.

The testing apparatus is also able to check whether or not it is transmitting data at a rate that corresponds to the operating speed of the token ring, as reflected by the frequency of the master or reference clock signal that accompanies frame traffic around the ring. The NIC of the testing apparatus includes two selectable clock signals having different frequencies. Each of the two frequencies is based upon one of the two data transmission rates that are used with typical token rings. These token ring operating speeds are either 16 Mbps or 4Mbps and the clock frequencies are two times these rates, i.e. 32 MHz and 8 MHz, respectively. When the testing apparatus is inserted into the token ring, it selects one of its two clock signals in connection with receiving frames and/or tokens from the token ring. The FPGA is used in determining whether a frame or token from the token ring is accurately recovered using the selected clock signal. In particular, the FPGA includes a hardware state machine that generates control signals when frames or tokens are recovered. When such control signals are not generated, this is an indication that the selected clock signal is incorrect and the other clock signal should be selected for use by the testing apparatus. The testing apparatus processor monitors the time during which the testing apparatus is determining whether or not the correct clock frequency was selected. If a predetermined time passes before a determination is made that the current selected clock frequency is correct, the processor initiates a process by which the other of the two clock signals is selected for accompanying data transmitted by the testing apparatus into the token ring. In one embodiment, the processor modifies one or more bits in a control register, whose contents are monitored by the NIC. Depending upon the state of the bit or bits, one of the two available clock signals is selected.

The testing apparatus also includes hardware and software for providing station history information. Such information relates to the presence or absence of each station during a measurement interval. The history information is obtained while relying upon conventional MAC protocol. In particular, such protocol includes a periodic conducted neighbor notification process during which addresses of all token ring stations that are present or active on the ring are obtainable. The hardware of the present invention includes a last station memory list that contains addresses of all stations that were present on the token ring during a previous neighbor notification process. A current station memory list is also provided and contains addresses of all token ring stations that are present on the ring during the current neighbor notification process. By comparing each station in the current list with each station in the last list, the status or history of token ring stations can be continuously obtained and updated. In addition to address information in the two memory lists, each station address is accompanied by a state character indicating the history of the particular token ring station in the context of its presence or absence in the ring. The address information and the accompanying state character are controllably viewable using a display unit.

Further useful information gathered by the testing apparatus relates to the expected domain or location of a token ring fault. In accordance with MAC protocol, a beacon state is generated in the token ring when a fault occurs. If a first station should experience a loss of signal, it will eventually generate a beacon frame that includes its address and the address of its nearest active upstream neighbor (NAUN). Such address information is useful to the network manager or user in isolating the fault since, in isolating a fault, it is logical to first check the station that originated the initial beacon frame. In addition to beacon frames generated by the station first experiencing the signal loss, further beacon frames might be generated by other stations on the ring. That is, because of steps taken by the first station in attempting to recover from its signal loss, downstream stations would also experience a signal loss and generate their own beacon frames. These frames include "false or phantom" domains since the apparent token ring fault associated with the first station and its NAUN does not involve such other stations. The present invention distinguishes a beacon frame from a first or originating station from those generated by downstream stations. In one embodiment, phantom domain information is ignored or not stored, while beacon information from the station that originated the first beacon frame is stored. In determining whether the beacon frame received by the testing apparatus is a first beacon frame or subsequent beacon frames including those containing phantom domain information, a software state machine analyzes the received beacon frames. In conjunction with this analysis, a status information memory storage is utilized. This memory storage indicates whether a beacon frame has been previously received for the particular ring fault and, if so, any beacon frame that is received subsequently can be ignored since information has already been obtained from a previous beacon frame that included address information related to the beacon domain. The testing apparatus also includes a memory communicating with the software state machine for storing beacon domain information including the source or station address of the station originating the beacon frame and its NAUN. Under testing apparatus processor control, a video display unit receives the beacon domain information and, when desired, displays the same without displaying other beacon domain information that includes phantom domains, or other information, that is not deemed useful to the network manager in isolating the token ring fault.

Based on the foregoing summary, a number of beneficial aspects of the present invention are seen. The testing apparatus is connectable into a token ring lobe cable in series between a regular station and the MAU of the token ring. In this configuration, the testing apparatus is able to non-intrusively monitor the insertion of the regular station with which it is in series. Consequently, the testing apparatus is able to monitor and test this regular station, which may be suspected as causing a token ring fault. If this regular station passes the tests conducted by the testing apparatus, it is successfully inserted into the ring, together with the testing apparatus. Because of this insertion capability, the testing apparatus does not require a separate MAU port in order to insert into the token ring. In conjunction with the insertion feature, the testing apparatus is able to measure phase jitter on the ring without causing the ring to be placed in a non-operational state. That is, the testing apparatus transmits traffic frames around the token ring that include phase jitter test data patterns, while other frames are also transmittable about the ring. With regard to measuring the phase jitter for a particular sample, a dual slope interpolation circuit enhances the resolution of data that is analyzed when measuring the phase jitter. Additionally, a clamp circuit is employed for making sure that the interpolating process is accurately started and terminated. The testing apparatus also checks the integrity of cable conductors using TDR technology. The testing apparatus utilizes directional coupler circuitry to detect cable conductor faults at the cable conductor end to which it is attached. The TDR hardware enables the testing apparatus to determine the magnitude and location of cable conductor faults. In matching the impedance of the measuring circuitry with the cable conductor impedance it is only necessary to include or modify a single impedance element. With respect to properly operating on the ring, the testing apparatus is able to check for and modify, if necessary, the rate at which it transmits frames into the token ring. As a consequence, token ring speed operation is achieved by the testing apparatus without creating a fault or beacon state. The testing apparatus maintains history information related to active stations on the token ring from the start of a measurement. The testing apparatus compares station address information utilizing the contents of current and last station memory lists. Such information includes the identity of new stations that have entered the token ring since the start of the measurement, stations that were present at the start of the measurement but subsequently left the ring and stations which previously left the ring but then returned. Station history information enables token ring troubleshooters to correlate topology changes with network fault conditions which helps them isolate the source of a problem. The testing apparatus also filters or ignores phantom beacon domains. Beacon domains associated with the station that originated the beaconing condition are displayable, while phantom domains are not. Because phantom beacon domains are not displayed, the troubleshooter or network manager is not misled by phantom beacon domain information in attempting to isolate a token ring fault. Furthermore, a user of a station downstream of the station originating the beacon frame, because of reliance on the originating beacon frames and not on phantom domains, will not be inclined to reboot or power off the downstream station since the user is aware that the downstream station is not the cause of the problem.

Additional advantages of the present invention will become readily apparent from the following discussion, particularly when taken together with the accompanying drawings.

BRIEF DESCRIPTION OF THE DRAWINGS

FIG. 5 is a block diagram of the token ring and tester interconnections for the token ring of FIG. 4;

FIG. 6A is a block diagram illustrating the serial interconnection to a single MAU port by the testing apparatus and the regular station on the ring;

FIG. 6C is a block diagram showing even more detail of the testing apparatus illustrated in FIG. 6A;

FIGS. 17A–17D are timing diagrams related to the interpolation process for enhancing the resolution of data useful in obtaining a phase jitter measurement;

FIG. 18 is a circuit schematic of the clamp circuit of FIG. 16;

FIG. 26 is a circuit schematic that is similar to FIG. 22 and illustrates application of the circuit in receiving a return pulse clue to a fault at the cable conductor end;

FIGS. 30A–30E illustrate address information and accompanying state characters based on station history for the token ring configurations of FIGS. 27 and 29A–29C;

FIG. 33 is a flow diagram illustrating steps taken by the testing apparatus in storing and displaying beacon domain information from an originating station while filtering out other beacon frames.

DETAILED DESCRIPTION

Figure 1:
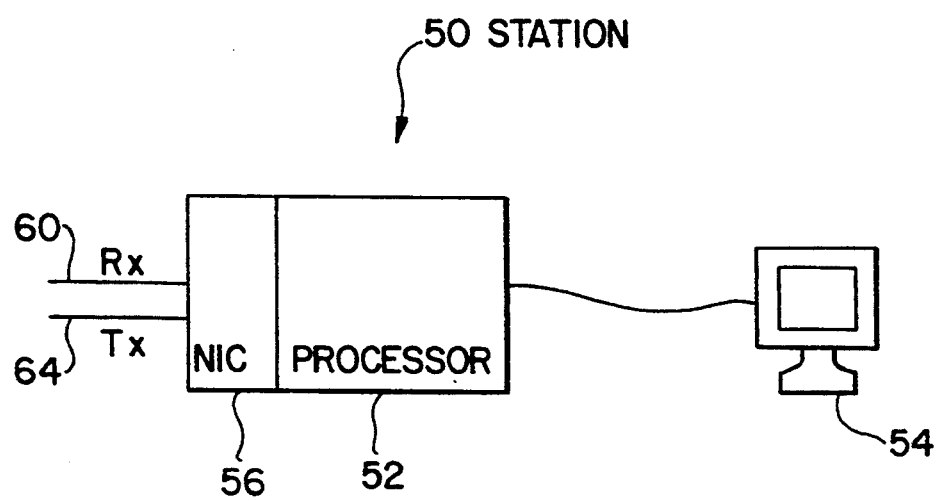
FIG. 1 is a block diagram of a token ring station.
Figure 2:
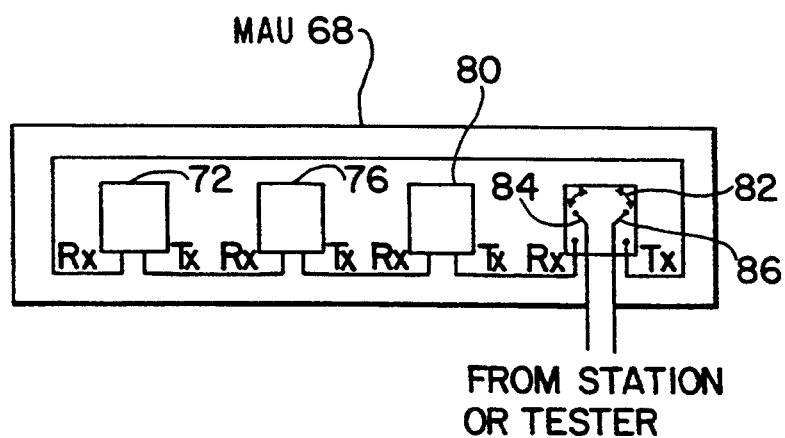
FIG. 2 is a block diagram of a prior art media access unit (MAU)
Figure 3:
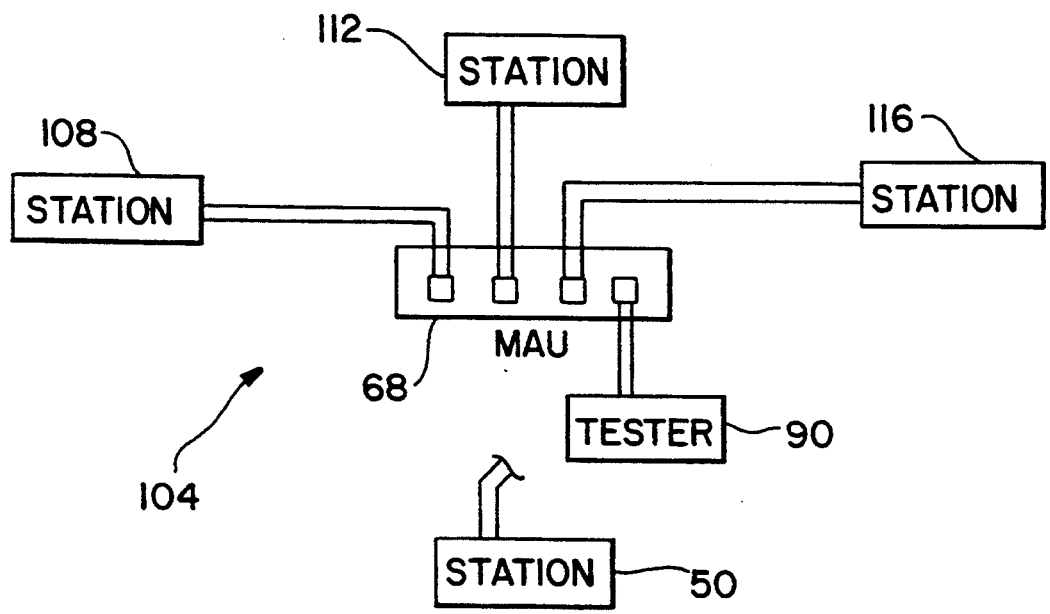
FIG. 3 is a block diagram of a prior art token ring with a number of stations illustrating the physical disconnection of one of the stations so that a prior art tester is connectable to a MAU port.
Figure 4:
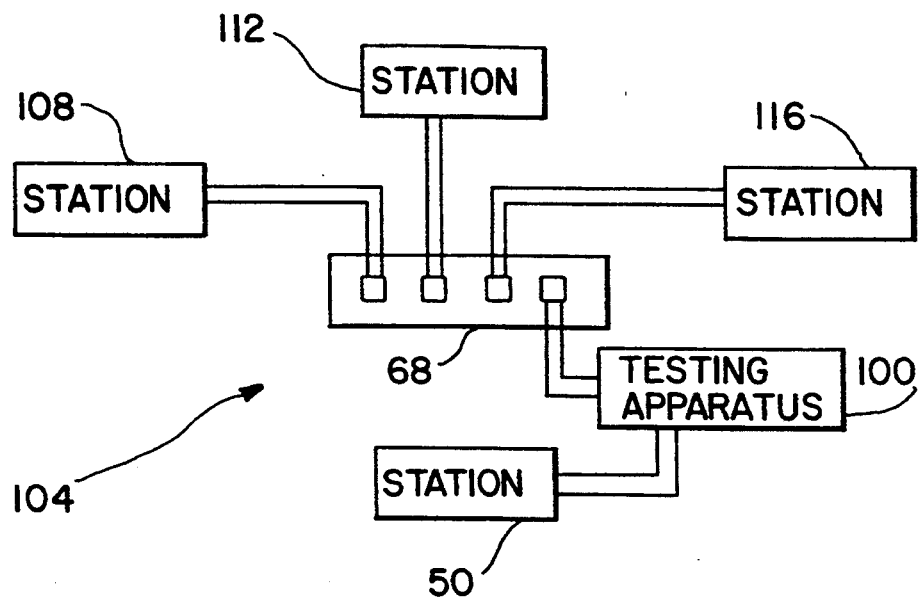
FIG. 4 is a block diagram of the testing apparatus of the present invention electrically connected in series between a MAU port and a regular station on the ring.

FIG. 4 illustrates one embodiment of the present invention. The testing apparatus 100 of the present invention contains circuitry to enable both testing apparatus 100 and station 50 to be inserted into the token ring local area network 104 through a single port on MAU 68. The connection of testing apparatus 100 between a station and MAU 68, will be referred to as the "active T" configuration.

FIG. 5 is a representation of the electrical connections between stations on the token ring 104 including the testing apparatus 100 connected in an active T configuration. As shown, testing apparatus 100 is able to connect both itself and station 50 in series with the other stations 108, 112, 116 in the token ring 104. The method and apparatus which allows testing apparatus 100 to be connected in an active T configuration will now be described in further detail.

FIG. 6A illustrates the physical connections of the testing apparatus 100, MAU 68, and station 50 in an active T configuration. As shown, the testing apparatus 100 includes a control network 120, a NIC 122, and processor 126. Two pairs of twisted wires 130 and 134 connect control network 120 to the receive and transmit (hereinafter Rx and Tx) connections of port 82 in MAU 68. Two additional pairs of twisted wires 138 and 142 connect control network 120 to the Rx and Tx connections of NIC 56 of station 50.

The control network 120 determines the electrical connections between the Tx and Rx wire pairs of NIC 56 and MAU 68 and testing apparatus 100. FIGS. 7–10 depict the electrical connections between MAU 68, testing apparatus 100 and NIC 56 as facilitated by switches within the control network 120 at various stages of the active tee insertion process. As shown, NIC 122 comprises both an analog interface 146 and a digital interface 150 which are connected by NIC multiplexer (MUX) 154.

Figure 6B:
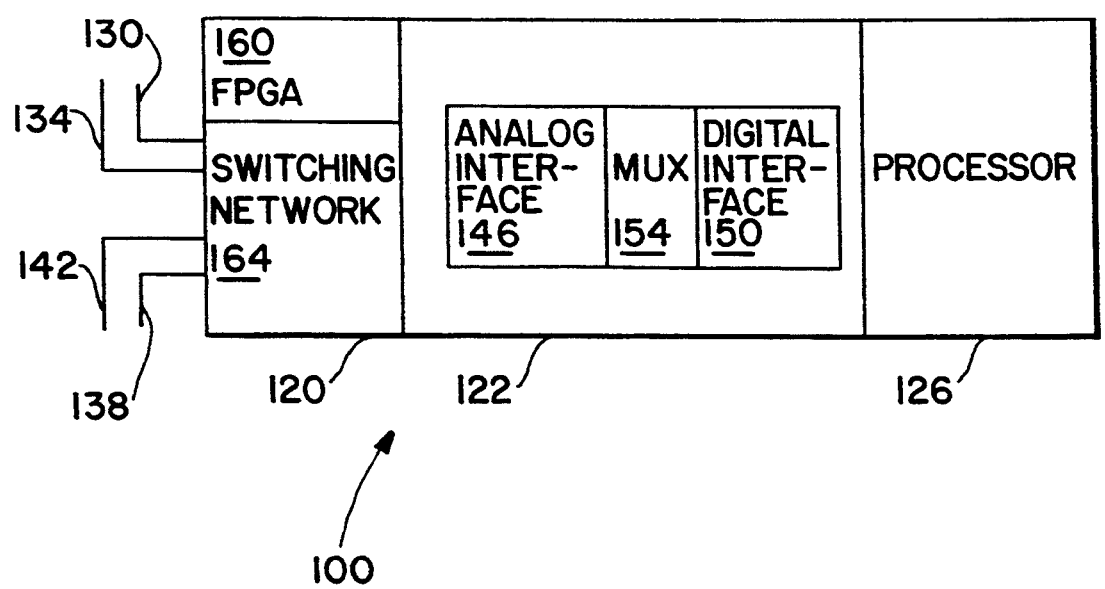
FIG. 6B is a block diagram showing further detail of the testing apparatus illustrated in FIG. 6A.

FIG. 6B illustrates testing apparatus 100 in further detail. The control network 120 includes a field programmable gate array (FPGA) 160 that controls both switching network 164 and MUX 154. Both switching network 164 and MUX 154 are used to create the necessary configurations as shown in FIGS. 7–10. Both analog interface 146 and digital interface 150 include standard IC chips which must be included on any token ring NIC. In general, analog interface 146 controls the synchronization of the testing apparatus 100 to incoming data and clock signals, while digital interface 150 includes circuitry to maintain MAC protocol.

Figure 11:
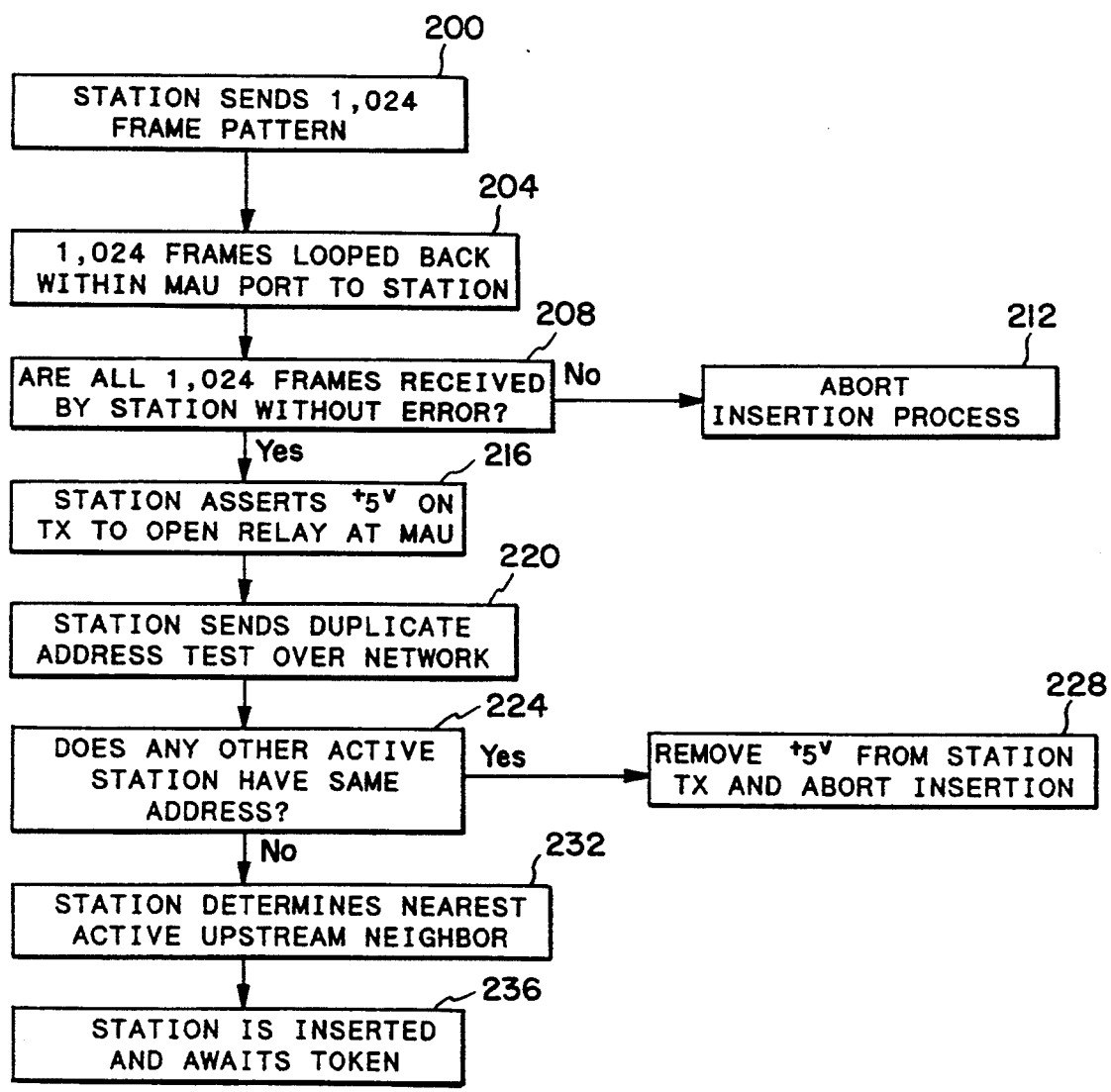
FIG. 11 is a flow diagram of steps conducted by prior art testers in testing a token ring.

In order to understand the various stages of the active T insertion process, it is first necessary to understand the process by which a station normally inserts into a token ring network. To this end, prior art FIG. 11 is a flow chart detailing the normal insertion process for station 50 in which the NIC 56 is to be directly connected to the MAU 68. At step 200, station 50 (employing NIC 56) sends out 1,024 frames of a known bit pattern on its transmit line. This is known as a lobe test. A lobe test ensures the connectivity of components between station 50 and the ring. At this point, relays 84, 86 in MAU 68 are set such that the transmit and receive lines of station 50 are looped back upon one another. At step 204, the 1,024 frames are returned directly to the station 50 without traversing the token ring. At step 208, station 50 determines whether all 1,024 frames were returned without error. If an error is detected in any of the 1,024 returned frames the insertion process is aborted in step 212. Errors of this kind are normally caused by a faulty cable, a faulty MAU port, or a bad NIC.

If the lobe test passes, in step 216, station 50 applies a "phantom" voltage of +5 v on its Tx line to switch relays 84, 86 ill MAU 68 such that station 50 is connected to the token ring. Station 50 then sends out a duplicate address test (DAT) over the ring in step 220. A DAT tests to ensure that no other station already active on the network is using the same address as NIC 56 of station 50. Station 50 sends a frame with its own address over the network. If any other station recognizes the address it will set the "frame copied" bit in the frame to indicate that the address is already being used. If the address of station 50 is already being used at step 228, station 50 removes the +5 v phantom voltage from its Tx, thus exiting the network and aborting the insertion process. If the address of station 50 is not recognized by another active station, in step 232, station 50 then determines its next active upstream neighbor (NAUN). Once its NAUN has been determined, station 50 is inserted and waits to acquire the token when it has data to transmit over the ring.

The testing apparatus 100 of the present invention can insert with a station 50 in an active T configuration without disrupting the normal station insertion process. In effect, testing apparatus 100 is able to appear as a MAU to station 50 and as a station to MAU 68. The manner in which testing apparatus 100 is able to insert itself and station 50 into the network through a single MAU port 82 will be described in detail with reference to FIGS. 6-10 and 12.

Figure 7:
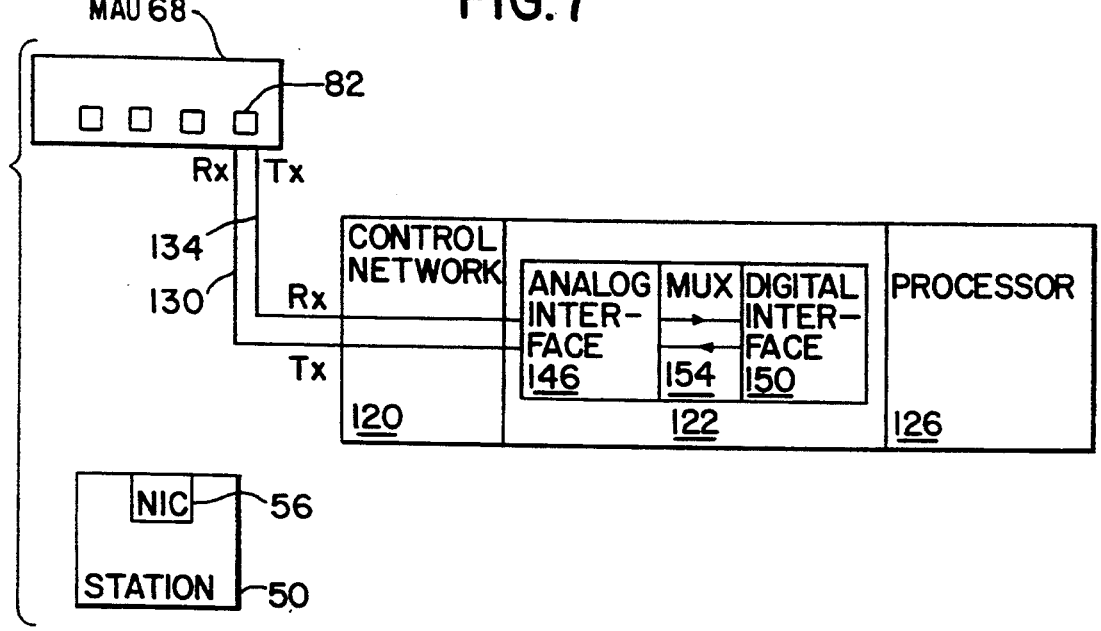
FIG. 7 is a block diagram illustrating electrical connectivity between the MAU port and the testing apparatus in order to conduct desired tests therebetween.
Figure 12A:
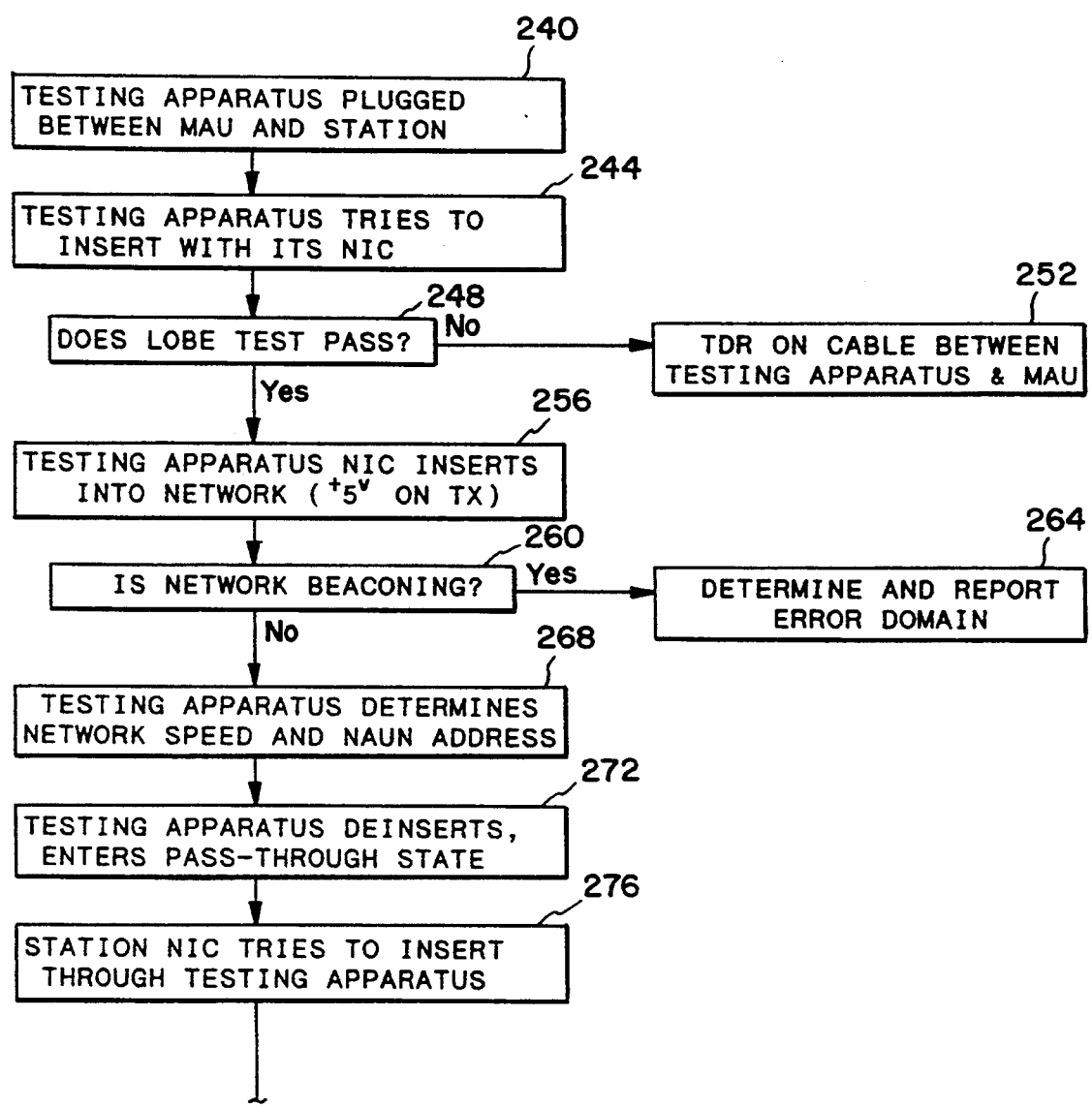
FIG. 12 a flow diagram illustrating steps taken by the testing apparatus in order to insert serially between a MAU port and a regular station.
Figure 12B:
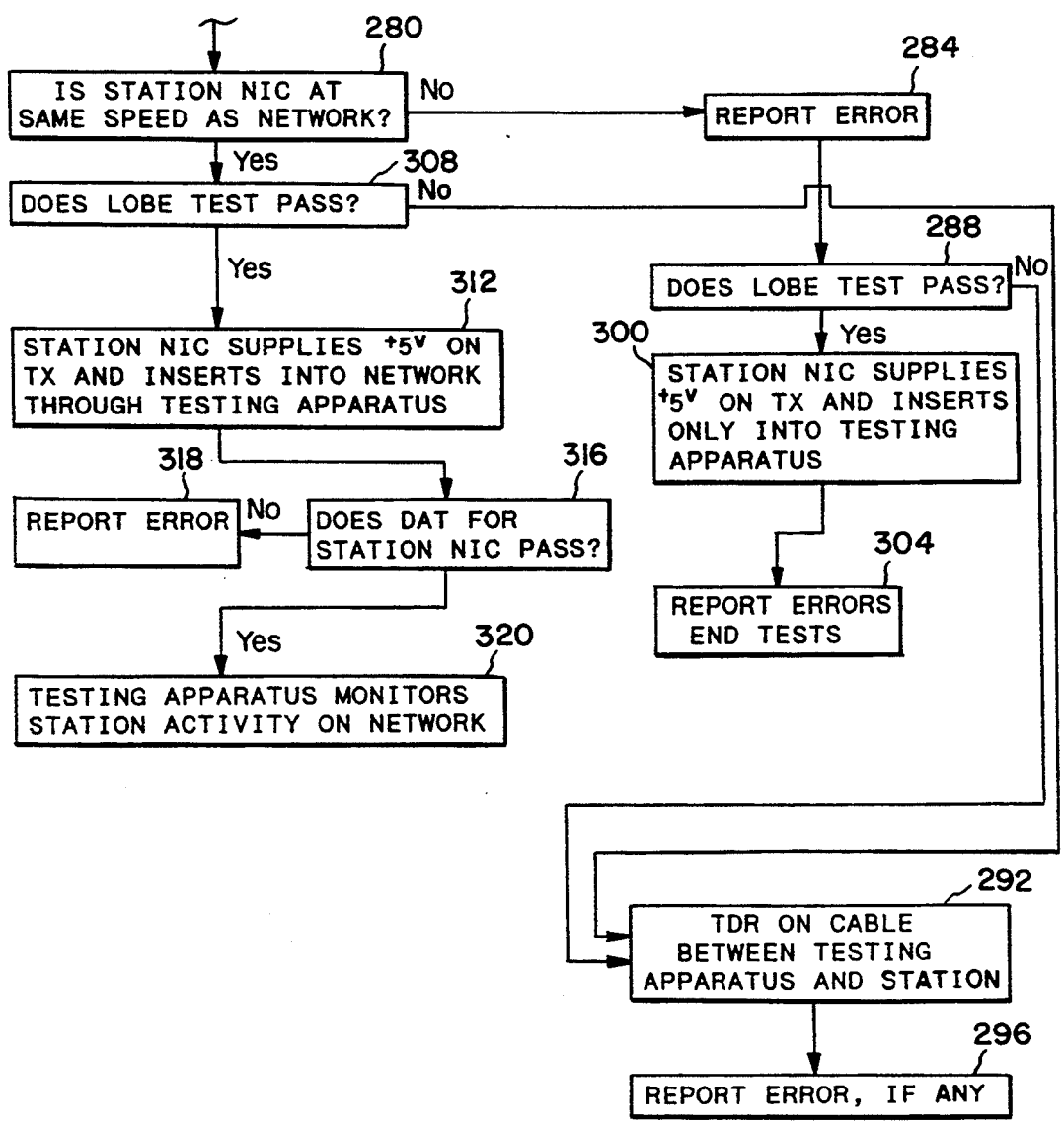

FIG. 12 is a flow chart which illustrates the active T insertion process. Station 50 has previously been plugged into port 82 of MAU 68. At step 240, station 50 is unplugged from MAU port 82. Testing apparatus 100 is connected between station 50 and MAU 68 as shown in FIG. 6. At this point, control network 120 electrically isolates station 50 from both MAU 68 and testing apparatus 100 as shown in FIG. 7. In step 244, using NIC 122, testing apparatus 100 attempts to insert into the ring in the same manner as any normal station would. NIC 122 performs a lobe test in step 248. If the lobe test fails, then a TDR procedure is performed, in accordance with step 252, to test the wire pairs 130, 134 between testing apparatus 100 and MAU 68. The TDR procedures will be explained more fully later. If the lobe test passes, in step 256, testing apparatus 100 asserts +5 v on its Tx in order to switch the relay in MAU port 82 and connect testing apparatus 100 in series with active stations on the token ring. In step 260, testing apparatus 100, now an active part of the token ring, determines if the ring is beaconing. If the ring is beaconing, at step 264, testing apparatus 100 will determine and report the error or beacon domain. Error domain refers to the area of the ring which is experiencing the problem. This will also be explained more fully later. If the ring is not beaconing, at step 268, testing apparatus 100 determines the speed of the network and the address of its NAUN. Briefly, the speed of the network is determined by testing apparatus 100 looking for data at a first speed (either 4 or 16 Mbs). If the data is not seen within a set period, testing apparatus 100 looks for data at the other token ring operating speed. When ring data is seen without errors, testing apparatus 100 assumes that it has matched the network speed. The matching of token ring operating speed with the data transmission rate from the testing apparatus 100 will also be described later in greater detail.

Figure 8:
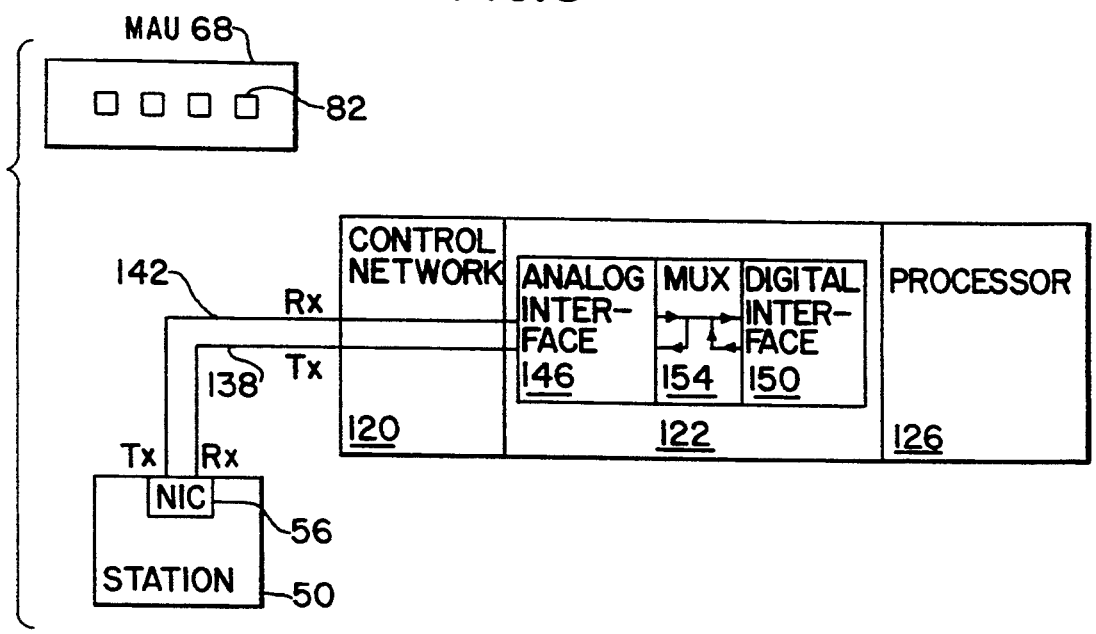
FIG. 8 is a block diagram illustrating the electrical connectivity between the testing apparatus and the regular station in which the testing apparatus is de-inserted from the MAU port, but is configured to avoid further reinsertion procedures.

Testing apparatus 100 then removes the phantom voltage from its Tx pair to deinsert from the network and enters a pass-through state at step 272, as depicted in FIG. 8. Note that FPGA 160 causes MUX 154 to effectively "shunt ∞ the transmitter of the digital interface 150. In effect, data transmissions from digital interface 150 are looped back to its receiver so as to create a token ring network of one. Thus digital interface 150 will continue following MAC protocol even though it is no longer part of the larger network. This will allow testing apparatus 100 to reinsert into the network without having to redo its lobe test.

Data entering testing apparatus 100 is now buffered and regenerated by analog interface 146. In addition, MUX 154 transmits incoming data to the receiver of digital interface 150. Control network 120 reconfigures itself such that testing apparatus 100 is electrically connected to station 50, and MAU 68 is now isolated from both. Testing apparatus 100 then provides a message to the user prompting him to initiate the insertion process for station 50. However, in accordance with step 276, it is important to note that at this point station 50 is attempting to insert only into the testing apparatus 100. In step 280, testing apparatus 100 determines if NIC 56 of station 50 is operating at the same speed as the network (network speed was determined in step 268).

The speed of NIC 56 is determined by analog interface 146 of NIC 122 as follows. NIC 56 sends out idle patterns for approximately 40 milliseconds before starting its lobe test. Analog interface 146 will first look for the idle patterns at the speed it determined from the network. If it does not find the idle patterns at this speed, analog interface 146 is switched by FPGA 160 to the other speed at which token ring networks operate (either 4 or 16 Mbps). It is essential that the speed of NIC 56 be determined in the first 40 ms. Otherwise, analog interface 146 will be unable to buffer and regenerate the 1,024 frames sent out by NIC 56 during its lobe test. The lobe test then would fail and the insertion process would be aborted.

If testing apparatus 100 determines that NIC 56 is at a different speed than the network, it will report the error (step 284) and switch its own speed to match NIC 56 for the lobe test (step 288). During the lobe test, NIC 56 transmits 1,024 frames which are buffered and regenerated by analog interface 146 and returned to NIC 56. If the lobe test fails, a TDR procedure is performed on the wire pairs 138, 142 connecting station 50 and testing apparatus 100 (step 292), and any error found is reported at step 296.

Figure 9:
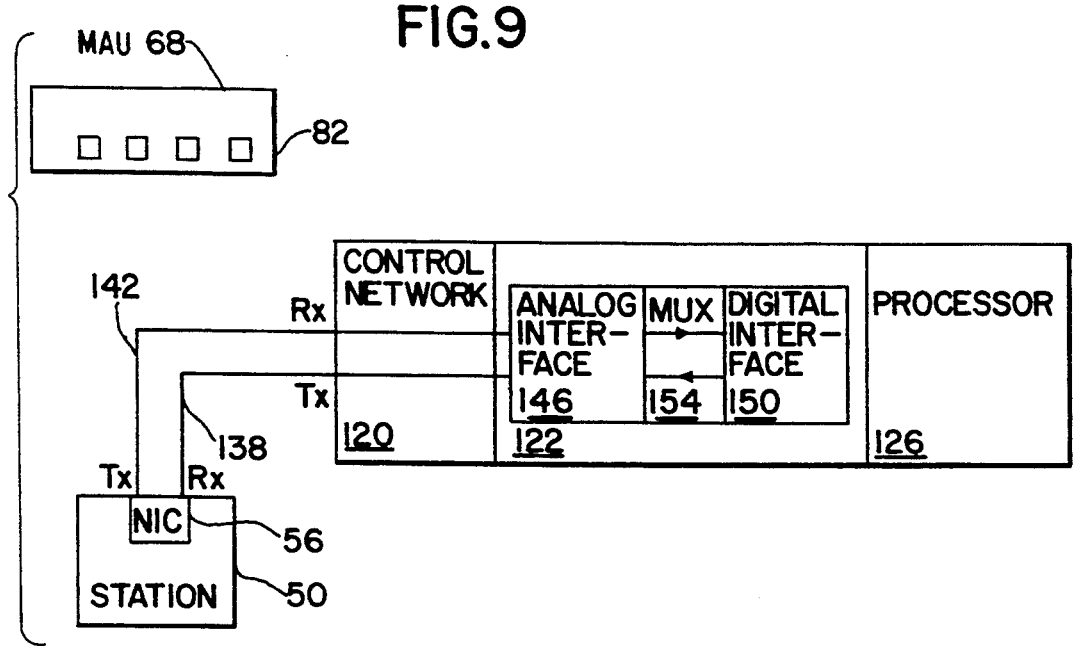
FIG. 9 is a block diagram illustrating the electrical connectivity between the testing apparatus and the regular station.

NIC 56 then produces a +5 v phantom voltage on its Tx in step 300. This prompts FPGA 160 to cause MUX 154 to connect the transmitter of digital interface 150 with analog interface 146 and, consequently, NIC 56. This configuration is illustrated in FIG. 9. Testing apparatus 100 and station 50 are thus connected in a two-node local area network. The reason why the present invention creates this network between only the testing apparatus 100 and station 50 is that if NIC 56, which is operating at the wrong speed, is allowed to apply a phantom voltage to MAU port 82 and enter the ring, it will cause the network to beacon. Instead, the speed mismatch is reported to the user at step 304, and station 50 is kept off of the ring until the problem is rectified. In most cases, NIC 56 contains dip switches which control the speed at which NIC 56 operates. The user would then simply flip the correct dip switch to match the speed of the network and restart the insertion process.

Figure 10:
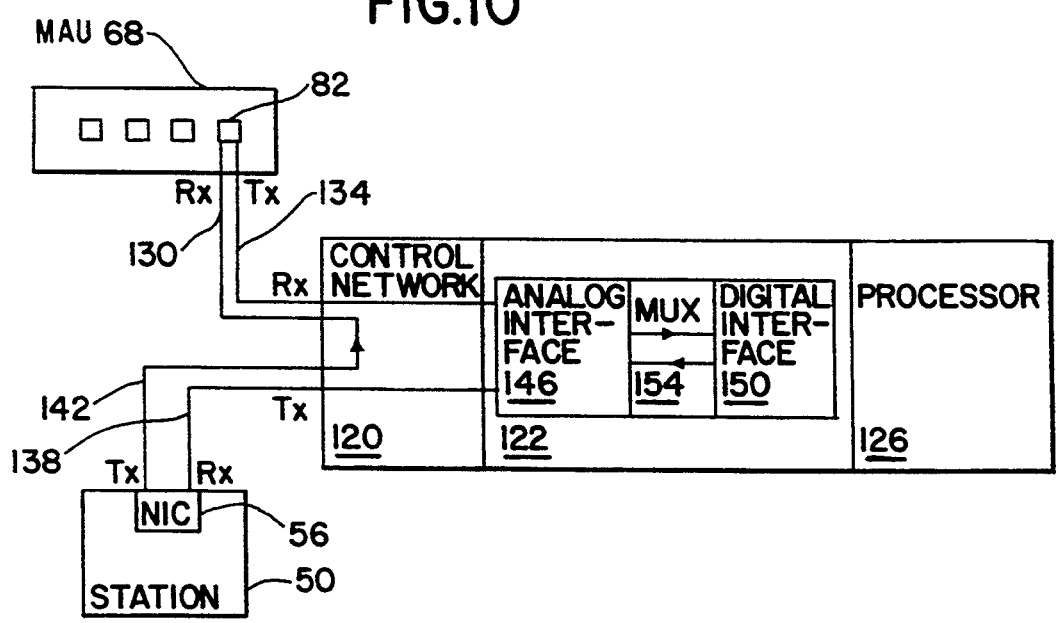
FIG. 10 is a block diagram illustrating the electrical connectivity involving the MAU port, the testing apparatus and the regular station.

On the other hand, if in step 280, it is determined that NIC 56 is operating at the correct speed, a lobe test is performed in step 308. Again, the 1,024 frames are circulated through the analog interface 146 of testing apparatus 100 and back to NIC 56. However, in this case, if the lobe test passes, control network 120 electrically connects the Tx pair of station 50 to MAU port 82. Thus, when NIC 56 asserts its +5 v phantom voltage, in accordance with step 312, it will open relays 84, 86 in MAU port 82. Concurrently, control network 120 reconfigures itself such that testing apparatus 100 is connected in series with station 50. This configuration is depicted in FIG. 10. When NIC 56 applies it phantom voltage to MAU port 82, both testing apparatus 100 and station 50 are connected in series with the rest of the active stations on the token ring network. Note that testing apparatus 100 does not have to redo its lobe test in order to reinsert into the network because digital interface 150 has been "fooled" into believing that it never left the network by the shunt applied with MUX 154.

In step 316, NIC 56 sends a duplicate address test frame over the network. If another active station is already using the same address as NIC 56, the error is reported in step 318. If the DAT passes, station 50 is inserted and testing apparatus 50 can monitor its activity on the network in accordance with step 320.

The operation of testing apparatus 100 will now be described in further detail with reference to FIG. 6C. As shown, analog interface 146 comprises analog interface IC 147, which includes phase lock loop (PLL) circuitry 148, and custom receiver 149. Analog interface IC is a standard NIC chip for token ring stations such as the TMS38054 made by Texas Instruments. Digital interface 150 also comprises a standard IC chip such as the TM5380C16 made by Texas Instruments. During the active T insertion process, custom receiver 149 locks onto the speed of the NIC under test before it begins its lobe test. Once energy is detected by energy and phantom drive detect 123, custom receiver 149 attempts to lock onto the idle pattern of the NIC under test at the speed determined from the network. If the idles are not properly decoded, processor 126 will switch the speed of testing apparatus 100. During the lobe test, custom receiver 149 decodes the 1,024 frames and sends pulses to processor 126 to count each frame.

Controller 125 includes part of FPGA 160, as does MUX 154 and switching network 164. Controller 125 receives a configuration bit over line 121 from processor 126 indicating whether testing apparatus 100 is in normal or active T mode. When in active T mode, controller 125 controls the REDY, FRAQ and NSRT lines of both the digital and analog IC chips in order to perform the necessary steps of the active T insertion process. REDY, FRAQ and NSRT are all standard control lines for the Texas Instruments IC chips identified above.

The following is a list of the logical states of control lines REDY, NSRT and FRAQ with reference to configurations shown in FIGS. 8–10. Note that in FIG. 7, testing apparatus 100 is in normal mode in that it is only electrically connected to the network and not station 50. As such, the control lines are in their normal states and will not be recited here.

For the configuration shown in FIG. 8, which shows the state of testing apparatus 100 when station 50 is performing its lobe test:
!NSRT4=False
!FRAQ4=True when energy is detected and !REDY4 and !PHDR=False
!REDY16=True For the configuration shown in FIG. 9, which depicts the state of testing apparatus 100 when the speeds of station 50 and the network do not match, and testing apparatus 100 has entered into a ring of two with station 50:
!NSRT4=False
!FRAQ4=!FRAQ16 when PHDR=True
!REDY16=!REDY4 when PHDR=True Finally, for the configuration shown in FIG. 10, which illustrates the state of testing apparatus 100 when the speeds of station 50 and the network do match, and testing apparatus 100 and station 50 enter the token ring in series:
!NSRT4=False
!FRAQ4=!FRAQ16 when PHDR=True
!REDY16=!REDY4 when PHDR=True Note that !NSRT4 stays false throughout the active T insertion process. This is due to the fact that, when station 50 is ready to insert into the network, it will provide the necessary phantom voltage to open the relays at MAU 68.

Figure 13:
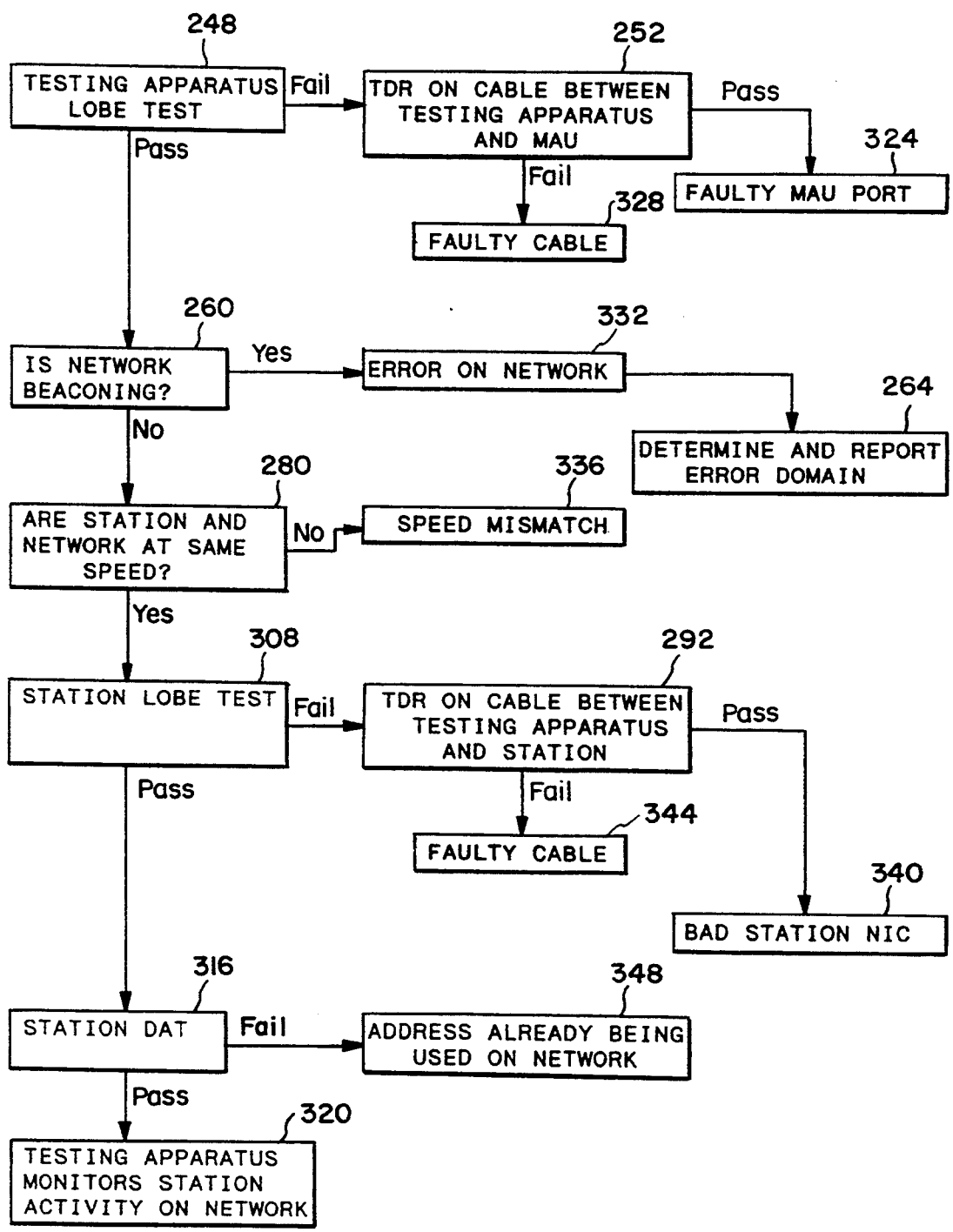
FIG. 13 is a flow diagram illustrating steps related to tests conducted and error reporting that can occur when a fault is present during insertion of the testing apparatus into the token ring.

An active T configuration will most often be employed when a station cannot insert into the token ring network and the user of the station cannot determine why. Consider the following example. Station 50 has been plugged into MAU port 68, as described in relation to FIGS. 6–12 above. However, for some reason, station 50 is unable to insert into the token ring network. Testing apparatus 100 can be used in an active T configuration to pinpoint the problem. FIG. 13 is a flow chart which details the trouble-shooting information which can be determined using the active tee configuration.

Many of the steps of FIG. 13 correspond to steps of FIG. 12. However, FIG. 13 contains additional steps directly corresponding to trouble-shooting information which can be determined from the process described in FIG. 12. For example, if the lobe test performed by testing apparatus 100 in step 248 fails, a TDR procedure is performed on wire pairs 130, 134 in step 252. If the TDR procedure does not find any faults in the connectivity of wire pairs 130, 134, the conclusion is reached that MAU port 82 is inoperable (step 324). If, on the other hand, the TDR procedure determines that there is a discontinuity in one or both of wire pairs 130, 134 then the problem is narrowed to faulty cabling between testing apparatus 100 and MAU 68 (step 328). It should be noted that the active T configuration requires that an extra cable containing Tx and Rx wire pairs be provided. Depending on the physical proximity of the MAU and the station which is unable to insert into the network, the extra cable may comprise either the connection between MAU 68 and testing apparatus 100 or the connection between testing apparatus 100 and MAU 68. In either case, both the original cable which connected station 50 to MAU 68 and the extra cable are tested for connectivity by the lobe tests performed by testing apparatus 100 and station 50.

In step 320, if testing apparatus inserts onto the token ring and discovers that the ring is in a beacon state, this is an obvious reason why station 50 had been unable to insert. There must be an error on the network (step 264). Testing apparatus 100 can then determine what area of the ring is experiencing the problem (step 264).

At step 280, testing apparatus 100 determines if station 50 is operating at the same speed as the network. If they are operating at different speeds, this determination is made at step 336 and the operating speed of NIC 56 must be switched in order for station 50 to be inserted into the network. If a station tries to insert into a token ring network at the wrong speed, the ring will beacon until MAC protocol automatically deinserts the station operating at the wrong speed.

In step 308, if the lobe test performed by station 50 fails, then a TDR procedure is performed on twisted wire pairs 138, 142. If the TDR procedure does not find any discontinuity in connections between testing apparatus 100 and station 50, then it can be assumed that NIC 56 of station 50 is faulty (step 340). If, on the other hand, a discontinuity is discovered, then the problem is narrowed to the cable between testing apparatus 100 and station 50 at step 344.

Lastly, in step 316, station 50 performs a DAT to determine if any other active station on the network is using the same address. If the address is already being used (step 348) then NIC 56 will need to change its address, if possible, or be replaced. If the DAT passes, testing apparatus 100 will continue, as an active part of the token ring, to monitor the activity of all the stations on the ring.

To summarize, when connected in an active T configuration, testing apparatus 100 can pinpoint one of six different possibilities as to why station 50 cannot insert into the ring. The six possibilities are as follows:

1. Port 82 on MAU 68 is not operating properly.
2. The cable which connects MAU 68 to station 50 is faulty.
3. The network is experiencing an error and is in a beacon state.
4. The station NIC 56 is not operating at the same speed as the network.
5. The station NIC 56 is not operating properly.
6. The address of the station NIC 56 is already being used by another active station on the network.

By employing the active T configuration, the user of the present invention is able to make determinations as to why a station cannot insert into the ring and this is accomplished without occupying a separate port on the MAU 68 and without having to move the testing apparatus 100 to different locations. Prior art testers are required to be moved and recabled in different configurations in order to ascertain some of the same information. For example, in order to determine if a station is failing its duplicate address test, a prior art tester would have to be plugged into a separate port on the MAU, perhaps necessitating that an active station be taken off the network, and "watch" the station try to insert from there. Needless to say, from that position, a prior art tester will not be able to determine whether the station has passed its lobe test or if it is operating at the same speed as the network.

It will be appreciated by those skilled in the art that the active T configuration will be applicable and advantageous in a number of situations. In addition to the example cited above, the active T will also be used to gain access to the token ring for testing purposes when all of the ports in the MAU 68 are full and it is inconvenient or undesirable to remove a station from the ring while tests are being performed.

Figure 14:
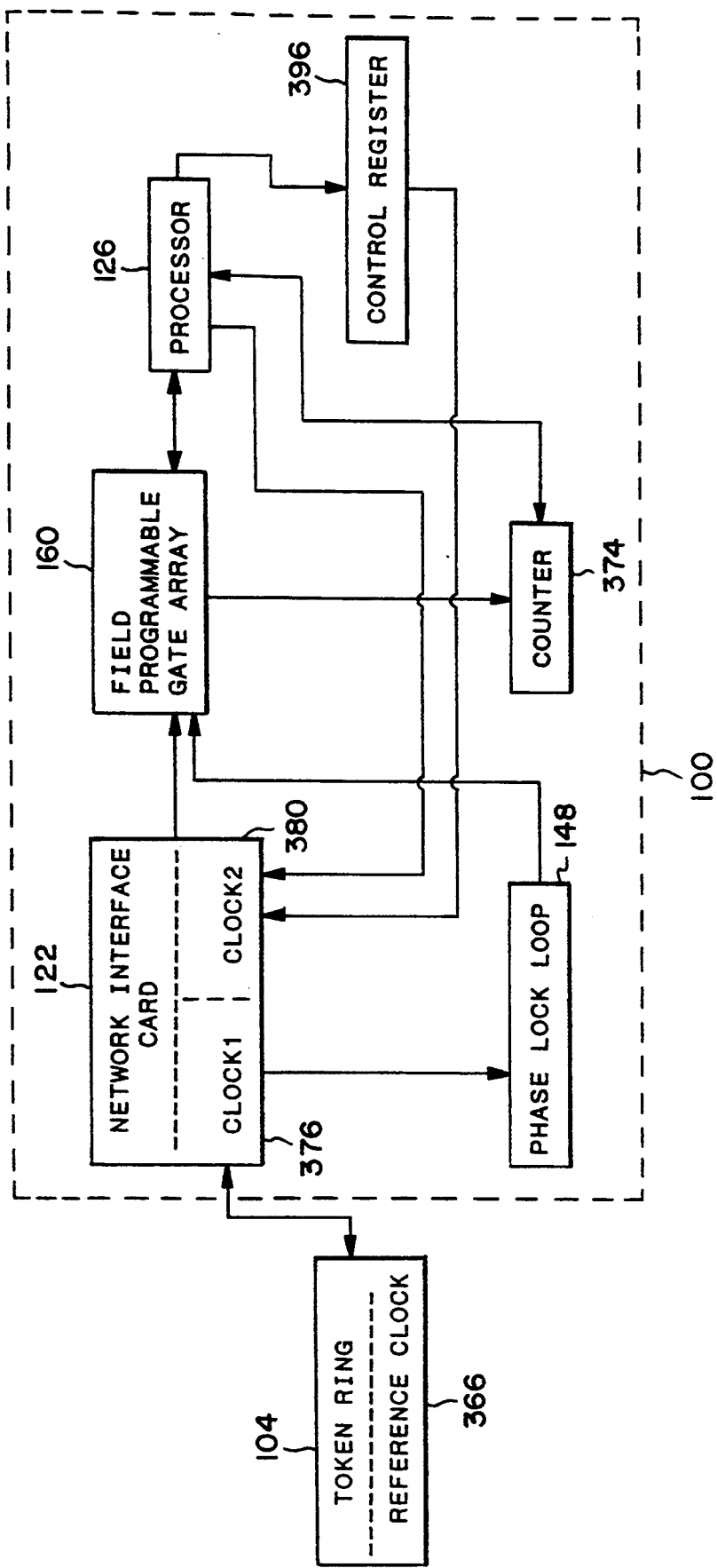
FIG. 14 is a block diagram of basic hardware elements of the testing apparatus useful in determining and modifying the clock signal that accompanies frames from the testing apparatus so that such inputted data conforms to token ring speed.
Figure 15:
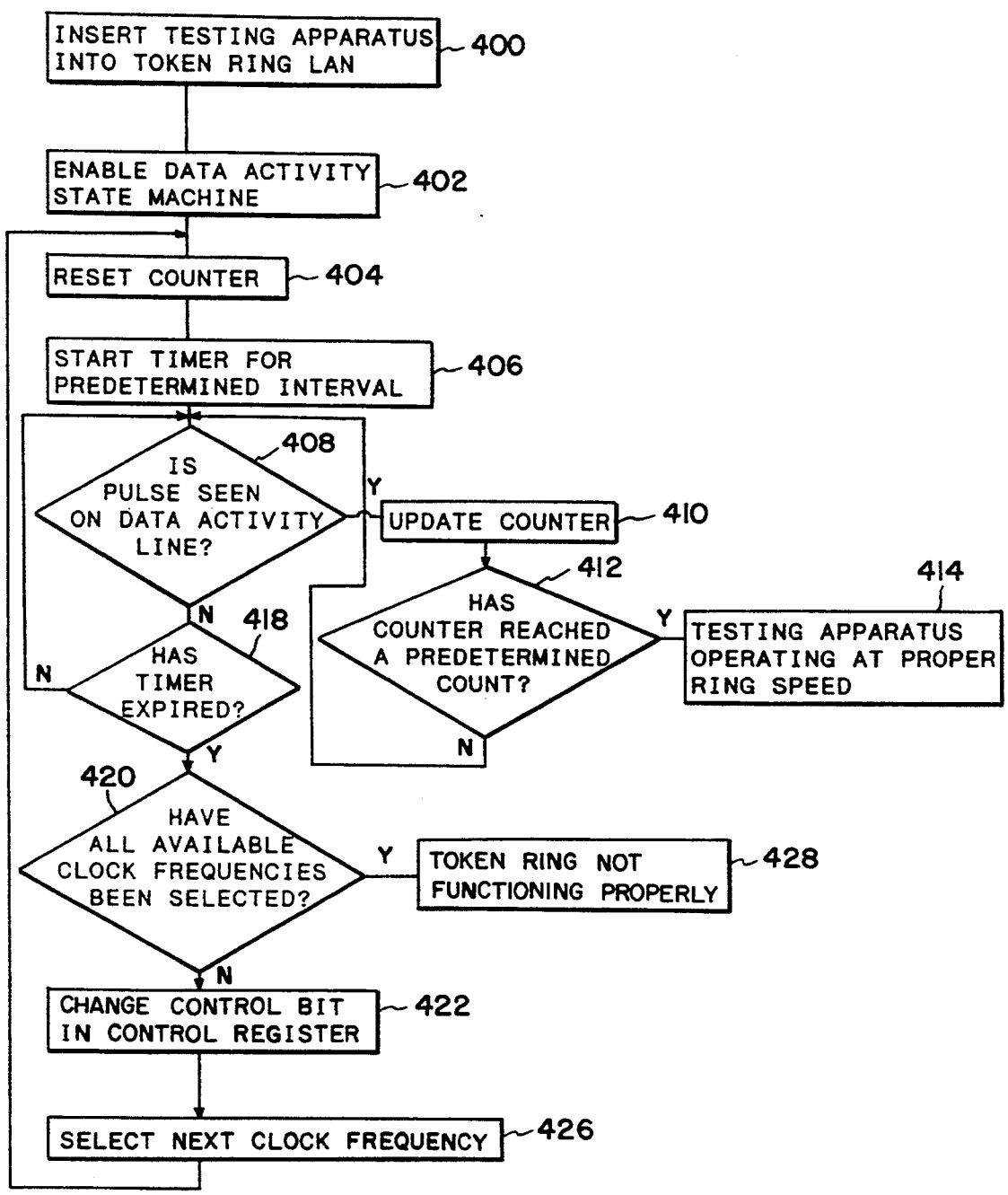
FIG. 15 is a flow diagram that illustrates the steps involved in the testing apparatus in order to check for and modify, if necessary, the rate at which it transmits data into the token ring.

With reference now to FIGS. 14 and 15, the matching of the operating speed of the testing apparatus 100 with the token ring 104 is next described. In transmitting frames by the testing apparatus 100 to the token ring 104, it is important that the data be transmitted at a rate acceptable to the token ring 104. As noted, there are two rates commonly utilized in sending data frames around the token ring 104, i.e., 16 Mbps or 4 Mbps. If the testing apparatus 100 should mistakenly send data at the wrong rate for the token ring 104, a beaconing condition would occur after a predetermined amount of time thereby indicating a hard error and causing the ring to discontinue normal operation. Because such a result would be detrimental and inasmuch as it is critical to be able to properly insert the testing apparatus 100 into the token ring 104, the testing apparatus 100 includes hardware and software for automatically detecting the data transmission rate around the token ring 104 and changing to the proper speed in order to allow proper operation of the testing apparatus 100 on the token ring 104 to continue. The user of the testing apparatus 100 therefore does not need to know ahead of time the rate or speed of the token ring 104 as it relates to data transmission around the ring.

When no station on the token ring has a frame to transmit a special data packet called a "token" is circulated around the ring. Each station receives the token, buffers it, and then retransmits it to the next station immediately downstream. When a station has a frame to transmit, it must wait until it receives the token. The transmitting station will receive the token, but now instead of retransmitting the token, the station will transmit its frame instead. The transmitting station waits until its frame circulates the ring (passed from station to station in the same manner as a token) and appears at its receiver. The transmitting station receives the transmitted frame and checks to see if it was copied then finally releases a new token onto the ring. On an idle token ring network, tokens will be circulating continuously making a complete trip around the ring in a period on the order of 100 microseconds. On an active ring, these tokens will be interspersed with data frames.

Therefore, in normal token ring operation, there will always be a data bearing signal (either tokens or frames) on the network. It is a useful implementation detail of a token ring that tokens and frames appear the same when viewed at one conceptual level. Both tokens and frames consist of a start delimiter, followed by one or more data bytes, followed by an end delimiter. The start and end delimiters are unique signal patterns that are not used to represent data bytes. The data encoding scheme used in the token ring (called differential manchester encoding) takes the data bit stream to be conveyed and produces a signal that contains both the data bit stream and the clock signal having a rate at which the data is being sent. In order to recover the data bit stream at the receiving end, the clock signal must be extracted from this signal using a phase lock loop with a reference clock of frequency close to the nominal transmission frequency.

The clock frequency in the token ring is twice that of the actual data rate so the clock will either operate at 32 MHz for 16 Mbps token ring or at 8 MHz for 4 Mbps token ring. If the reference clock frequency is not within 5 to 10 percent of the signalling frequency, the phase lock loop will not be able to lock to the data signal and the recovered clock will be invalid and the data bits recovered from the signal will be completely inaccurate. This leads to a method of determining the speed of operation of the token ring by examining the data bearing signal present on the ring first using one reference clock frequency than the other and seeing which clock allows the data to be correctly recovered. Since tokens and/or frames are constantly present on a normally operating network, there will always be data for this method to act upon.

With reference to FIG. 14, a block diagram of hardware is illustrated for use in checking and modifying, if necessary, the rate at which data is transmitted around the token ring by the testing apparatus 100. The token ring 104 includes all stations on the ring, together with the hardware required for providing communication among these stations. The testing apparatus 100 is inserted into the ring 104 and includes the network interface card (NIC) 122 for use in transmitting and receiving frames relative to the testing apparatus 100. The field programmable gate array (FPGA) 160 communicates with the NIC 122 and, in connection with checking whether the testing apparatus 100 is operating at the same speed as the token ring 104, is used in determining whether valid data from the token ring 104 is being decoded. Valid data, in this context, refers to data being received at the correct speed or rate, as required by the reference or master clock 366 associated with the token ring 104. The reference clock 366 has a frequency based upon the frequency at which data is transmitted around the token ring 104 among the stations thereof.

In one embodiment, the FPGA 160 receives as an input the differential manchester encoded data, together with the accompanying clock signal. The analog interface in the NIC 122 received the combination data bit stream and clock signal from the token ring 104 and was used to recover the clock signal from the data for inputting the separated clock signal and data to the FPGA 160. Using this input, the FPGA 160 decodes the differential manchester encoded data, which is accompanied by a clock signal having a frequency twice that of the data transmission rate for the token ring 104 and provides an output that corresponds to the decoded or actual data. The decoded data is accompanied by a clock signal having a frequency at the same rate as that of the token ring 104. In conjunction with the tokens or frames from the token ring 104 being applied to the FPGA 160, the phase lock loop 148 is used to synchronize the data received from the ring to the selected clock signal (32 MHz or 8 MHz).

In one embodiment, the FPGA 160 includes a hardware state machine that operates on the just decoded bit serial data stream. When the state machine detects the start delimiter pattern in the data stream, it generates a "data activity" control signal having a predetermined logic level. This control signal remains at this predetermined logic level until the end delimiter pattern for the particular data stream is detected. As noted previously, each frame and token is surrounded by a start and end delimiter in the data stream so that the data activity signal will be asserted for any frame or token received.

The data activity signal or pulse from the hardware state machine of the FPGA 160 is inputted to a counter 374, which counts the number of correctly decoded frames or tokens. That is, each time the predetermined logic level is separately generated, another pulse is produced for counting by the counter 374. Briefly, if a predetermined number of pulses are counted within a predetermined time period, a decision is made that the testing apparatus 100 clock frequency corresponds to the operating speed of the token ring 104. If not, a mismatch exists.

More specifically, the state machine of the FPGA 160 receives data in accordance with a selected clock frequency. In that regard, the token ring is transmitting data either at 16 Mbps or 4 Mbps, although it should be appreciated that transmission rates other than these two would apply as well to this aspect of the invention. In one embodiment, the FPCA 160 communicates with a selective one of clock1 376 and clock2 380. Each of these clocks outputs a clock signal but at a different frequency, with the frequency of clock1 376 being related to a first data transmission frequency, such as 16 Mbps, and clock2 380 being related to a second data transmission frequency, such as 4 Mbps. The selection or control of which of the two clock signals 376, 380 is being utilized is accomplished by the NIC 122. When data is inputted to the FPGA 160, it is accompanied by the selected clock1 or clock2 376, 380, having the predetermined clocking frequency, using the phase lock loop 148. If a token or frame is accurately received by the FPGA 160 at the selected clocking frequency, the state machine will detect the delimiters present in the token or frame and the data activity signal will be generated and counted for that frame or token. However, if the selected clock 376 or 380 does not correspond to the rate at which data is received, invalid data will be decoded and no detection will be made by the FPGA 160 and the data activity pulse will not be generated. For example, if clock1 (16 Mbps) 376 has been selected and is being used to sample or clock the frame, a transition of a data pulse is expected about every 62 nsecs. However, if the data from the token ring 104 is being received at a frequency corresponding to the clock2 (4 Mbps) 380 rate, data would only be received about every 250 nsecs. As a consequence, when the clock signal for this non-corresponding frequency samples the received data, a bit pattern different from a valid frame or token is seen by the FPGA 160. Since no frame or token is detected, the counter 374 is not updated and this will result in a determination by the FPGA 160 of invalid data having been received.

The processor 126 communicates with a control register 396, which is also part of the testing apparatus 100. The control register 396 communicates with the NIC 122. Depending upon the output from the counter 374, the processor 126 controls the setting of a control bit in the control register 396. The state of this control bit is utilized by the NIC 122 to control or change the rate at which data will be transmitted by the testing apparatus 100 around the token ring 104. That is, NIC 122 utilizes the state of this control bit to select or change which of the clock signals 376, 380 is inputted to the FPGA 160 in determining whether valid data is being received.

With reference to FIG. 15, as well as FIG. 14, a description of the operation of the testing apparatus 100 is provided, when it is involved with checking to ensure that it is operating at the same speed as the token ring 104. In accordance with step 400 of FIG. 15, the testing apparatus 100 is inserted into the token ring 104. At step 402, the FPGA 160 state machine is enabled for generating data activity pulses when valid frames or tokens are received. At step 404, the counter 374 is reset in preparation for counting such pulses, if present. A timer is started at step 406 that monitors the time during which the determination is being made as to whether a particular clock frequency of the testing apparatus corresponds to the token ring speed. In accordance with step 408, a determination is made by the FPGA 160, particularly the state machine thereof, as to whether or not the input to the state machine constitutes a frame or token. If yes, a data activity pulse is produced and, at step 410, the counter 376 is updated using this pulse. At step 412, a determination is made as to whether a predetermined number of counts has been reached. If so, at step 414, it is determined that the testing apparatus 100 is operating at the proper ring speed.

On the other hand, if a determination is made at step 408 that the input to the state machine at the selected clock frequency is not a frame or token, a check is made at step 418 as to whether or not the timer interval has expired. If not, checks are continually made in accordance with step 408 as to whether or not a data activity pulse has been generated indicative of a valid frame or token having been received. If the timer has expired, at step 420, a check is made as to whether or not all available clock frequencies have been selected. If not, at step 422, a control bit is changed in the control register. Such a control bit change is used by the NIC 122 at step 426 to select another clock frequency that will be used in receiving tokens and frames by the FPGA 160. However, if no other available clock frequencies can be selected, at step 428, a determination is made that the ring is not operating properly.

With respect to the check made at step 418 as to whether or not the timer has expired, in connection with the selection of a valid operating frequency, the counter 374 is reset and allowed to count for a period of time long enough to ensure that a certain number of data activity pulses will be generated if the selected clock frequency corresponds to the operating speed of the token ring 104. This predetermined time period is based on a calculation of the lowest possible rate for the data activity signal. The lowest possible rate is when there is continual traffic on the ring of maximum length frames with no interspersed tokens. For example, on a token ring that is operating at 16 Mbps, the maximum frame size is 18,000 bytes. For continual traffic of frames having 18,000 bytes with no interspersed tokens, this would result in one frame being received every 9 milliseconds. If a minimum count of 10 by the counter 374 is required as an indication that the selected clock frequency is correct, the counter 374 needs to count for a minimum of 90 milliseconds. A minimum count is required to ensure against randomly generated activity pulses when, in fact, the wrong clock frequency is being utilized.

It should be understood that there is a limit on the amount of time that the testing apparatus 100 is able to delay before making a decision in selecting another available clock frequency. Since the testing apparatus 100 is essentially another station in the token ring 104, in accordance with proper protocol, the testing apparatus 100 acts as a repeater of the frames or tokens that it receives during the interval in which it is determined whether or not it is operating at the speed of the token ring. If the predetermined time for checking is too great an interval, a beacon state could be created in the token ring 104 due to the testing apparatus 100 repeating the transmission it received to its downstream station but at an improper speed for the token ring 104. Hence, the delay time is bounded by an amount of time that would cause a beacon state to occur.

Figure 16:
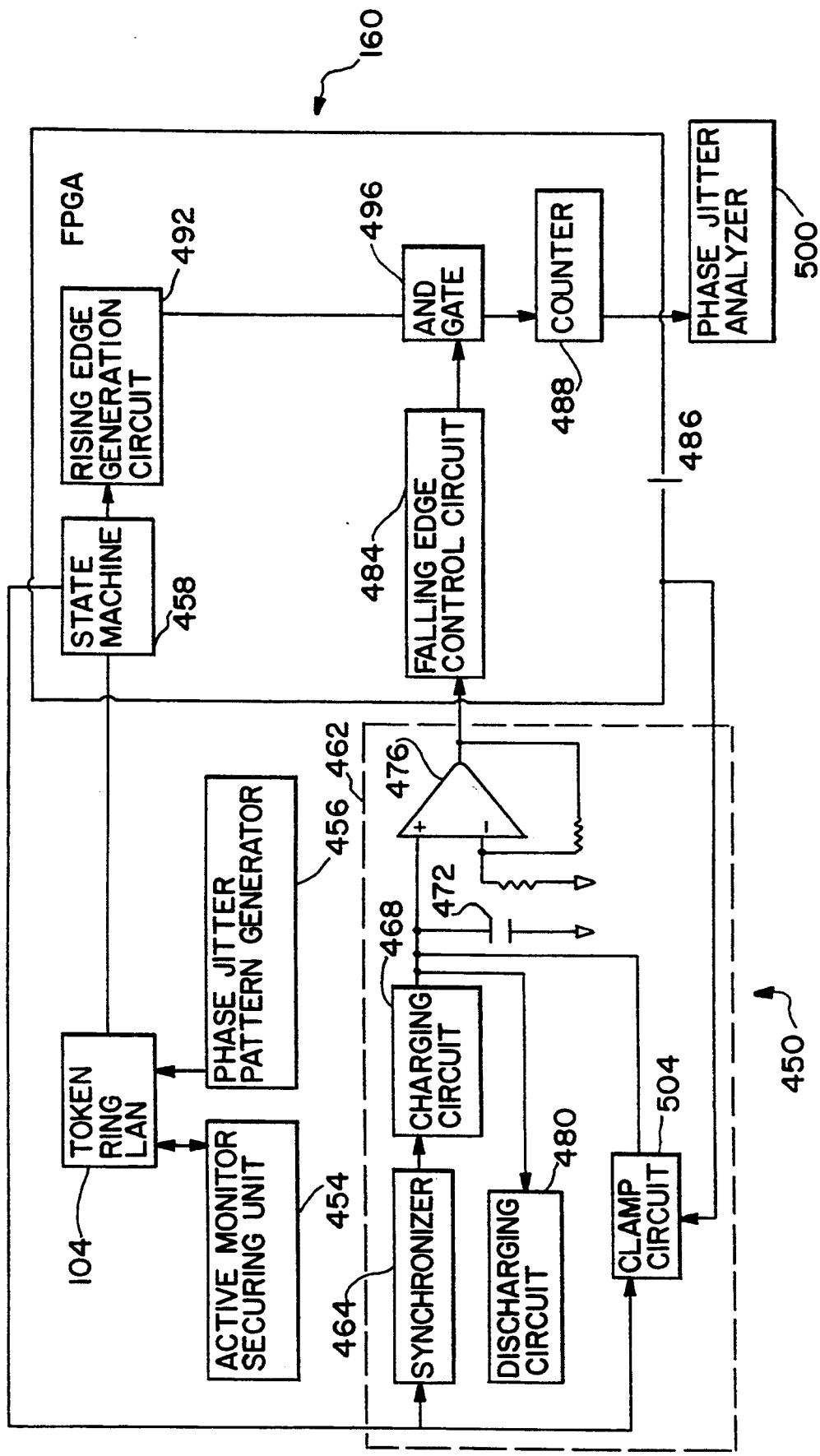
FIG. 16 is a block diagram of the measuring apparatus for use in measuring phase jitter.

With regard to conducting desired tests on the token ring 104, reference is now made to FIG. 16. The insertion capability of the testing apparatus 100 enables it to conduct tests without disruption of normal LAN token ring operation. This capability is particularly important in performing a phase jitter test. Phase jitter is related to unwanted differences in timing between the rising and/or falling edges of a recovered clock accompanying digital data bits being transmitted around the token ring and edges of the reference or master clock for the token ring. Jitter can occur in the token ring as data is transmitted around the ring from station to station. The effect of jitter is more pronounced when the ring speed is greater, e.g., 16 Mbps versus 4 Mbps. The testing apparatus 50 is able to measure phase jitter and determine whether it is acceptable for proper token ring operation. If not, corrective action can be taken.

A block diagram is illustrated in FIG. 16 on the phase jitter measuring apparatus 450, which is part of the testing apparatus 100. To conduct the phase jitter test, the measuring apparatus 450 includes an active monitor securing unit 454 for use in enabling the testing apparatus 100 to become the token ring active monitor (AM). On a token ring, one station performs the function of active monitor. One of the duties of the AM is to provide, in its transmission, the reference clock for the ring. By performing the phase jitter measurement at the station that is the AM, there is direct access to the reference clock which greatly simplifies the measurement process. Another advantage of performing the measurement as the AM station is that it will see the worst case jitter for the ring in comparing its transmit clock to its receive or return clock. This is because its transmit clock is the reference clock for the ring and its receive clock is the net result of that transmit clock being extracted and regenerated by every other station in the ring. Active monitor status is secured for the testing apparatus 100 so that the measuring apparatus 450 can perform the phase jitter test. The unit 454 can include any one of a number of different embodiments. In normal network operation, a station becomes active monitor through a distributed polling process called token claiming. When any station detects the need for token claiming (e.g., when it detects a signal loss, or when it fails to detect an active monitor present (AMP) frame for a specified timeout period), it will initiate token claiming by sending a claim token frame.

Any station receiving a claim token frame with a source address numerically higher than its own will merely repeat that frame. Any station receiving a claim token with a source address less than its own will itself transmit a claim token with its own (higher) source address. A station that is currently transmitting claim tokens will cease if it receives a claim token sent by some other station with a source address higher than its own. Following these rules, eventually only the highest numbered address station will be sending claim tokens on the ring. When this highest numbered station receives three of its own claim token frames without receiving any others, it wins the claim token process and becomes the AM.

In one embodiment, the unit 454 is used in setting the MAC level address of the testing apparatus 100 to the highest available address. When token claiming occurs, the testing apparatus 100 will be awarded the active monitor functions for the token ring 104 since it has the highest address. The active monitor securing unit 454 can initiate the token claiming process by switching the token ring speed to an incorrect value for a short period of time. As just noted, the token ring speed is commonly one of 16 Mbps and 4 Mbps. For example then, the active monitor securing unit 454 sets its transmit clock to a speed different from the correct speed, e.g., setting its clock for 16 Mbps operation, when the correct speed for the ring is 4 Mbps. This will cause a signal loss at the next downstream station because it will be unable to detect any valid data patterns from unit 454. Unit 454 maintains the incorrect speed for a predetermined time, long enough to ensure that the downstream station registers the signal loss and consequently initiates token claiming, but not long enough to cause the downstream station to enter a beacon mode where it has assumed that the signal loss is more than a momentary one. When unit 454 reverts to the correct speed, the signal loss condition ends. Meanwhile, the token claiming process initiated by the station downstream of unit 454 takes place. Since unit 454 has the highest available address, its station address, the testing apparatus 100 will win the token claiming process and become the active monitor. After the testing apparatus 100 becomes active monitor, a phase jitter pattern generation unit 456 of the measuring apparatus 450 is able to transmit a frame having a predetermined phase jitter test pattern to the token ring 104, together with the reference clock signal to be recovered, after transmission around the token ring 104. In accordance with well-known phase jitter measurements, the test patterns commonly used are all logical zeros or all logical ones patterns. With respect to a token ring having a speed of 16 Mbps and taking into account the differential manchester bit encoding used, a zeros pattern appears as a 16 MHz square wave and a ones pattern appears as a 8 MHz square wave. The phase jitter test pattern is encapsulated in a normal data frame on the token ring. The frame includes, among other things, a destination address that includes bits identifying the token ring station to which the frame is being sent. Source address bits are also provided in the frame and identify the source or originator of the particular frame. The differential manchester encoding of the data allows the clock signal to be recovered from the incoming data. This recovered clock signal is used in making the phase jitter measurement.

When the frame having the phase jitter test pattern is transmitted from station to station in the token ring 104, differences can occur between the rising and/or falling edges of the recovered clock, accompanying the test pattern data, and the reference clock. Any such difference is measured by the phase jitter measuring apparatus 450. Briefly, after the testing apparatus 100 becomes the active monitor, the measuring apparatus 450 compares the reference clock for the token ring with the recovered clock that is associated with the frame being transmitted having the phase jitter test pattern. The result of this comparison for a number of test examples is indicative of any token ring phase jitter.

Other procedures could be employed for securing active monitor status for the testing apparatus 100. In another embodiment, a station not strictly adhering to the MAC protocol could, while being controlled by software or firmware, cause a frame to be sent that would initiate token claiming, such as a claim token or beacon frame, and then win token claiming, as previously described. In still another embodiment, the testing apparatus 100 includes a chip set that utilizes hardware to wrap transmit so that the chip set sees a token ring with only itself as an active station. After a certain period of time without receiving data traffic, the MAC protocol causes the chip set to declare itself active monitor. After becoming active monitor, the testing apparatus 100 is inserted into the token ring so that there are now two active monitors, including the active monitor that existed before insertion. At this stage, a resolution process takes place in which only one of the two active monitor stations can be designated as having the active monitor status. In accordance with MAC protocol, if a first active monitor receives an active monitor present (AMP) frame from another station, that station demotes itself to standby monitor status. The testing apparatus 100 therefore can become active monitor by sending an AMP frame before the other active monitor sends its own AMP frame. If the testing apparatus 100 receives the other active monitor's AMP frame first, the testing apparatus 100 de-inserts and another attempt is made until the testing apparatus 100 does become the active monitor. In yet another embodiment, the testing apparatus 100 sends a remove ring station frame to the current active monitor. Such an embodiment has the disadvantage of changing the ring network topology and may unwantedly remove an important node from the token ring network.

As also seen in FIG. 16, the phase jitter measuring apparatus 450 of the testing apparatus 100 includes a state machine 458 for use in determining when the phase jitter test frame is returned after transmission around the token ring 104. The state machine 458 includes conventional hardware for determining whether the phase jitter test frame is currently being received by the testing apparatus 100. As noted, the token ring 104 is maintained in its normal operational state during the phase jitter test. As a consequence, normal frame traffic continues during the time that the test frame is being transmitted and subsequently received by the measuring apparatus 450 of the testing apparatus 100. It therefore becomes necessary to distinguish the test frame from normal frame traffic. This conventional state machine 458 is implemented in one embodiment as part of the FPGA 160 and uses a static random access memory (RAM). The state machine 458 searches for a specific pattern, such as the source address and the destination address of the testing apparatus 100. The state machine 458 includes a delay to allow the phase-lock loop 148 to stabilize in connection with the phase jitter testing operation. After a predetermined delay, the state machine 458 is able to provide a recovered clock output whenever the addresses of the returned frame match the predetermined pattern that is being checked for by the state machine 458.

The output of the state machine 458 communicates with a dual slope interpolation circuit 462 for increasing the resolution of the time difference between the recovered clock of the test frame and the reference clock of the token ring. The circuit 462 includes a synchronizer 464 for outputting a pulse that corresponds to the time difference between the reference clock for the token ring 104 and an interpolation pulse input, which is a signal derived from the recovered clock signal outputted by the state machine 458. The synchronizer 464 includes, in one embodiment, a pair of serially connected D-type flip-flops, with the output of the second D-type flip-flop being connected to an And gate. The other input to the And gate is the interpolation pulse input. The output of the And gate of the synchronizer 464 is a pulse that reflects any timing difference between the reference clock and the recovered clock signal.

Because the duration of the pulse outputted by the synchronizer 464 is relatively short, a technique that is known as dual-slope interpolation is employed to provide greater sensitivity or higher resolution in analyzing the timing difference related to the reference and recovered clock signals. That is, the output from the synchronizer 464 is interpolated or expanded before making a determination as to the magnitude of the time difference. In connection with this interpolation, the output of the synchronizer 464 is sent to a charging circuit 468. The charging circuit 468 includes, in one embodiment, a 2 mA current source that is activated or turned on by the pulse from the synchronizer 464. The charging current outputted by the charging circuit 468 is applied to a comparator input circuit 472, which supplies the input to the inverting input of a comparator 476. In one embodiment, the comparator input circuit. 472 is a capacitor that is charged by the 2 mA current source for a period of time substantially equal to the pulse width outputted by the synchronizer 464. The charging circuit 468 communicates with a discharging circuit 480 which, in one embodiment, is a 4 μA current source. The current source of the discharging circuit 480 has current flow in a direction away from the charging circuit 468 and the rate of current flow is related to the discharge rate of the capacitor 472. The discharge rate is much smaller than the charge rate and this difference is used to enhance the interpolation or resolution of the time difference associated with the output pulse from the synchronizer 464.

In connection with obtaining a magnitude related to this time difference, the comparator 476 compares the magnitude of the voltage present on the capacitor 472 with a predetermined threshold inputted to a non-inverting input of the comparator 476. Whenever the magnitude of the inverting input to the comparator 476 is greater than the predetermined threshold, the comparator 476 provides an interpolated output pulse that is used in measuring the magnitude of any phase jitter.

With reference to FIGS. 17A–17D, timing diagrams related to the operation of the interpolation circuit 462 are illustrated. FIG. 17A illustrates the signal derived from the recovered clock signal that accompanies the test frame. In FIG. 17B, the pulse outputted by the synchronizer 464 is shown and its width or duration represents the difference between a reference clock and the signal derived from the recovered clock accompanying the phase jitter test frame. FIG. 17C illustrates the voltage across the charging capacitor 472, with the peak voltage being reached instantaneously before the start of the falling edge of the pulse of FIG. 17B. The voltage across the charging capacitor 472 begins to discharge at a slower rate than the charging rate. As seen in FIG. 17D, during the charging and discharging of the capacitor 472 away from and towards a zero volt value, the comparator 476 changes state. As noted previously, in the illustrated embodiment, the output of the comparator changes from a logic high to a logic low, during the time that the voltage across the capacitor 472 is greater than the predetermined threshold voltage inputted to the comparator 476. In the illustrated embodiment, the predetermined threshold is zero volts.

As seen in FIG. 16, the output of the comparator 476 is sent to a falling edge control circuit 484 of an interpolation counter 486. The interpolation counter 486 is part of the field programmable gate array (FPGA) 160. The falling edge control circuit 484 is used in controlling a counter 488. The counter 488 counts pulses related to the time difference between the reference clock and the recovered clock. Briefly, the greater the number of counts reached by the counter 488 before its counting operation is terminated means a greater timing difference and greater phase difference. Also used in controlling the counter 488 is a rising edge generation circuit 492. The circuit 492 communicates with the state machine 458 and receives the state machine output ("keep" signal) representative of the occurrence of a match indicating that a phase jitter test frame was received by the measuring apparatus 450. The rising edge generation circuit 492 includes logic gates for use in providing a logic high output when such a match output signal is generated by the state machine 458. The output of the circuit 492 is applied to an And gate 496. The other input to the And gate 496 is received from the falling edge control circuit 484.

With regard to the inputting of pulses to be counted by the counter 488, the falling edge control circuit 484 and the rising edge generation circuit 492 cooperate to ensure that the counter 488 is only operational from the time a match is determined until the termination of the interpolation (the comparator 476 output becomes a logic high). In that regard, the rising edge generation circuit 492 is used to control the initiation of the counter 488 upon receipt of the triggering pulse outputted by the state machine 458. At the time that the rising edge generation circuit 492 provides a logic high to the And gate 496, the falling edge control circuit 484 is also applying a logic high to this same And gate 496. Because there is a short delay associated with the comparator 476 changing state and to avoid reliance on the current output state of the comparator 476 upon determination that a test pattern has been received, as indicated by the output from the state machine 458, the triggering on of the counter 488 is not controlled by the output of the comparator 476. However, after a predetermined time period, as reflected by a number of counts made by the counter 488, the falling edge control circuit 484 is used in controlling the turning off of the counter 488. More specifically, the circuit 484 includes a comparator hold off circuit that comprises, in one embodiment, a D-type flip-flop and an inverter. The output of the inverter is normally a logic high. This logic high is applied to the And gate 496 through an Or gate of the falling edge control circuit 484. Consequently, when the output of the rising edge generation circuit 492 becomes high, the And gate 496 output is a logic high. This logic high is used in causing the counter 488 to begin counting. After the counter 488 reaches the predetermined count, an input from the counter 488 is provided to the D-type flip-flop of the comparator hold off circuit of the falling edge control circuit 484. Also, by the end of this predetermined count and the time associated therewith, the comparator 476 output state has had sufficient time to change to a logic low, which is indicative of an interpolation being performed. This logic low is inverted and, through the same or gate, is applied to the And gate 496. Even though the logic high to the or gate from the comparator hold off circuit has now changed to a logic low, the other input to the or gate from the comparator 476 is a logic high so that the counter 488 continues to count. That is, each of the inputs to the And gate 496 from the falling edge control circuit 484 and the rising edge generation circuit 492 continue to be a logic high. Upon the output of the comparator 476 returning to its normally high logic state, at the end of the current interpolation, the counter 488 is caused to turn off by means of the falling edge control circuit 484 since it changes state to a logic low input to the And gate 496. The output of the counter 488 can then be applied to a phase jitter analyzer circuit 500 for use in analyzing the results of the phase jitter test. The output of the counter 488 represents the time difference between recovered and reference clocks. In one well-known embodiment, a graph or correlation is devised that includes the number of test frames or samples that were received by the measuring apparatus 450 having determined time differences between the reference clock and the recovered clock. Typically, such a correlation results in a gaussian curve. A measurement of uncorrelated jitter is based upon the width of the gaussian curve. A determination of the width of the curve can be compared with standard or in tolerance curves or values in order to ascertain whether or not the measured phase jitter of the token ring is within tolerance.

In connection with ensuring the accuracy of the count produced by the counter 488, it is important that the output of the comparator 476 properly change state when the voltage on the capacitor 472 becomes less than the predetermined threshold, such as 0 v, which threshold is also inputted to the comparator 476. In the case in which the predetermined threshold is 0 v, the comparator 476 may have an offset voltage associated with it, which requires that the inverting input received from the capacitor 472 be reduced an additional voltage or amount, e.g., 10 microvolts, before the comparator 476 changes back to its logic high state. If such an offset exists, the comparator 476 output could be unwantedly maintained at a logic low level causing the counter 488 to continue to count. To overcome this potential problem, the interpolation circuit 462 includes a clamp circuit 504, which is also schematically illustrated in FIG. 18. As seen in FIG. 18, the capacitor 472 is connected to a voltage follower 510. The output of the voltage follower 510 is tied to its inverting input. The output of the voltage follower 510 is also applied to resistor 514 and the resistor 514 is connected at its opposite end to node 518. Also connected to node 518 is a diode 522, which is in series with a resistor 526. Preferably, resistors 514, 526 have the same value of resistance, such as 51K ohms. A clamp input is controllably applied to resistor 526 using the FPGA 160 of the testing apparatus 100. The node 518 is coupled to the inverting input of an operational amplifier 530. In the illustrated embodiment, the non-inverting input is held at ground. The output of the operational amplifier 530 is connected to the non-inverting input thereof by a parallel network that includes a diode 534 and a capacitor 538. The diode 534 is used to assure that the operational amplifier 530 does not saturate when the clamp circuit 504 is not operational and the capacitor 538 provides loop compensation thereby avoiding unwanted oscillations.

The output of the operational amplifier 530 is connected to a schottky diode 542, which prevents any discharge of the capacitor 472 through the clamp circuit 504. When the interpolation circuit 462 is activated and the capacitor 472 is charging or discharging, as illustrated in FIG. 17C, the voltage across the capacitor 472 is reflected at the output of the voltage follower 510.

The operation of the clamp circuit 504 is next described. The clamp input applied at resistor 526 is either a logic high or a logic low. The clamp circuit is inactive when a logic high is applied as the input. When a logic high is applied, the output of the operational amplifier 530 is at a one diode voltage drop below ground. The discharging circuit 480 will discharge the capacitor 472 until its voltage is two voltage diode drops below ground (diode 534 and schottky diode 542). Once the capacitor 472 has such a voltage, the schottky diode 542 is forward biased and four microamps of current flow into the capacitor 472. This current flow balances the discharging circuit 480 and prevents any further discharge of the capacitor 472. Thus, when the capacitor 472 is able to discharge sufficiently below the reference level of ground, there is certainty that the output of the comparator 476 will change state at the end of the particular interpolation cycle.

When a logic low is applied to the clamp circuit 504, it is in an active state. When this occurs, the operational amplifier 530 sources current through the schottky diode 542 until the voltage on the capacitor 472 reaches 0 v. When this predetermined reference voltage of 0 v is reached, the current sourced by the operational amplifier 530 drops to or becomes four microamps and the capacitor voltage remains at 0 v with the operational amplifier 530 balancing the discharging circuit 480. Thus, when the clamp circuit 504 is activated, a predetermined and consistent voltage is present on the capacitor 472 and applied as an input to the comparator 472.

In conjunction with the sequence and timing for activating and deactivating the clamp circuit 504, when a phase jitter measurement is to be made, the clamp circuit 504 is activated by applying a logic low to the clamp input. A sufficient amount of time passes for the capacitor 472 to stabilize to the reference voltage, which in this embodiment is 0 v. At this time, the measuring apparatus 450 is ready to initiate the next measurement. In that regard, a phase jitter test frame is transmitted to the token ring using the phase jitter pattern generator 456, which can include the NIC 122. When this phase jitter test pattern is received back by the testing apparatus 100, the state machine 458 detects its presence and generates the "keep" pulse. At the same time that this pulse is applied to the rising edge generation circuit 492, it is also used in initiating the application of a logic high to the clamp circuit 504. This logic high deactivates the clamp circuit 504 during the time period in which the interpolation process takes place. As previously noted, the logic high enables the clamp circuit 504 to ensure that the comparator 476 changes state at the end of the particular interpolation cycle. The logic high remains applied to the clamp circuit 504 for a predetermined time, which is at least 1000 reference clock pulses. The number of pulses is based on the ratio of the currents used in the charging circuit 468 and the discharging circuit 480, together with the factor that the pulse outputted by the synchronizer 464 must be less than two reference clock pulses. In the present example, the ratio of the currents is 2 milliamps/4 microamps=500×2 (clock pulses)=1000. After this predetermined time has elapsed, the interpolation process is known to be finished and the output of the counter 488 is read and can subsequently be used as one sample in the phase jitter analysis. To prepare for receipt of another phase jitter sample, the interpolation circuit 462 is cleared as well as once again activating the clamp circuit 504 by applying a logic low as the clamp input.

Figure 19:
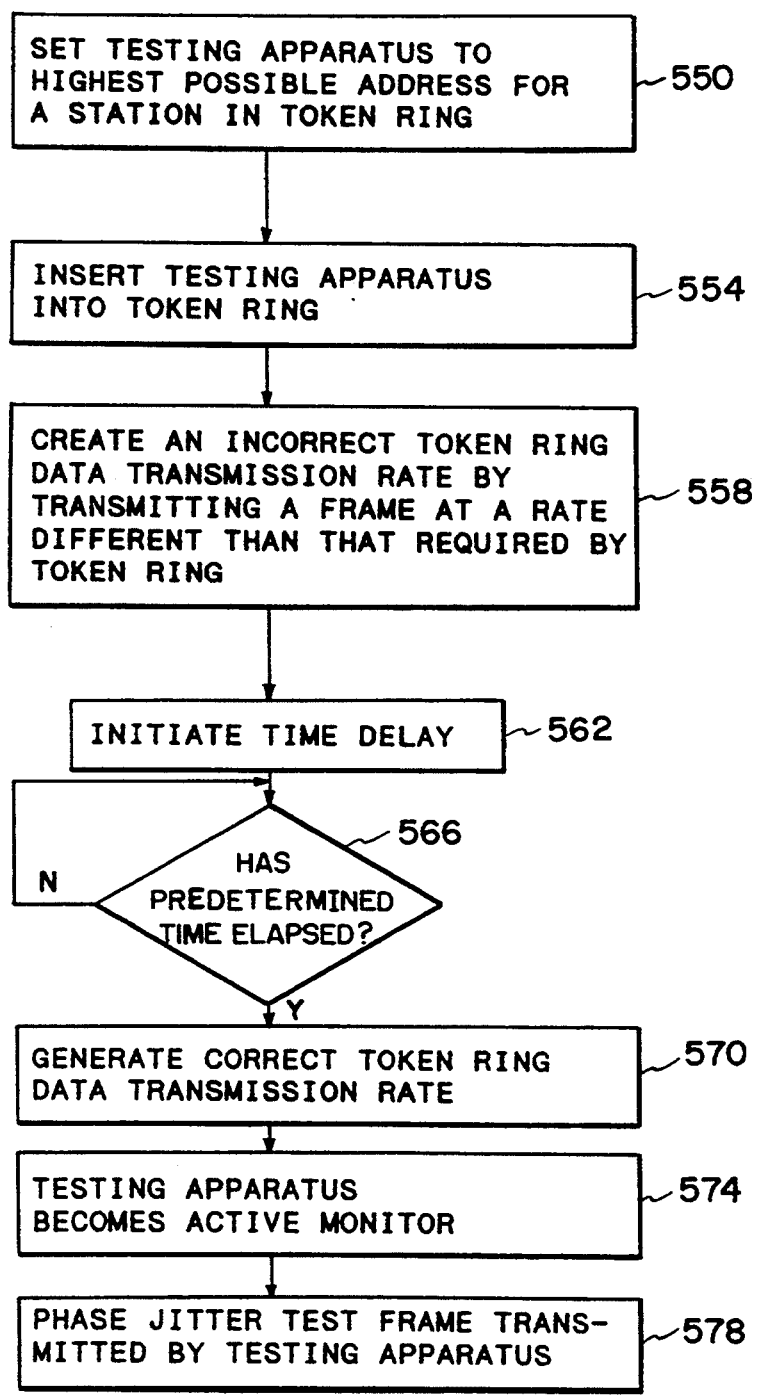
FIG. 19 is a flow diagram illustrating steps taken by the testing apparatus, in one embodiment, in order to become the active monitor for use in sending phase jitter test patterns.
Figure 20:
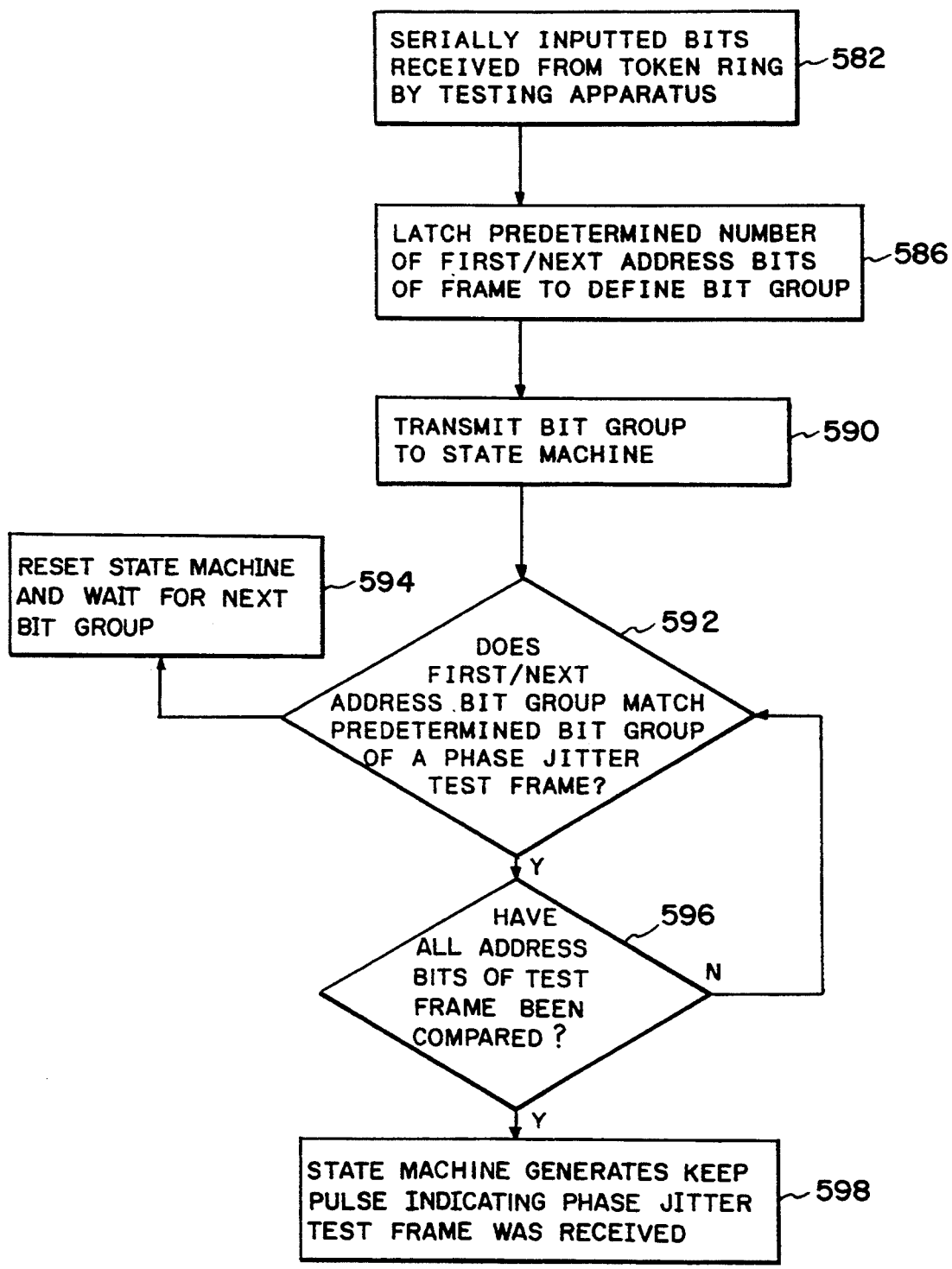

In describing the operation of the phase jitter measuring apparatus 450, reference is now made to FIGS. 19 and 20, as well as FIG. 16. FIG. 19 illustrates a flow diagram related to the steps employed, in one embodiment, for securing active monitor status for the testing apparatus 100. In conducting the phase jitter test, at step 550, the testing apparatus 100 is set to the highest possible address for a station in the token ring 104. The testing apparatus 100 is then inserted into the token ring 104 in accordance with step 554. At step 558, the measuring apparatus 450 creates an erroneous ring speed. Upon generation of the erroneous ring speed, a time delay is initiated at 562. Next, the measuring apparatus 100 determines whether or not a predetermined time has elapsed, in accordance with step 566. If not, a check continues to be made as to whether the time delay is finished. If the predetermined time of the time delay has elapsed, at step 570, the correct ring speed is generated in the token ring 104. After the generation of the correct ring speed, based on the testing apparatus 100 having the highest possible address, it becomes the active monitor for claiming the token at step 574. Once the testing apparatus 100 has the claim token and the active Monitor status, the measuring apparatus 450 transmits a phase jitter test frame at step 578, with such transmission occurring during normal token ring operation. Before this transmission, the clamp circuit 504 is activated (logic low applied as the clamp input).

The test frame is transmitted around the token ring 104 from station to station. After completion of transmission of the test frame, it is then returned to the measuring apparatus 45C. In that regard, with reference to FIG. 20, at step 582, the measuring apparatus 450 receives the test frame in serially inputted bits from the token ring. In accordance with step 586, a predetermined number of the serially inputted test frame bits are latched to define a bit group, which, in one embodiment, includes source address and/or destination address information. At step 590, the first defined bit group is sent to the state machine 558 including a static RAM. The state machine 558 determines whether this current bit group matches or corresponds to a predetermined bit group, such as the source address and/or destination address, each of which corresponds to the address of the testing apparatus 100, at step 592. If a no match determination is made, the state machine 458 is reset at step 594 and the state machine 458 is ready to analyze the next frame received from the token ring. If a match exists, at step 596, a determination is made as to whether all address related bits of the frame have been compared. If yes, at step 598, the state machine 458 generates a "keep" pulse indicating that a match was made and a phase jitter test frame has been received. If less than all address bits for comparison have not been checked, the next bit group is compared at step 592 and the checking process continues until a determination of no match is made or until all predetermined bits of the address test frame are found to provide a match by the state machine 458.

Upon generation of a "keep" pulse by the state machine 458 indicating a receipt of a test frame, an interpolation input pulse is derived therefrom and inputted to the synchronizer 464. At the same time, the "keep" signal is applied to the rising edge generation circuit 492 and is also used to initiate the deactivation of the clamp circuit 504 (logic high applied as the clamp input). Because the other input to the And gate 496 is also a logic high due to the operation of the comparator hold off circuit of the falling edge control circuit 484, the And gate 496 outputs a logic high for use in starting the counter 488. As pointed out previously, the magnitude of the counter is representative of the time difference between the token ring reference clock and the recovered clock associated with the received test frame.

As the counter 458 begins counting, based on the input provided by the rising edge generation circuit 492, the synchronizer 464 output controls the charging circuit 468 by turning it on and causing the capacitor 472 to be charged by this 2 mA current source. With the beginning of the interpolation cycle, the testing apparatus 100 has applied a logic high to the clamp input of the clamp circuit 504. The increased voltage across the capacitor 472 causes the comparator 476 to change state to a logic low. This logic low is inverted by the falling edge control circuit 484 and this resulting logic high is applied to the And gate 496. Meanwhile, after a predetermined count corresponding to a predetermined amount of time, the counter 488 applies an input to the clock of the D-type flip-flop of the comparator hold off circuit of the falling edge control circuit 484 thereby changing its output to a logic low. The counter 488 continues to count while the comparator 476 output is a logic low. After the comparator 476 changes its output level to a logic high, no more pulses will be generated for input to the counter 488.

During the time that the capacitor 472 is charging and discharging, until it reaches a predetermined discharge value, such as zero volts, the comparator 476 output remains at a logic low so that pulses continue to be inputted to the counter 488. At the end of the interpolation cycle, the comparator 476 output changes state causing the counter 488 to stop counting. The testing apparatus 100 reads the count of the counter 488 and is able to utilize the count information to measure or analyze phase jitter. At the same time, the FPGA 160 causes a logic low to be applied to the clamp input of the clamp circuit 504 and the counter 488 is reset and is prepared for the next phase jitter test frame.

Figure 21:
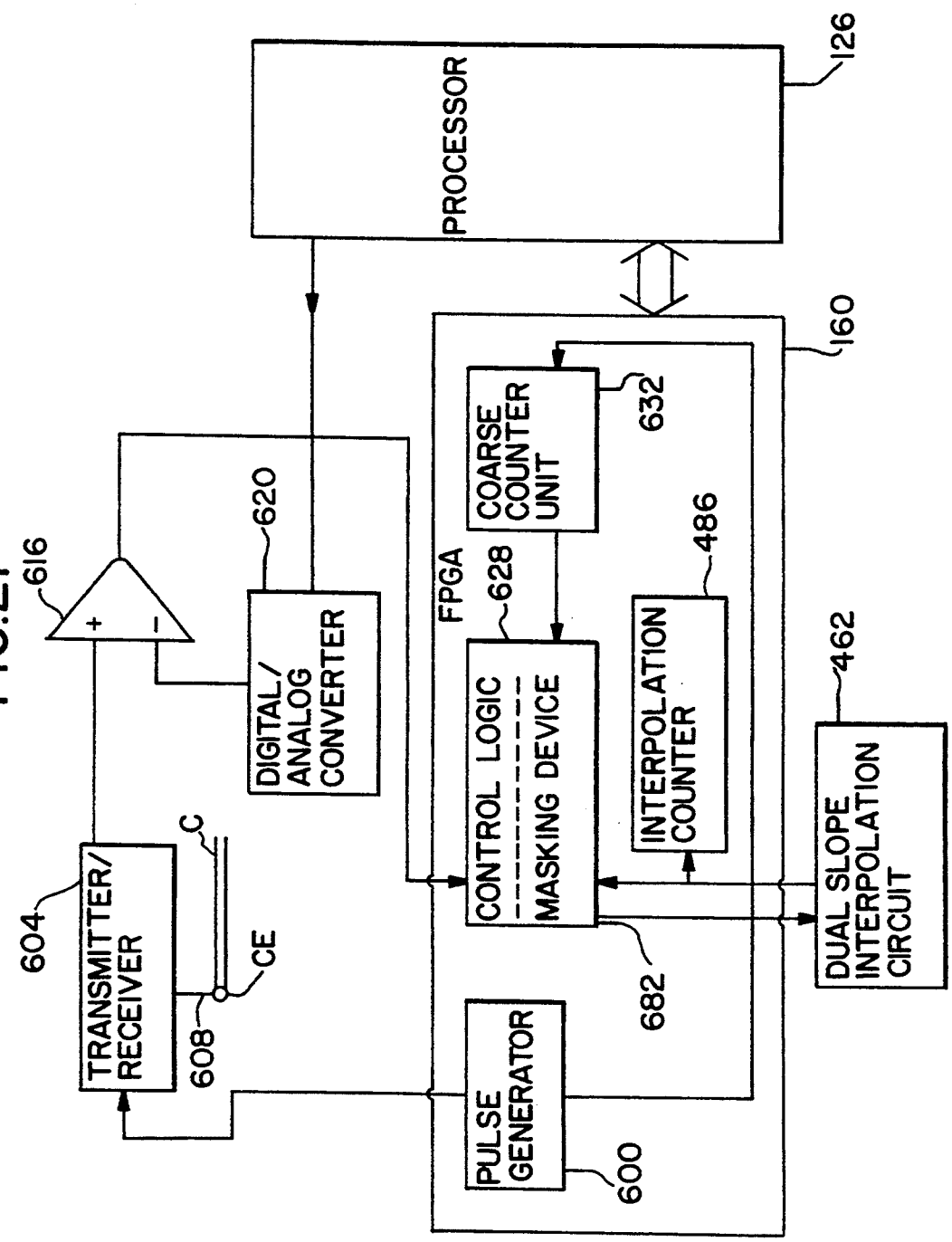
FIG. 21 is a block diagram of TDR related circuitry for use in testing the integrity of cable conductors.

With reference now to FIG. 21, further testing that can be conducted by the testing apparatus 100 is described. Specifically, the testing apparatus 100 utilizes time delay reflectory (TDR) techniques to test the integrity of a cable conductor (C). The testing apparatus 100 is able to ascertain certain cable conductor parameters or conditions including determining the length of the cable conductor and obtaining information related to cable faults. Cable faults include faults at the connector end (CE) of a cable conductor and electrical shorts and opens in a cable conductor. Generally, in using TDR, a pulse is generated and transmitted along the cable conductor. If a return pulse or signal is not received, a determination is made that the cable conductor has no faults and is properly terminated. If a fault exists, a return pulse is received. The amplitude of the return pulse is representative of the kind of fault that is present in the cable conductor. The interval between the transmission of the pulse and receipt of the return pulse is indicative of the location of the fault.

With reference to FIG. 21, an embodiment is illustrated that uses FDR in ascertaining cable conductor parameters and/or conditions. A pulse or signal generator 600 produces a pulse of a predetermined amplitude and duration under processor 126 control, when it is desirable to conduct cable conductor tests. The pulse outputted by the pulse generator 600 is applied to a transmitter/receiver 604. The transmitter/receiver 604 preferably has a directional coupler function in which any return signal or pulse from the cable conductor C is received or directed in one direction only. Consequently, a transmitter operation need not be discontinued or decoupled in order to properly receive a return pulse or signal. The particular circuit elements of the transmitter/receiver 604 will be discussed in greater detail later.

The transmitter/receiver 604 sends a transmitted pulse or signal from its transmit/receive line 608 to the cable conductor C that is being tested. In one embodiment, the cable conductor C is a twisted conducting pair that constitutes one conducting path or line of a multi-conductor cable. The cable conductor C includes the connector end (CE) that physically interconnects the transmit/receive line 608 to the cable conductor C and is also used in providing the necessary electrical connection therebetween. Any returned or reflected pulse from the cable conductor C is received by the transmit/receive line 608 and applied to the transmitter/receiver 604. This return pulse is detected by the transmitter/receiver circuitry and outputted to a comparator 616. If the detected pulse or signal is greater than a predetermined threshold, the output of the comparator 216 changes, such as changing state from a logic low to a logic high. The determined threshold value applied to the other input of the comparator is preferably varied using a digital/analog (d/a) converter 620. The digital/analog converter 620 enables the testing apparatus 100 to adjust in order to provide desired degrees or ranges of sensitivity. That is, depending upon the output of the digital/analog converter 620 applied to the comparator 616, different degrees of faults can be measured. For example, in detecting relatively significant or gross faults, the predetermined threshold provided by the digital/analog converter 620 is relatively great in value so that only return pulses of high amplitudes, indicative of gross failures, would trigger or turn on the comparator 616. The input to the d/a converter 620 is controlled by the testing apparatus processor 126. The processor 126 executes a software implemented algorithm that changes or increments the input applied to the d/a converter 620. In use, the input is varied in predetermined steps in determining whether a cable fault is present and the magnitude of the fault. When the comparator 616 fires, a determination is made that a fault exists having a magnitude at least as great as the magnitude related to the present input to the d/a converter 620. The input to the d/a converter 620 can be changed in predetermined steps until the comparator 616 no longer changes state. The last input value to the d/a converter 620, that caused it to fire, substantially equates, or is at least proportional, to the amplitude of the return signal. This last input can be used in analyzing the magnitude of the cable fault.

In measuring the location and magnitude of any return pulse, the output of the comparator 616 is applied to the field programmable gate array (FPGA) 160. The FPGA 160 includes control logic 628 that detects the change in state or logic level of the comparator signal that is inputted thereto and monitors the time interval between transmission of the transmit pulse by the pulse generator 600 and receipt of the return pulse using the input from a coarse counter unit 632. In that regard, the coarse counter unit 632 counts the number of pulses that are generated during the time interval between transmitted and return pulses. The counter 632 is triggered or begins to count at the same time the pulse from the pulse generator 600 is produced. In one embodiment, the coarse counter unit 632 counts pulses using a 32 MHz signal. This signal corresponds to a pulse occurring about every 31 nsecs. Because a reflected pulse may be received at some time between the beginning and end of a cycle associated with the 32 MHz signal, there is some indefiniteness or lack of sensitivity in determining more precisely where along the cable the return pulse was generated or the fault exists. In the case of the 32 mHZ signal, a discrepancy of as much as about 20 feet along the cable conductor may exist. To achieve greater sensitivity, the previously described dual slope interpolation circuit 462 is used to determine the time difference between the rising edge of the current pulse from the coarse counter unit 632 and the rising edge of the pulse received by the control logic 628 from the comparator 616. The output of the dual slope interpolation circuit 462 is applied to the interpolation counter 486 to provide a determination of this difference between the rising edges of these two pulses. This difference is summed with the coarse counter unit 632 output and is used in determining the time that elapsed between the transmit and return pulses, which is representative of the location along the cable conductor C at which the return pulse was generated.

Figure 22:
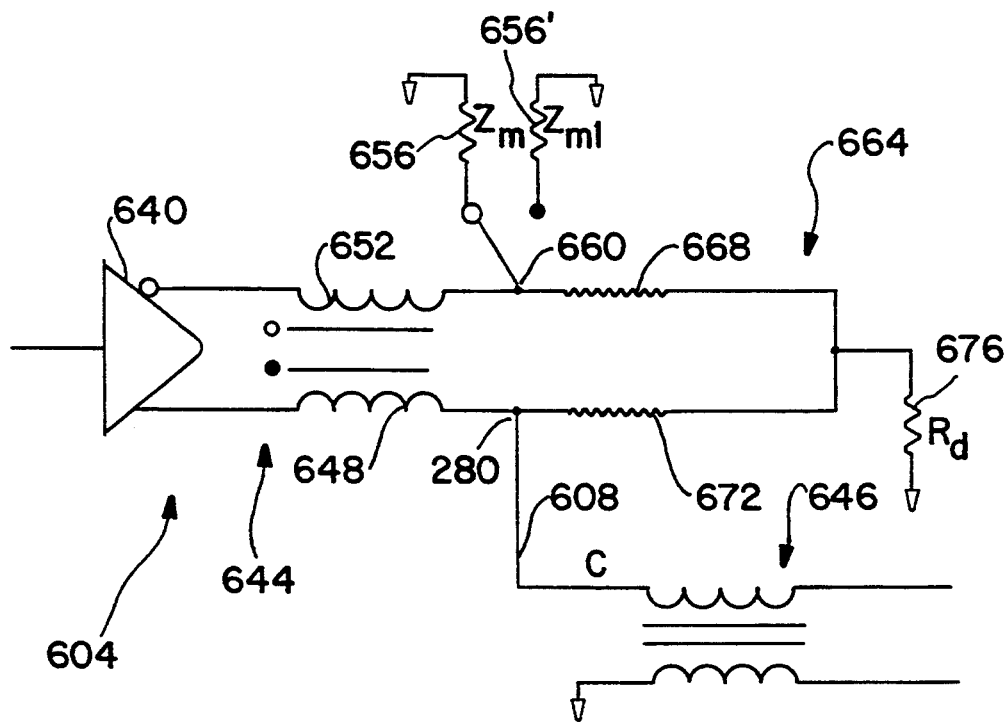
FIG. 22 is a circuit schematic of the transmitter/receiver of FIG. 21 including an illustration of the directional coupler and the single element matching impedance.

Referring to FIG. 22, the transmitter/receiver 604 is illustrated. The transmitter/receiver 604 includes, in one embodiment, a differential driver 640 having two complementary output lines that connect to a balun device 644. A differential drive is not required and a single ended drive could be utilized instead, with the output of the single ended drive connected to the lower leg of the balun device 644 and with the upper leg grounded. The balun device 644 provides the direct connection to the cable conductor C through the transmit/receive output line 608 and functions as a directional coupler, i.e., any return pulse from the cable conductor C has a signal path in only one direction. The cable conductor C includes a balun 646 that translates the unbalanced signal on the line 608 to a balanced signal for transmission over a twisted pair of the cable conductor C. Likewise, any return signal from the twisted pair becomes an unbalanced signal by means of the balun 646 and this unbalanced signal is applied to the balun device 644.

The balun device 644 includes a first inductor 648 that is connected to a first output from the driver 640 and a second inductor 652 that is electrically connected to a second output from the driver 640. The inductors 648, 652 are mutually coupled to form a transformer. The first and second outputs of the driver 640 provide the logic level outputs in response to the pulse input from the pulse generator 600. In one embodiment, when the transmitter/receiver 604 is in a quiescent state including no voltage input being received from the pulse generator 600, the first output line from the driver 640 is at a logic low and the second output line is at a logic high. These complementary values are reversed when a pulse is received by the driver 640 from the pulse generator 600. The other end of the first inductor 648 is connected to the transmit/receive output line 608 and the other end of the second inductor 652 is connected to a matching impedance ($Z_m$) 656, which is used in matching the transmitter/receiver 604 input impedance to the impedance of the cable conductor C. For example, common cable conductor impedances are 100 ohms and 150 ohms. A key aspect of the transmitter/receiver 604 having directional coupling is that only this single impedance $Z_m$ need be modified in order to match the impedance of the cable conductor C. This aspect will also be explained in greater detail later. In conjunction with providing the correct value of $Z_m$ so that matching impedances are achieved, in one embodiment, a number of switchably selectable impedance elements are provided for connection to the node 660 including $Z_m$ 656 and $Z_{m1}$ 656'. Depending upon the impedance of the cable conductor C, the correct value of impedance is selected and switched in order to become part of the transmitter/receiver 604. In one embodiment, the selectable matching impedances are resistors having values that match known and expected cable conductor impedances, such as $Z_m = 100$ or 150 ohms and $Z_{m1}$ = the other of these two ohmic values. Although individual impedance elements $Z_m$ and $Z_{m1}$ are illustrated, from which one matching impedance is selected, other impedance elements could be utilized, such as a variable resistive element, with the important factor being that such an impedance element must provide the desired match when an AC signal, namely the return pulse, is received. It is important that the input impedance match the cable conductor impedance to avoid the generation of multiple reflection pulses. In particular, as is well known, when there is a mismatch between cable conductor impedance and input impedance, additional or reflective pulses are generated. The number and amplitude of reflective pulses depends upon the magnitude of the mismatch. These reflective pulses do not accurately represent information related to a cable fault.

The balun device 644 is also connected to a resistive network 664, which includes a first resistor 668 and a second resistor 672. Each of these two resistors is connected to a detecting resistor ($R_d$) 676. In one embodiment, the values of the resistors 668, 672, 676 are the same, e.g., 10k ohms.

Figure 23A:
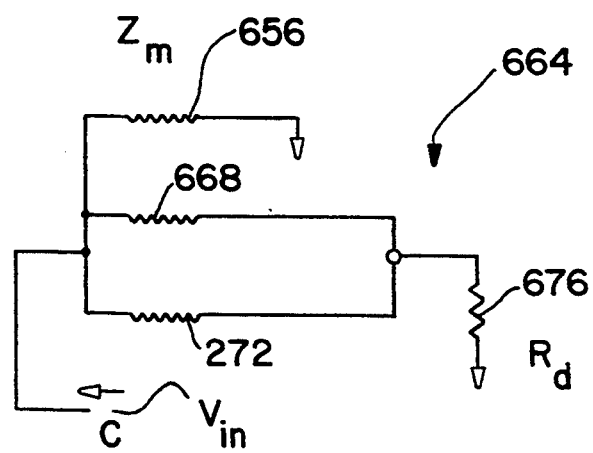
FIGS. 23A–23B illustrate equivalent circuits related to the single element impedance that matches cable conductor impedance.
Figure 23B:
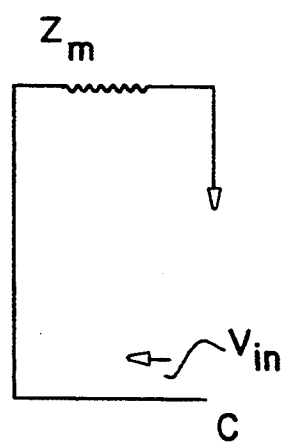

Before proceeding with a description of the operation of the transmitter/receiver 604 when a transmit pulse is sent and a return pulse is received, reference is made to FIGS. 23A–23B in connection with an explanation of the feature in which the impedance $Z_m$ is selected to match the cable conductor impedance, in the context of a return pulse or AC signal received from the cable conductor C. In this embodiment, the impedance associated with the driver 640 is very low and, for purposes of this analysis, can be accurately assumed to be about zero. Consequently, the return pulse is applied to a resistive circuit that includes $Z_m$, $R_d$ and the resistive network 664. The values of the resistors 668, 672, 676 are selected to be substantially greater than the value of the resistance of the resistor or impedance element 656, e.g., $Z_m = 100$ or 150 ohms, while the value of each of the resistors 668, 672, 676 equals about 10k ohms. The resistive network 664 and the resistor $R_d$, have an equivalent resistance of 15k ohms, which is substantially greater than the impedance of $Z_m$. As a consequence, the effective or resulting input impedance is represented in FIG. 23B and corresponds to the impedance of $Z_m$ alone. Hence, by selection of $Z_m$ alone, the input impedance associated with the transmitter/receiver 604 can be matched to the cable conductor impedance and multiple reflection pulses can be avoided.

Figure 24:
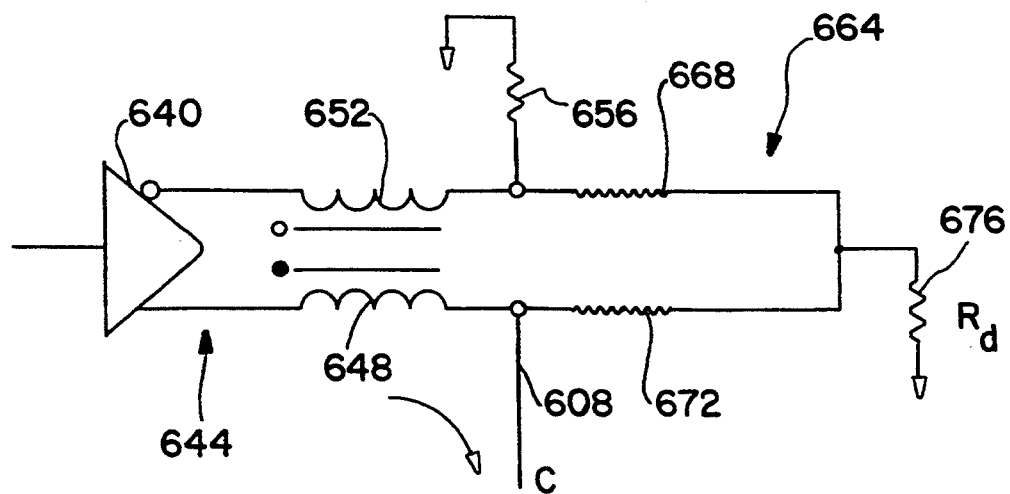
FIG. 24 is a circuit schematic that is similar to FIG. 22 and illustrates the inputting of a TDR test signal into the cable conductor.
Figure 25:
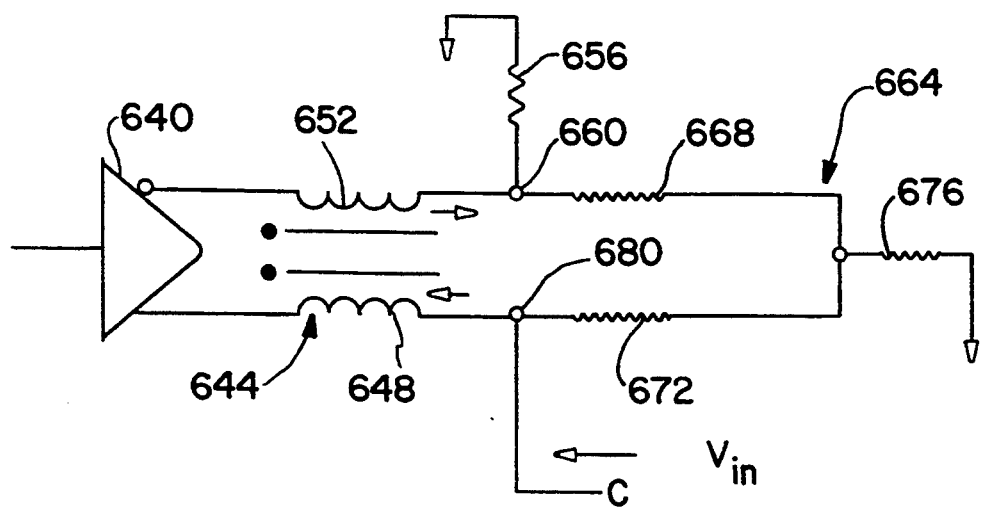
FIG. 25 is a circuit schematic that is similar to FIG. 24, and illustrates the return of a reflected pulse indicative of a fault along the cable conductor.

With respect to analyzing the general case when a cable fault exists at some location along the length of the cable conductor C, reference is now made to FIGS. 24 and 25. When a pulse is received from the pulse generator 600, at time $t=0^+$, the transmitter/receiver 604 is represented in FIG. 24. At this point in time, the first output line from the driver 640 changes logic state. In accordance with one embodiment, the change in state is from a logic low to a logic high. In one embodiment, the logic high=5 v and the logic low=0 v. Conversely, the second output changes state to a logic low. The logic high is applied to the first inductor 648 and generates a current and a logic high is applied to the cable conductor C, which results in the transmission of the transmit pulse along the cable conductor after transmission through the transmit/receive line 608. At this time also, the same quiescent or DC voltage is applied to the detecting resistor ($R_d$) 276 as is applied when no pulse is being transmitted by the transmitter/receiver 604. In the embodiment in which the logic high level is 5 v and the resistors 668, 672, 676 all equal 10k ohms, the DC voltage at $R_d = 1.67$ v.

Referring to FIG. 25, the transmitter/receiver 604 acts as a receiver when a return pulse is received. The return pulse was generated at some point along the length of the cable conductor C because of some cable conductor fault. As indicated in FIG. 25, the return pulse has an amplitude corresponding to $V_{in}$. When received, this AC signal amplitude is applied to node 680 causing the voltage at this node to increase. When this node voltage increases, a voltage is impressed across the first inductor 648. This voltage generates a current through the first inductor 648 in the direction shown in FIG. 25. Because the balun device 644 acts as a common mode choke, a current will also be generated in the second inductor 652 in the direction illustrated in FIG. 25. Accordingly, the balun device 644 converts the received or balun signal into a common mode signal. The common mode signal is applied to the resistive network of FIG. 23A. That is, this common mode signal is essentially applied to a voltage divider network and an AC voltage is thereby applied across the detecting resistor ($R_d$) 676. The voltage across $R_d$ is a function of the amplitude of $V_{in}$ and the values of the resistors 668, 672, 676. This increased voltage across the resistor $R_d$ is sent to the comparator 616. As previously described, the output of the comparator 616 changes state, provided its input exceeds the predetermined threshold, and the turning on of the comparator 616 is sensed by the field programmable gate array 160 and the dual slope interpolation circuit 462 for use in determining the location along the cable conductor C at which the return pulse was generated, which corresponds to the location of a cable fault.

In connection with using the magnitude or amplitude of the return pulse to provide information about the type of cable fault, a reflection coefficient rho ($\rho$) is described. The term $\rho$ is well known in transmission line technology and is defined as follows:

$$-1 \leq \rho = (Z_0 - Z_s)/(Z_0 + Z_s) \leq 1$$

where $Z_0$ = the impedance at the point of reflection in the cable conductor and $Z_s$ = the impedance of the cable conductor prior to the point of reflection.

In ascertaining cable faults, the amplitude of the return signal or pulse is analyzed. When the amplitude of $V_{in}$ substantially corresponds to that of the transmit pulse, the impedance $Z_0 = \infty$. This corresponds to an open circuit in the cable conductor at the location at which the return pulse was generated. In such a case, $\rho = 1$. In the case of a short circuit present in the cable conductor, $V_{in}$ substantially corresponds to a negative of the amplitude of the transmit signal and $\rho = -1$. In a case in which $V_{in}$ is different from the amplitude of the transmit pulse, this is an indicator that the table fault is not an open or short circuit. When $V_{in}$ substantially corresponds to one-third the amplitude of the transmit pulse, this may indicate that there are two cable conductors in parallel. That is, at the particular location at which the return pulse is generated, there is a likelihood that, instead of a single cable conductor present and continuing from that location, there is another cable conductor electrically connected thereto. In such a case, the amplitude of the return pulse $V_{in}$ corresponds to one-third the amplitude of the transmit pulse.

In a preferred embodiment, the FPGA 160 is also useful in determining the location of one or more cable faults that are located downstream of a first cable fault. In that regard, more than one cable fault may exist and these faults may be of a greater or lesser degree thereby generating reflective pulses of different amplitudes. For example, if a smaller magnitude fault is present downstream from a greater magnitude fault, unless the greater magnitude fault is compensated for or otherwise masked, no detection of the smaller magnitude fault can occur. In particular, for a predetermined threshold that will enable the smaller magnitude fault to fire the comparator 616, this same predetermined threshold will also cause the comparator 616 to fire when an input is received thereto representative of the greater magnitude fault. It would be desirable therefore to be able to detect the smaller magnitude fault without having the first, greater magnitude fault being the trigger that causes the coarse counter unit 632 to discontinue counting. A masking device 682 is provided in the control logic 628 for maintaining the counting of the coarse counter unit 632 even though a first cable fault is detected upstream of the smaller magnitude cable fault. Such a masking device 682 can include And gate logic in which one of the inputs is the output of the coarse counter unit 632 and another input is the output from the comparator 616. The output of this And gate logic is used in controlling or stopping the counting of the coarse counter unit 632. That is, unless the count of the coarse counter unit 632 has reached a predetermined number of counts, corresponding to a predetermined length of the cable conductor C, it continues to count, regardless of whether or not the output of the comparator 616 has changed its state. However, when the count of the coarse counter unit 632 exceeds a predetermined count and the comparator 616 has fired, the output of this And gate logic causes the coarse counter unit 632 to discontinue counting and this count information is utilized in determining the location of a downstream cable fault. By way of example, if a first cable fault at a point 30 feet along the cable has a relative magnitude of 10 units and a second cable fault downstream therefrom at 50 feet has a cable fault of a relative magnitude of one unit, the masking device can receive as one of its inputs a count value corresponding to 40 feet of cable. In such a case, the first cable fault is masked because it occurred upstream of the requirement that the cable fault occur greater than 40 feet along the length of the cable. The coarse counter unit 632 would continue to count, regardless of the change in state of the comparator 616 due to the first cable fault. Upon receipt of a return pulse indicative of the second cable fault having the relative value of one unit, because the predetermined threshold would be set to a value less than one unit, the comparator 616 would again fire. In this case, because the And gate logic is satisfied based on the count input greater than a count corresponding to 40 feet of cable, the control logic 628 would cause the coarse counter unit 632 to stop counting and subsequent determinations would be made as to the precise location of this second cable fault.

An important aspect of the transmitter/receiver 604 relates to its ability to identify a fault at the connector end CE of the cable conductor C. The connector end CE is connected to the testing apparatus 100, except where a patch cable for achieving necessary mating of cables is required. Regardless, any such intermediate or patch cable is at least less than twenty feet. When such a fault exists, the transmit pulse and the return signal occur virtually simultaneous, i.e, the return pulse is received by the transmitter/receiver 604 substantially instantaneously after the transmit pulse is inputted to the cable conductor C at its connector end CE. In prior art systems, it is usual to turn off the receiver section of the transmitter/receiver while the transmit pulse is being sent. Because the transmit and return signals are generated at substantially the same time in the case of a connector end CE fault, there is no opportunity to turn off and/or decouple the transmitter and turn on and/or couple the receiver. As a result, a return pulse is not detected. To overcome this problem, it is common in the prior art to provide an intermediate cable between the connector end CE and the transmit/receive line 608. The length of this intermediate cable can be 20 feet or more. The intermediate cable enables any fault at the connector end CE to be detected since the receiver can be turned on prior to the return of any pulse representative of fault at the end CE of the cable conductor C.

Figure 26:
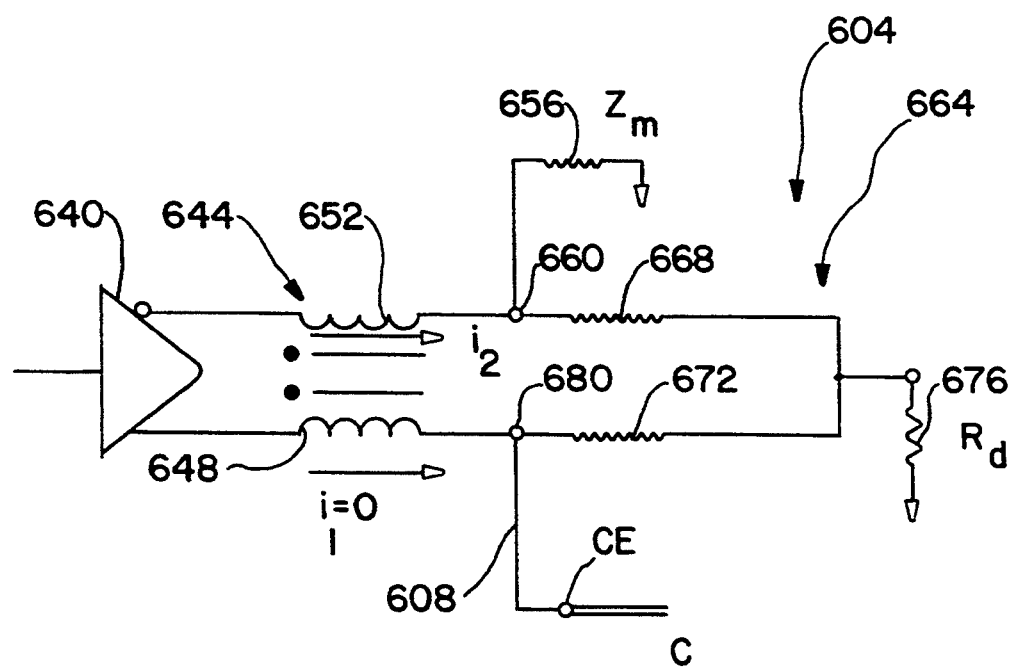
FIG. 26 is a flow diagram illustrating steps related to the determination of the presence of returned phase jitter test data using a state machine.

The transmitter/receiver 604 is able to detect faults at the connection end CE without the use of any additional or intermediate cable since it is configured as a directional coupler. In analyzing the operation of the transmitter/receiver 604 when a fault exists at the connector end CE, reference is made to FIG. 26. At time $t=0^+$, a transmit pulse is applied to the cable conductor C. To facilitate the analysis, assume this pulse has an amplitude of 5 v. At the time the 5 v pulse is initially applied to the open circuit at the connector end CE and the amplitude of the signal applied to the second inductor 652 changes from 5 v to 0 v, a current $i_2$ (see FIG. 26) is flowing through the second inductor 652 of the balun device 644. Because there is an open circuit and the impedance is infinite, the value of the current $i_1$ (see FIG. 26) associated with the first inductor 648 tends to go to 0. However, because the current through an inductor does not change instantaneously, the current $i_2$ continues to flow through the second inductor 652 of the balun device 644 in the same direction that current was to flow through the first inductor 648, as illustrated by the direction of the arrow in FIG. 26. Because the current $i_2$ is not supported by the 0 volts present on the driver 640 output to which it is connected, the voltage across the second inductor 652 will increase to support this current. Because all of the current that was generated is now flowing through the second inductor 652 of the balun device 644, the voltage at node 660 is equal to 5 v. As illustrated in FIG. 26, the dot end of the leg of the transformer having the second inductor 652 is 5 v below the voltage at the dot end of the first inductor 648. In accordance with transformer principles, the voltage at the node 660 should therefore be at 5 v below the voltage at node 680. Consequently, the voltage at node 280 equals 10 v. This corresponds to a 5 v common mode signal applied to the resistor circuitry illustrated in FIG. 23A. Because of the application of this AC common mode signal, the voltage across the detecting resistor ($R_d$) 676 will increase and this signal will be applied to the comparator 616. The predetermined threshold can be set at a selected value that causes the comparator 616 to fire or turn on when a voltage level is reached corresponding to an open circuit at the connector end CE. This change in state by the comparator 616, together with lack of any time delay between transmit and return signals as determined by the FPGA 160 and the dual slope interpolation circuit 462, is indicative of a fault at the connector end CE of the cable conductor C.

Figure 27:
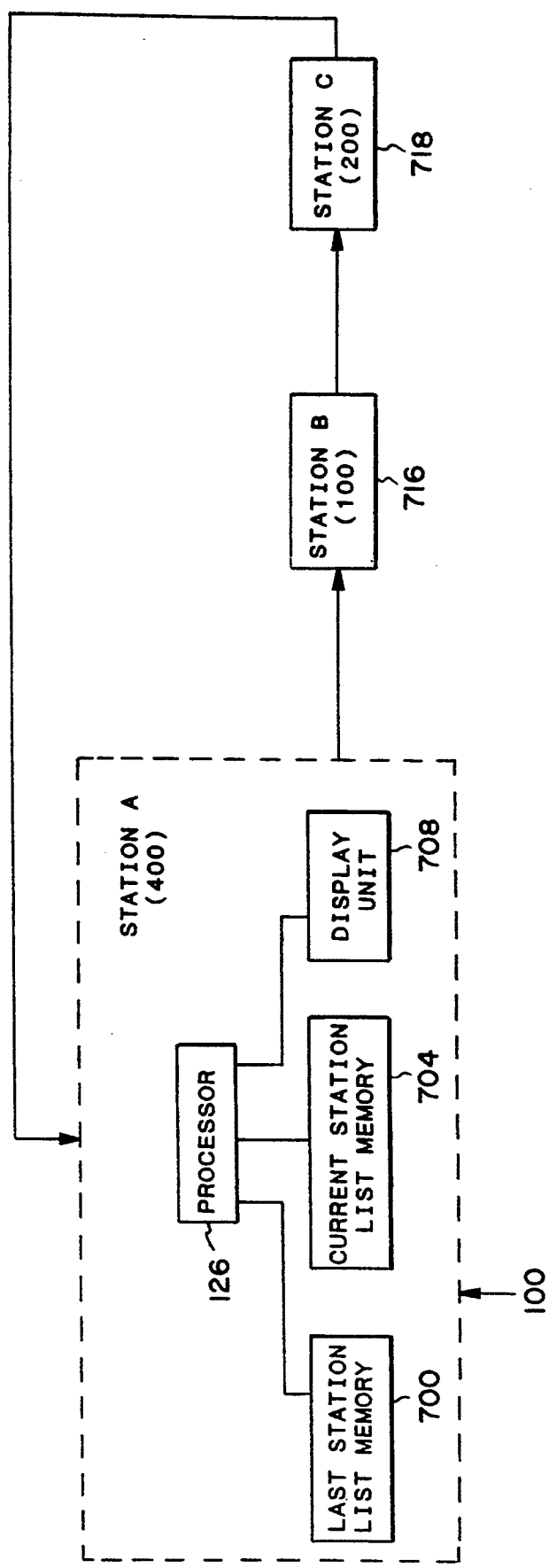
FIG. 27 is a block diagram illustrating hardware used in monitoring station history in the token ring.

With reference to FIG. 27, in connection with determining or isolating faults on the token ring 104, the insertion capability of the testing apparatus 100 is useful in obtaining and storing token ring status information. Such information can be worthwhile in ascertaining or isolating faults in the token ring. Generally, for each station in the token ring, such status information includes: whether it has left the token ring and returned, whether it entered the token ring after a measurement was started, whether it has left the token ring and whether it has been continually present on the token ring since the beginning of the measurement. In known prior art testing devices, address information is stored for stations that are currently part of the token ring. However, no other historical or status information is provided.

In monitoring stations on the token ring, existing 802.5 media access control (MAC) protocol for the token ring is utilized. In particular, such protocol includes a neighbor notification process that is initiated at regular intervals, with every seven seconds being the default time. The neighbor notification process allows each station that is active on the token ring to determine its nearest active upstream neighbor (NAUN). Each station on the token ring stores its own address (source address), as well as the NAUN address. The stored NAUN address is useful in diagnosing faults in the token ring. If a particular station stops receiving data, the assumption is that the token ring is "broken" and this particular station is not communicating with its NAUN station. After a predetermined short period of time, this particular station will initiate the constant repetition of a beacon frame that contains its source address and its NAUN address. Diagnostic instruments receiving such a special frame commonly use this information to at least initially focus troubleshooting efforts to the part of the token ring that involves the particular station and its NAUN station.

In making station address information available for stations currently on the token ring, the MAC protocol includes having the active monitor station initiate the neighbor notification or ring polling process. The active monitor station performs this function at a fixed time interval by sending a frame identified as an active monitor present (AMP) frame around the token ring. The AMP frame includes the active monitor station's source address, together with the NAUN address. The first station downstream of the active monitor station will receive the AMP frame and change a bit therein to indicate that this frame has been copied by the first station. This first station from the active monitor station will also record the source address contained in the AMP frame thereby identifying the address of its NAUN. This AMP frame continues around the token ring. Because of the bit change made by the first station from the active monitor station, the remaining stations on the ring do not copy this AMP frame since the bit change indicates to the remaining stations that one station already has copied the AMP frame. After passing around the ring, the AMP frame eventually returns to the active monitor station. The active monitor station removes this AMP frame from the token ring and issues a new token. This new token enables the first station to issue a standby monitor present (SMP) frame. This SMP frame passes to the next station downstream of this first station. As before, the source address of the station sending the SMP frame is recorded by this next station thereby identifying the NAUN of the next station. The predetermined bit in the SMP frame is also modified so that no further downstream station will copy the source address in the SMP frame. This SMP frame eventually reaches the originating station thereof, where it is removed from the token ring and a new token released by the next standby monitor station in the token ring. This process continues in the foregoing manner until the active monitor station receives a SMP frame or an AMP frame that has not had its copy bit changed, which indicates that there are no stations upstream of the active monitor station that have not recorded their NAUN address. In such a case, the active monitor station records the source address of this last frame and the neighbor notification process is completed.

In using this information made available by standard MAC protocol, FIG. 27 diagrammatically illustrates parts of the testing apparatus 100 connected to a representative token ring having two stations for use in obtaining and using station status information based on the addresses of the token ring stations. As illustrated in FIG. 27, the testing apparatus 100 includes a last station memory list 700 that contains addresses of all stations that were present in the token ring during the previous neighbor notification process. A current station memory list 704 is also provided and contains the addresses of all token ring stations that are present during the current neighbor notification process. Preferably, the station addresses in the current station memory list 704 correspond to those stations present in the token ring for the neighbor notification process that is initiated immediately after the neighbor notification process that resulted in the obtaining of the token ring station addresses presently in the last station memory list 700. By maintaining two lists of station addresses, history or status information related to stations on the token ring can be deduced.

Such status information can be defined as including four states. These four states related to station status are displayable on a display unit 708. In one embodiment, for each active station on the token ring, the display unit 708 displays its address and a state character (one of four status states) that is indicative of station status or history information, together with an active monitor indication that indicates which of these stations is the active monitor. A symbolic name for each station may also be displayed. With respect to the four state characters, they are identified as follows:

(1) state character=(blank) (present): a blank or the absence of a state character indicates that the station has been continually present on the token ring since the beginning of the measurement.

(2) state character=! (new): this indicates that the station has entered the ring at some time after the beginning of the measurement but has been present continuously since that time.

(3) state character=? (gone): this indicates that the station has been in the ring for at least one neighbor notification process but is no longer in the ring.

(4) state character=* (return): this indicates that the station had been in the ring, left the ring and returned at least once since the beginning of the measurement and is also currently in the ring.

In connection with making the determinations and storing station addresses in the last station memory list 700 and the current station memory list 704, the processor 126 of the testing apparatus 100 is utilized. The processor 126 communicates with the memory lists 700, 704, as well as updating station status information displayed on the display unit 708. The processor 126 is involved in executing software related to making decisions for updating the memory lists 700, 704. The processor 712 receives station address information from the frames that are transmitted around the token ring, such as the token ring illustrated in FIG. 27 having, as an example, two stations 716, 718.

Figure 28A:
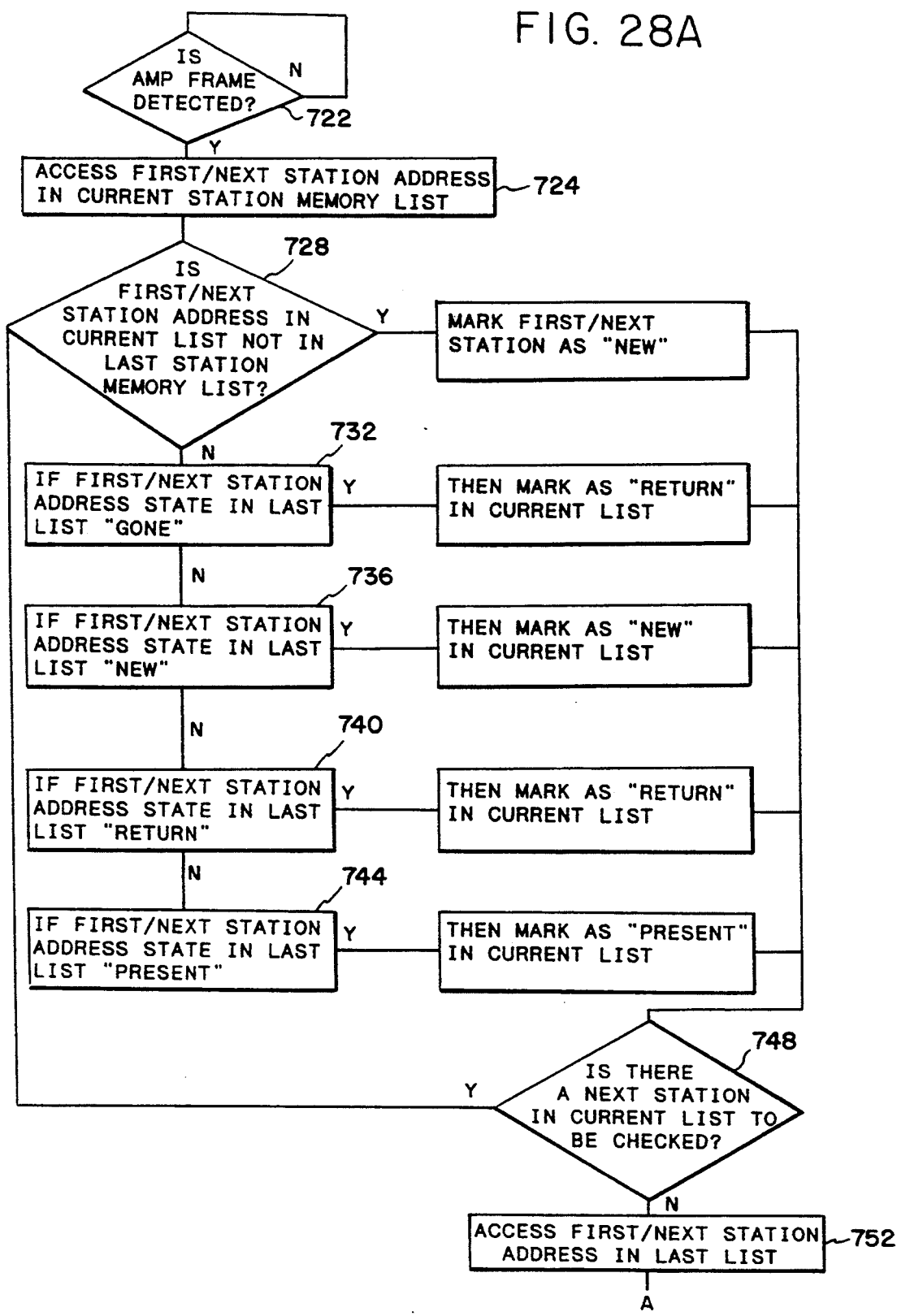
FIGS. 28A–28B constitute a flow diagram illustrating steps conducted by the testing apparatus in determining the status of active stations on the ring.
Figure 28B:
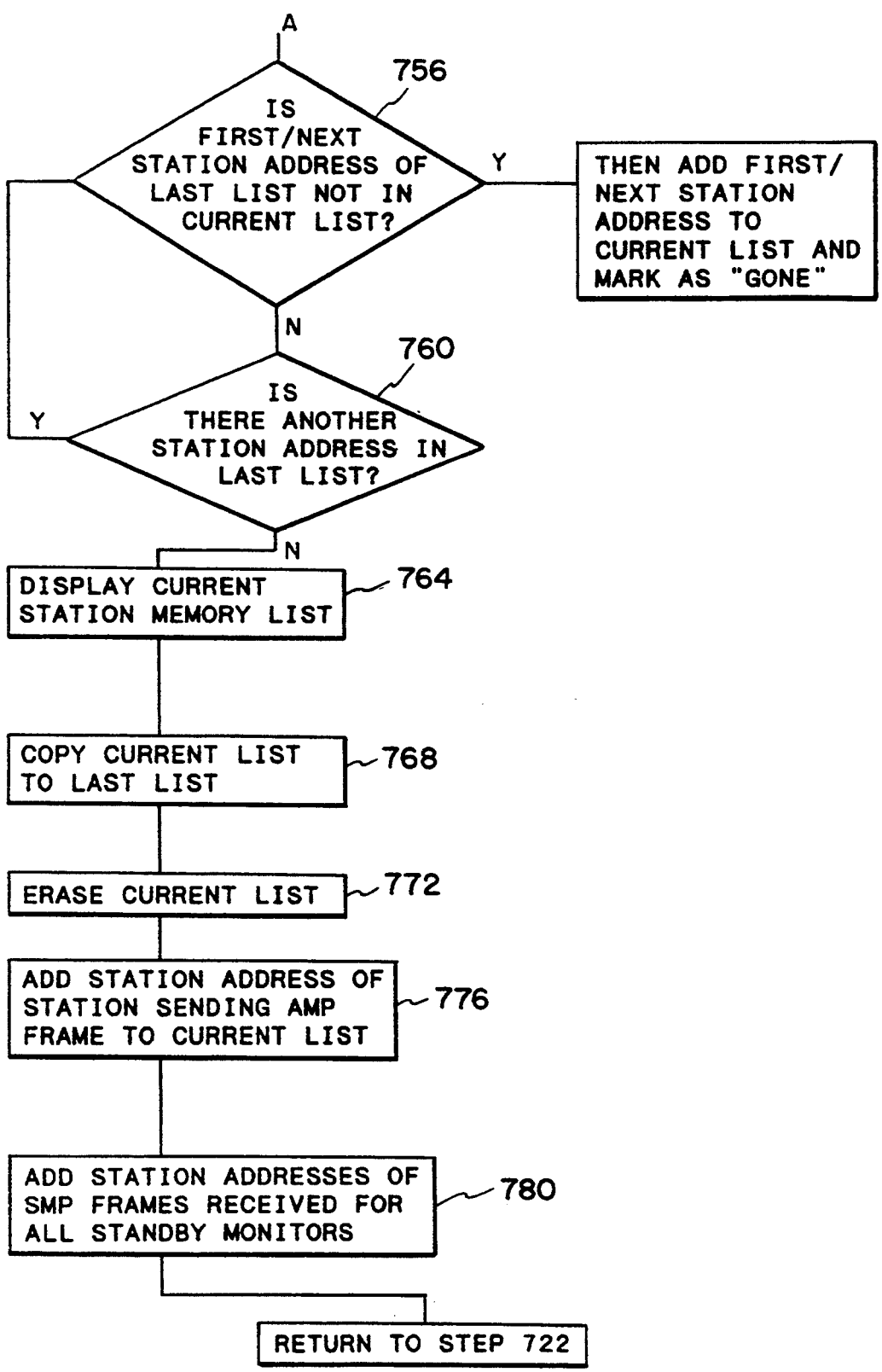

In describing the determination of each state character for each station in the token ring, reference is made to the flow diagrams of FIGS. 28A-28B, as well as the token ring station history illustrated in FIGS. 29A-29D and the status information stored in the last and current station memory lists 700, 704, as illustrated in FIGS. 30A-30E, as a result of the changes in the token ring stations. The testing apparatus 100, once inserted into the token ring, also acts as a station. In this example, the testing apparatus 100 is also defined as stationA.

Initially, at time $t_m$ during a measurement M, assume that the state of the token ring stations is that of FIG. 27 with stationA (testing apparatus 100) being the active monitor and stationB 716 and stationC 718 being standby monitors. It should be understood that the testing apparatus 100 need not be the active monitor in order to determine status information. Also assume that stationA has initiated a neighbor notification process by transmitting an AMP frame to downstream stationB 716. Upon receipt of the AMP frame, stationB 716 will store the NAUN address of stationA. In this example, stationA has an address of 400. StationB 716 will change a predetermined bit in the AMP frame and send the frame to the next station in the ring, namely stationC 718. StationC 718 will determine that this pro,determined bit has been set and will not record the source address of stationA. StationC 718 will send the AMP frame to the next station in the ring, namely stationA, which is the testing apparatus 100. StationA removes this AMP frame from the token ring and issues a new token. This new token enables stationB 716 to issue an SMP frame. This SMP frame passes to stationC 718. The source or station address of stationB 716 is recorded by stationC 718. In this example, stationB 716 has an address of 100. As before, this SMP frame will be transmitted back eventually to the originating stationB 716, where it is removed from the token ring and a new token released to the next standby monitor station in the token ring, namely stationC 718. A release of this next token allows stationC 718 to issue its SMP frame which then allows the next downstream station, namely the testing apparatus 100 (stationA), to store the source address of stationC 718. In this example, stationC 718 has an address of 200. Upon receipt of this SMP frame by the active monitor, the neighbor notification process is completed.

Figure 29A:
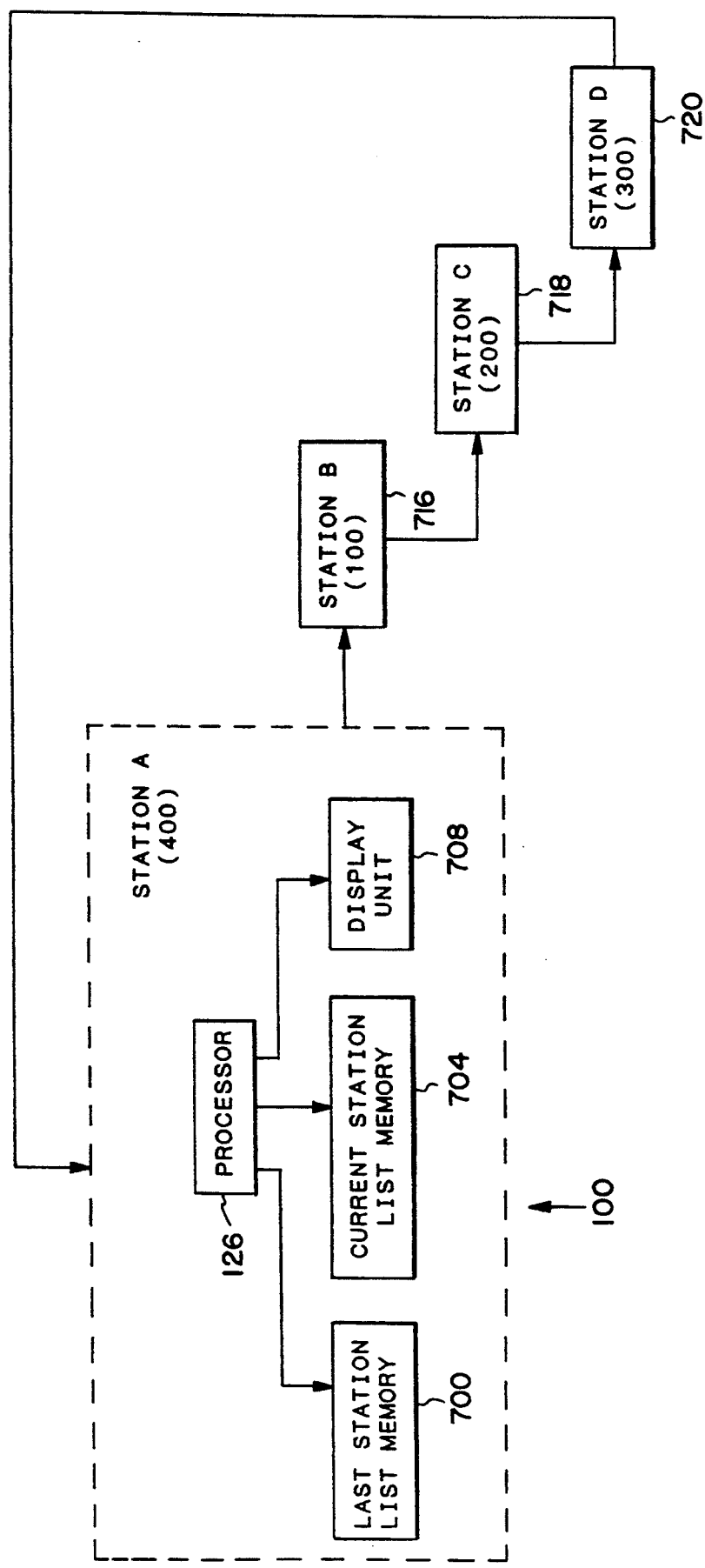
FIGS. 29A–29C are block diagrams illustrating at different times during a particular measurement the identification of active stations on the ring.

Assume now that after the last SMP frame is received by the testing apparatus 100 (stationA) and before the generation of the next AMP frame, a new stationD 720, having a source or station address of 300, is inserted into the token ring, as illustrated in FIG. 29A. When the next AMP frame is generated and detected at step 722 of FIG. 28A, a first station is accessed in the current station memory list 704 at step 724. At step 728, a determination is made as to whether the first station in the current station memory list 704 is not in the last station memory list 700. In making this determination or comparison, the current stations are those stations whose addresses were obtained during the just completed neighbor notification process. In this example, they are the addresses of 400, 100 and 200 of stationA, stationB 416 and stationC 418, respectively. With respect to the stations in the last station memory list 400, they are identified in FIG. 30A. These stations are designated in the column identified as "last" and indicate the previous status information of the stations in the token ring, including the correct state character. In this example, each of the addresses is marked with a "blank" state character indicating that each of these stations has been continually present on the ring since the beginning of the measurement M.

Keeping in mind which stations were a part of the previous neighbor notification process and that stationD 720 did not enter the ring until after this process was completed, the determination of station status information continues as follows. For the first station in the current list, namely stationA, it is ascertained, at step 728, that this station is identified in the last list of FIG. 30A. Since stationA having address 400 is in the last list, each of steps 732, 736, 740 is conducted and, in each case, a negative determination is made. At step 744, it is determined that stationA was present since the beginning of the measurement and therefore the current list of FIG. 30B for stationA is indicated as including station address 400 with the "blank" state character indicating that this station has been "present." At step 748, a determination is made that there is a next station to be analyzed. Consequently, a return is made to step 724 and steps 724-748 are executed for stationB 716 and then for stationC 718 resulting in the inclusion of station addresses for each of these stations in the current list of FIG. 30B. Each of these two stations also has the "present" mark or blank character since they have been present since the beginning of the measurement.

Since there are no more stations in the current list of FIG. 30A (stationD 720 was not added to the token ring until after the completion of the last neighbor notification process), the step at 752 is next initiated in which the first station in the last station memory list 700 is accessed. At step 756, a determination is made as to whether this station is not in the current station memory list 704. In accordance with the foregoing example, stationA having station address 400 in the last list of FIG. 30A is checked or compared with the station addresses of the current list, which is illustrated in FIG. 30B. A determination is made that there is a correspondence between stationA (testing apparatus 100) in the current and last lists. At step 760, a check is made that there is another station in the last list 700. Consequently, for each of stationB 716 and stationC 718, a return is made to step 752. Upon return, in each case, a determination is made that there is a correspondence between the current and last list for each of these two stations. When there is no further station in the last list of FIG. 30A to be checked, at step 764, the current measurement or determination associated with station status is displayed on display unit 708 using the information in the current list of FIG. 30B. At step 768, the current list of FIG. 30B is copied into the last list with this copying being reflected in the last list of FIG. 30B. At step 772, the contents of the current list of FIG. 30B is erased. At step 776, the station or source address of the AMP frame is added as the first station of the next current list. In this case, the erased current list now includes the station address of 400 for stationA (testing apparatus 100). In accordance with step 780, for each of the standby monitor stations presently in the token ring, the station having the source address associated with the SMP frame is also added to the current list 704. In the case of the present example, the address for each of stationB 716 and stationC 718 is added to the current list. Additionally, because of the added stationD 720 having source address 300, when its SMP frame is received by the testing apparatus 100 (stationA), this station is included in the current list. This current list of stations at the completion of step 780 for all standby monitors is illustrated in FIG. 30C, with subsequent steps to be executed for the purpose of determining the correct state character that is to accompany each such address in the current list 704.

Figure 29B:
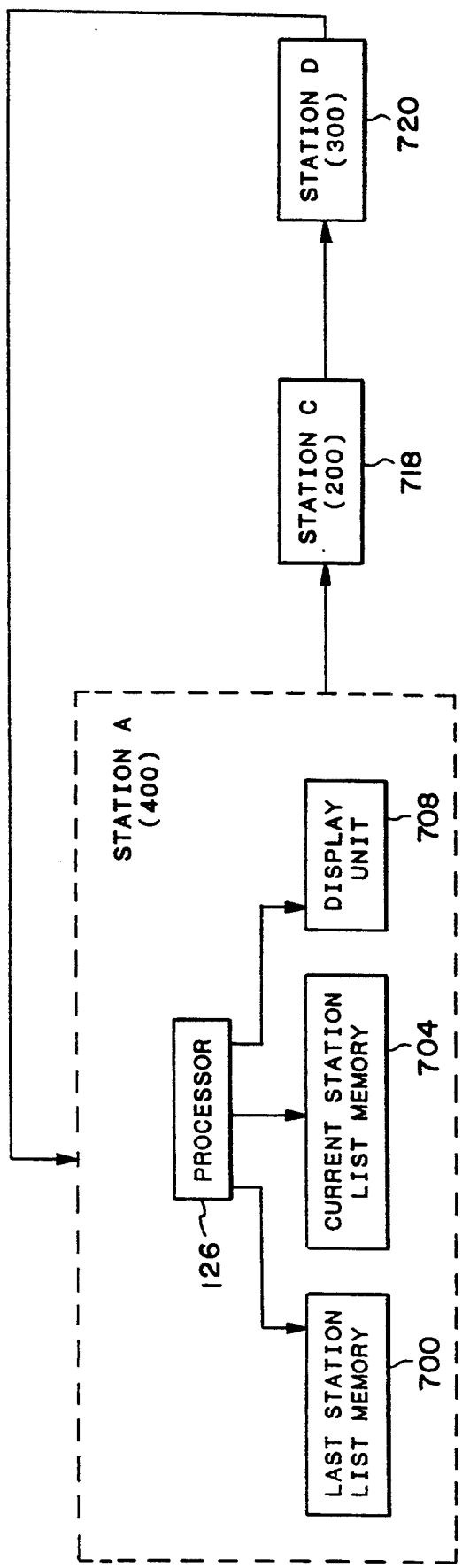

Assume now that stationB 716 having a station address of 100 leaves the token ring after the generation of the current list of FIG. 30C but before the next AMP frame is received. This event is illustrated in FIG. 29B. When the next AMP frame is received, the steps 722–780 are once again executed. At step 722, the AMP frame is detected. At step 724, a first station in the current list is accessed. With regard to steps 724–748, they are conducted as before with respect to all of the stations. In each case, the station source address for such stations is part of the updated current list and, after comparison with the last list, each static, n address is also marked with the correct state character, as reflected in FIG. 30C. When a comparison is made at step 728 between stationD 720 having source address 300 with, the station addresses in the last list of FIG. 30C, a determination is made that this is a "new" station and, in accordance with step 728, stationD 720 is marked in the current list of FIG. 30C with the (!) state character indicating that it is a new station.

Upon completion of steps 724–748 and, subsequently, steps 752–760, the updated and current station memory list 704, as illustrated in the current list of FIG. 30C, is displayed using the display unit 708, in accordance with step 764.

Continuing with steps 768–780, the new last list is generated and the previous current list is erased, as well as the source address of the AMP frame being written in the previously erased current list. Similarly, when each SMP frame is received, the current list is updated with the address information for each standby monitor that is present in the token ring. In this example, stationA 100, stationC 718 and stationD 720 are included in the current list, when their respective SMP frames are received. However, because stationB 716 having source address 100 left the token ring, there is no indication in this next current list of stationB.

Figure 29C:
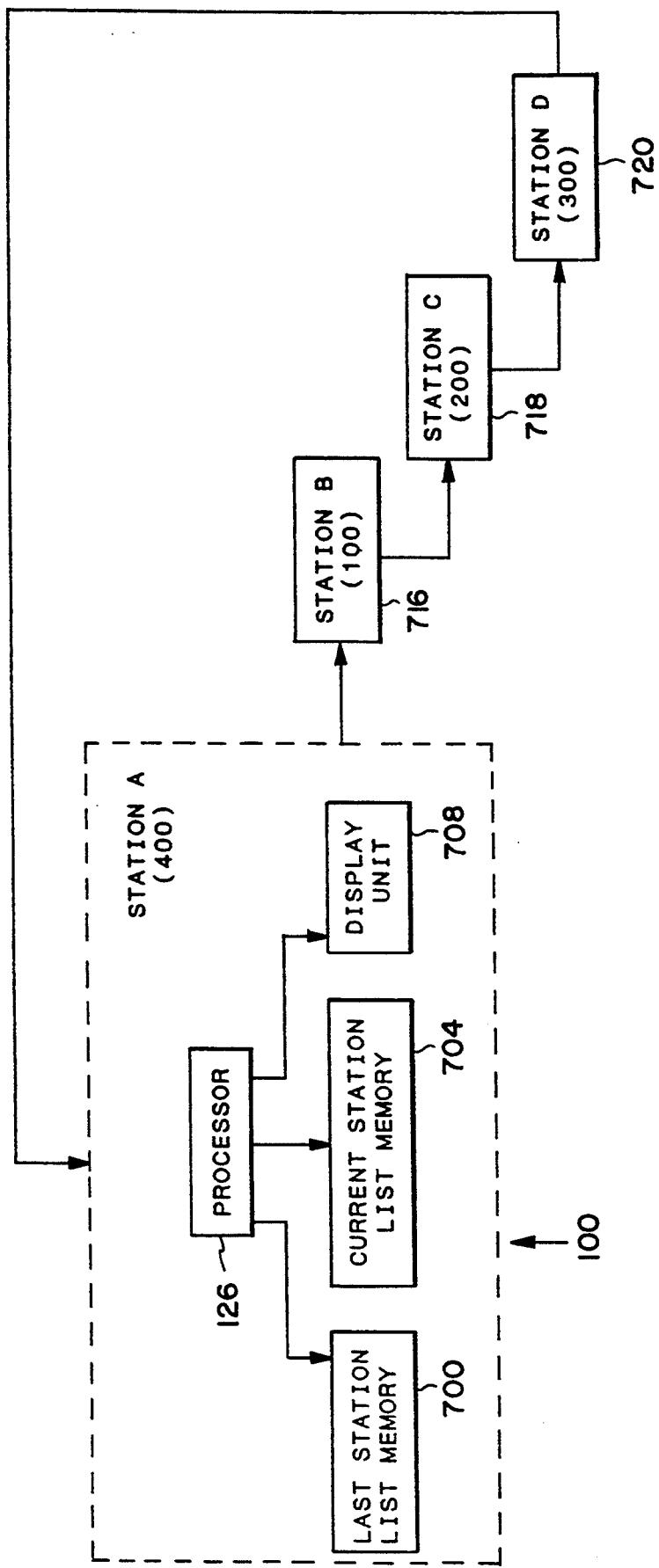

With reference to FIG. 29C, assume now that stationB 716 returns to the token ring after the last neighbor notification process but before the next AMP frame is generated. When this next AMP frame is detected at step 722, steps 724–748 are conducted, as before, using the station information contained in the current list, which is based on source addresses included in the current list when the latest AMP and SMP frames were generated. Based on such comparisons, since stations 100, 718, 720 maintain their current status, the addresses and state characters illustrated in FIG. 30D are the same as those illustrated in FIG. 30C for these three stations. When steps 752–760 are conducted, a determination is made that, in comparing stationB 716 in the last list, there is no corresponding station in the current list. In accordance with step 756, stationB 716 having source address 200 is added to the current list with the state character notation (?) for "gone" being included with this address. When step 764 is next executed, the current list of FIG. 30D is displayed on the display unit 708.

In continuing the performing of steps of 768–780, the current list is updated upon receipt of the SMP frames, as well as being updated with the source address of the station transmitting the AMP frame. Continuing with the present example, the current list includes stationA 100, stationC 718 and stationD 720, as well as the returned stationB 716. Upon receipt of the next AMP frame, each of these station addresses is compared with address information in the last list, which is illustrated in FIG. 30D. With respect to stations 100, 718, at step 744, determinations are made that each of these stations was present in the last list. Hence, as indicated in FIG. 30E, each of these stations is included in the current list with the state character for "present," namely a "blank." Similarly, for stationD 720, at step 736, a determination is made that this station was new in the last list. StationD 720 is therefore included in the current list with the state character for "new" (!). With respect to stationB 716, at step 732, a comparison is made with the information for this station in the last list and a determination is made that this station was previously gone or left and has now returned. That is, stationB 716 of the last list of FIG. 30E is marked with (?), indicating that it has left the token ring. However, the current list includes the address for stationB 716. Thus, in accordance with step 732, the current list includes the (*) state character accompanying the source address for stationB 716. After conducting all the steps of 724–756 for this particular measurement the results of FIG. 30E for the current list can next be displayed on the display unit 708 illustrating the current status of the stations in the token ring.

From the information provided in the current list of FIG. 30E, the following information can be deduced: stationA 100 and stationC 718 have been continually present in the token ring since the beginning of the measurement. StationB 716 was in the token ring but then left and subsequently returned at least once since the beginning of the measurement and is currently in the ring. StationD 720 entered the token ring some time after the beginning of the measurement but has been present continuously since that time.

It should also be appreciated from the foregoing that, when first beginning a measurement, in determining the state characters for the stations in the token ring, such stations should not be designated with the new (!) state character. In accordance with the steps of FIGS. 28A–28B, if such steps were applied at the beginning of a measurement, the stations in the ring would be designated with the new (!) character. Since they should be identified with the present character (blank), the steps of FIGS. 28A–28B relating to the determination of a "new" station are not applicable during the initial measurement or determination steps involving the first two neighbor notification processes.

It should be appreciated that other status information could be obtained in accordance with the principles of this aspect of the invention. For example, instead of only indicating that a particular station has been gone from the token ring for at least one neighbor notification process, the steps of FIGS. 28A–28B could include further steps to be executed that monitor and display the number of times that a given station has been gone from the ring. Similarly, further information could be gathered indicating the number of times that any given station has left and returned to the token ring since the beginning of the measurement.

Figure 31:
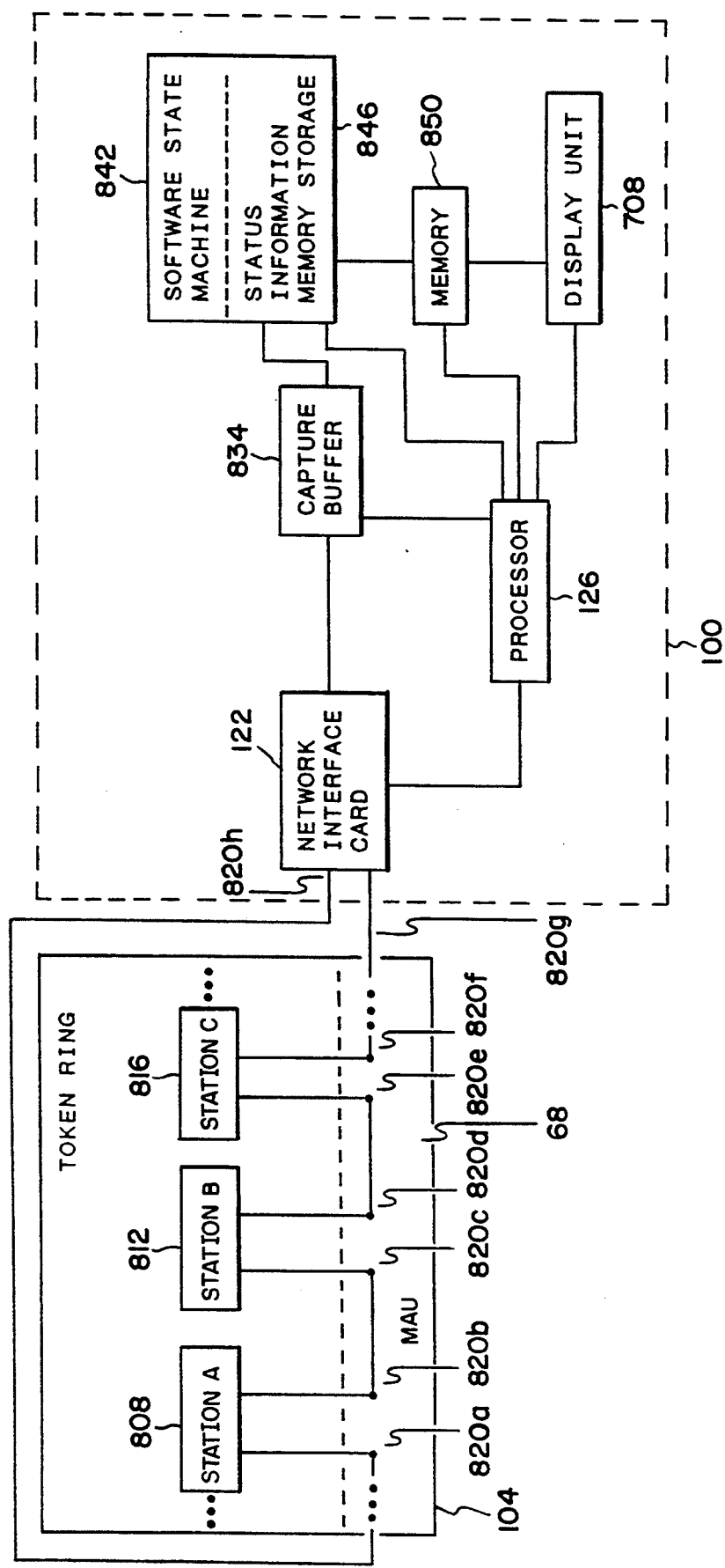
FIG. 31 is a block diagram illustrating hardware of the present invention used in storing beacon domain information from an originating station while ignoring other beacon domains including phantom domains.
Figure 32:
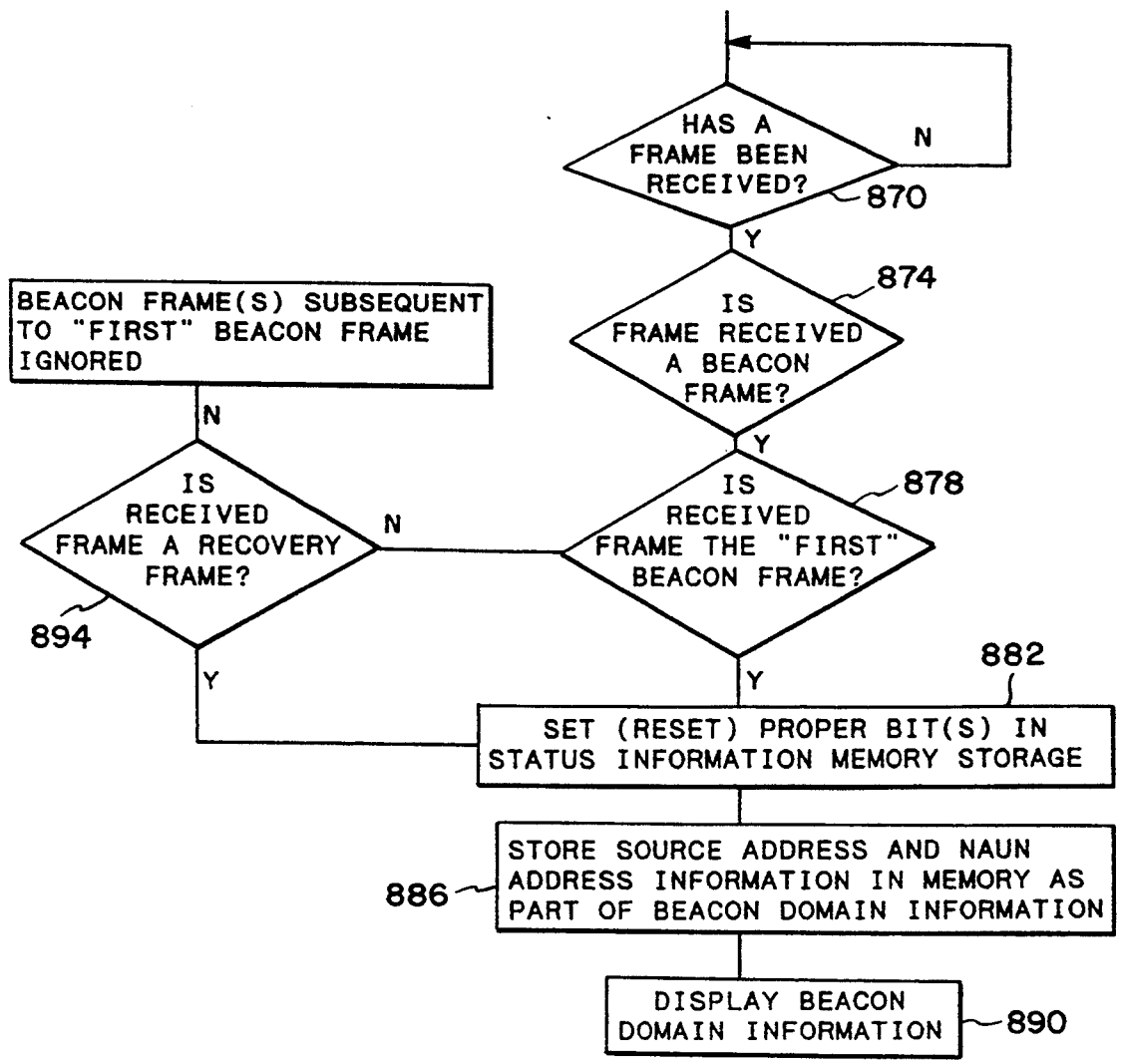

Referring now to FIGS. 31 and 32, the testing apparatus 100 also includes hardware and software for reporting errors or faults that occur on the token ring 104, while the testing apparatus 100 is inserted in the token ring 104. The errors are reported by storing address information from a beacon frame that is related to the location or domain of the fault, while ignoring fake domain information in other beacon frames.

Regarding FIG. 31, the token ring 104 is diagrammatically illustrated. In addition to the media access unit (MAU) 68 for use in enabling the stations on the token ring 104 to communicate with each other, three representative stations 808, 812, 816 are also diagrammatically illustrated. Conductor cables 820 are depicted between each of the stations 808–816 and the MAU 68. Each station has a transmit/receive pair of conductor cables connected between the station and the MAU 68 with conductor cables 820*a*, 820*c*, 820*e* being the receive cables and conductor cables 820*b*, 820*d*, 820*f* being the transmit cables for the respective stations 808, 812, 816. Upon insertion, the testing apparatus 100 is also part of the token ring 104 and has a receive cable 820*g* and a transmit cable 820*h*.

With respect to a description of the problem that is addressed, assume that the receive path in the MAU 68 for stationB 812 experiences a fault, such as a stuck MAU port or an internal MAU fault. In accordance with token ring media access control (MAC) protocol, a beaconing process is initiated to enable the ring 104 to recover from such a hard failure. The failure, in the present example, of the receive path in the MAU for stationB 812 will cause stationB 812 to detect a signal loss since it is no longer receiving signals from stationA 808 because of the faulty receive path. StationB 812 will begin transmitting frames identified as beacon frames. Each beacon frame includes the source address of the station detecting the signal loss and the address of the nearest active upstream neighbor (NAUN). In this case, these addresses will be those of stationB 812 and the NAUN stationA 808. The beacon frame also includes information that identifies the "type" of beacon frame. A type 2 beacon frame indicates a signal loss to the detecting station. A type 3 beacon frame includes information indicating that the frame is a streaming beacon frame.

With regard to the signal loss fault and the transmission of a type. 2 beacon frame, when received by other stations on the token ring 104, each will be notified that a serious problem exists and that no regular transmissions can take place. When stationA 808 receives a type 2 beacon frame, it removes itself from the ring 104 and performs a lob test. In this case, the lobe test passes and stationA 808 re-inserts itself into the ring 104. If the signal loss continues, then the originating stationB 812 of the type 2 beacon frame will take steps directed to having the token ring 104 recover from the fault. This is accomplished by stationB 812 removing itself from the token ring 104 and performing the previously described lobe test for testing the integrity of the lobe cable which connects the station to the MAU 68. If this test fails, the station stays out of the token ring 104 since the failure in the lobe cable was the probable cause of the signal loss condition, for example. If the station passed the lobe test, then the failure is determined not to be in the lobe cable and the station reinserts itself back into the token ring. Assume that a signal loss is due to a fault in the receive path in the MAU for stationB 812, not the transmit/receive conductor cables 820*c*, 820*d* of stationB 812, although the fault could be from another source. Consequently, stationB 812 passes its lobe test. If it had failed the lobe test, e.g., due to a break in its lobe wire, then stationB 812 would have stayed out of the token ring 104 since any failure of this test indicates that the lobe cable was the probable cause of the signal loss condition. If the lobe test passes, as in the present example, then the failure is not in the lobe cable of stationB 812 and it re-inserts itself back into the token ring 104. Because the signal loss would still be present, due to the faulty receive path in the MAU 68 for stationB 812, stationB 812 continues to detect a loss of signal and begins transmitting type 3 beacon frames until the fault is corrected.

In order to correct a streaming beaconing condition, it is necessary to know the location or domain of the faulty conductor cable so that it can be replaced or repaired. Information related to this condition is found in the contents of the beacon frame. The type 2 and type 3 beacon frames include the domain associated with the beaconing condition. This domain includes the two stations on either side of the suspected fault. In the present example, the type 3 streaming beacons sent by stationB 812 includes its own source address and the source address of its NAUN, which is stationA 808. If this information is provided, the faulty receive path in the MAU 68 problem can be isolated to stationA 808 and stationB 812, as well as the equipment that enables them to communicate with each other.

In obtaining and using such beacon information, a problem arises related to the generation of phantom or false domains. This extraneous information is produced by one or more other stations in the token ring when a station removes itself from the token ring to perform its lobe test or when powered off by a user. In accordance with the present example, because stationB 812 left the token ring 104 momentarily, this caused stationC 816 to time out. Because of this time out, stationC 816 begins sending a type 2 beacon frames with a new domain that included its station or source address and the address of its NAUN, which is stationB 812. This new domain is a phantom or false domain since the real problem is located between stationB 812 and stationA 808. The type 2 beacon frame and its accompanying information can lead to confusion in trying to isolate the fault being experienced by the token ring 104. Another source of phantom beacon domains can result from a station's monitor contention timer timing out due to not completing the monitor contention process, e.g., due to a signal loss error. If no claim tokens were received during the monitor contention process, then type 4 beacon frames are transmitted with a phantom domain. The monitor contention process relates to the establishment of a new Active Monitor station.

The testing apparatus 100, after insertion, communicates as a station with the token ring 104. The testing apparatus 100 receives the beacon frames generated by the stations when signal loss is detected. In the example described, the testing apparatus 100 will receive the type 2 and type 3 beacon frames from stationB 812 and the type 2 beacon frames from stationC 816. The information contained in these beacon frames can be provided to the user. However, in accordance with the present example, the type 2 beacon frames from stationC 816 tend to be confusing and may not be necessary to assist the user or network manager in isolating the problem that exists in the token ring 104. The testing apparatus 100 ignores certain beacon frames and stores or keeps track of those beacon frames that provide information useful in isolating the actual fault on the token ring 104.

The testing apparatus 100 includes the network interface card (NIC) 122 that communicates with the token ring 104 through its MAU 68. As previously described, the NIC 122 basically provides the interface and establishes proper compatibility between the token ring 104 and the testing apparatus 100 in connection with the transmission and receipt of frames relative to the token ring 104 stations. The NIC 122 is used in determining when a frame from the token ring 104 is received and for sending any such frame to a capture buffer 834 for temporary storage. The capture buffer 834 communicates with the testing apparatus processor 126. Under processor 126 control, frames from the token ring 104 are processed by a software state machine 842, which is useful in identifying the presence of a beacon frame and determining whether certain contents of the received beacon frame should be stored or ignored (not stored). The software state machine 842 is preferably code executed by the processor 126. The software state machine 842 includes an algorithm for checking a data field of the inputted or received frame. During this checking procedure, a determination is made as to whether such contents corresponds to a beacon frame. If a beacon frame is present, the data field of a beacon frame has predetermined information or data in accordance with MAC protocol. The software state machine 842 compares the data in the data field of the inputted frame with predetermined data that corresponds to a beacon frame. If a match or correspondence is present, it is determined that a beacon frame has been received. The software state machine 842 also determines whether this is the first or a subsequent beacon frame received since the last time there was a beaconing condition. In conjunction with this determination as to whether or not the inputted beacon frame is a first or a subsequent beacon frame, beacon frame status information is accessed by the software state machine 842 from a status information memory storage 846. The status information indicates whether or not the received beacon frame is a first or a subsequent beacon frame. In one embodiment, the status information includes one bit of memory storage. If the beacon frame received is a first beacon frame associated with a fault on the token ring 104, the bit is set to a logic 1 from a logic 0. For each beacon frame received after this first beacon frame, the status information memory storage 846 bit set to a logic 1 provides an indication that the current beacon frame is not the first beacon frame and can be ignored. After the token ring 104 has recovered or the particular fault has been removed that caused the beaconing condition, this bit in the status information memory storage 846 is reset. This bit now becomes a logic 0. In setting or changing the bit to indicate that the ring has recovered from the particular fault, the software state machine 842 checks for a frame generated pursuant to the MAC protocol that indicates or reports the new active monitor station, after token ring recovery, to a configuration report server (CRS). The CRS is a functional address on the token ring 104 and always has the address C00000000010. Any one of the stations on the token ring 104 can be designated as having this functional address. When a frame is generated for sending to the CRS, the testing apparatus 100 detects this frame indicating that the token ring 104 has fully recovered and that normal transmissions can begin. The testing apparatus 100 is also able to report that the token ring 104 has recovered, as well as reporting the domain associated with the beaconing condition from which the token ring 104 just recovered. In that regard, the processor 126 accesses a memory 850 that communicates with the software state machine 842. The memory 850 receives, for storage under processor 126 control, beacon domain information from the software state machine 842. In particular, when a determination is made that a first beacon frame has been received for a particular fault, based on the contents of the data field of the beacon frame and a determination that it is the first beacon frame because of the contents of the status information memory storage 846, address related information is extracted from this beacon frame. The address information includes the source address designated in the frame, together with the NAUN address. These station addresses identify the beacon domain of the original station that began the beaconing process associated with the particular fault. For example, in the case of stationB 812 experiencing a signal loss and not receiving information from its nearest active upstream neighbor stationA 808, the source address that will be stored will be that of the address for stationB 812, together with the address for stationA 808 (its NAUN). In the case of subsequent beacon frames based on the same token ring fault, the software state machine 842 makes a determination not to store the source address and the NAUN address found in such beacon frames. If a subsequent beacon frame is received after the first beacon frame, a determination is made using the status information memory storage 846 that a beacon frame was previously received for this fault and has been stored in the memory 850. Consequently, if a subsequent or phantom beacon frame is received that is transmitted by the original station that sent the first beacon frame or is from another station on the ring 104, the software state machine 842 determines that these are phantom Deacon frames and should be ignored. That is, the source address and the NAUN addresses associated with each phantom domain, which are received after the first beacon frame, are not stored in the memory 850.

With regard to displaying beacon domain information, a display unit or monitor 854 is provided and communicates with the processor 126. The processor 126 is able to access the source address and the NAUN address stored in the memory 850 and use it to provide intelligible information for display on the display unit 854. The network manager is able to read this information and use it in isolating the fault that has caused the beaconing condition. The processor 126 is able to immediately display this information after the beaconing condition has occurred and also displays the same source address and NAUN address information after the token ring 104 has recovered, with the display also indicating that recovery has occurred.

With reference to FIG. 32, a flow diagram is illustrated that sets out the steps related to monitoring beacon domain information. At step 870, a watch or wait is maintained for frames from the token ring 104 including beacon frames that might be received related to a fault on the token ring 104. When a beacon frame is received, at step 874 it is identified as a beacon frame by comparing the contents of the data field of the frame indicating it is a beacon frame with predetermined data that corresponds to a beacon frame. At step 878, a determination is made as to whether or not this is a first beacon frame by checking the contents of the status information memory storage 846. If it is the first beacon frame, at step 882, the proper bit(s) is (are) set or changed to reflect the receipt of a first beacon frame. When it is the first beacon frame, the source address information and the NAUN address information in this first beacon frame are extracted and stored in memory in accordance with step 886. At step 890, such address information can be displayed on the display monitor 854 under processor 126 control. Such information is displayed in readable form so that the network manager can better isolate the fault that initiated the beaconing condition.

In addition to changing the state of bits in the status information memory storage 846 when a first beacon frame is received, a loop is entered that checks for a recovery frame indicating that the token ring 104 has recovered, in accordance with step 894. While waiting for the presence or occurrence of such a frame, determinations continue to be made related to beacon frames that are received after the first beacon frame. In such a case, a determination is made at step 878 that the beacon frame just received is subsequent to the first beacon frame. In such a case, a further determination is made at step 894 as to whether this subsequent frame is a recovery frame indicating that the token ring 104 has recovered from the fault. If it is a recovery frame, at step 882, the bits of the status information memory storage 846 are changed to indicate that such a frame has been received, i.e., a frame that reports the new active monitor station to the configuration report server. If the frame received is neither a first beacon frame nor a recovery frame, as the flow diagram indicates, no further step need be taken with respect to this beacon frame resulting in an ignoring or non-use of any such subsequent beacon frame, including any phantom domain frames.

It should be understood that, although the aforedescribed embodiment is directed to ignoring and not storing information associated with beacon frames that occur after a first beacon frame, procedures and algorithms could be implemented for keeping track of certain, or even all, beacon frames. In such a case, phantom domain information could be monitored and stored and then displayed on the display unit, while indicating that such domains are phantom domains. As a consequence, not only is information displayable indicative of the source address and NAUN address of the originating station for the beaconing condition, but subsequent beacon frames and the address information related thereto are displayable for possible use by the network manager.

It should also be appreciated that, even though the afore-described embodiment is directed to relying on the contents of the first beacon frame that is received as a result of a token ring fault, subsequent type 2 or type 3 beacon frames could also be utilized in providing the desired information. That is, beacon frames that are received by the testing apparatus after the first beacon frame and which originate from the station that first experiences the fault, such as signal loss, contain the same useful address information as the first beacon frame. Consequently, an algorithm or procedure could be employed that monitors and uses one or more of these beacon frames.

The foregoing descriptions of the inventions have been presented for purposes of illustration and understanding. Further, the descriptions are not intended to limit the inventions to the forms disclosed herein. Variations and modifications commensurate with the above teachings and the skill or knowledge of the relevant art are within the scope of these inventions. The preferred embodiments described hereinabove are further intended to explain the best mode known of practicing the inventions and to enable others skilled in the art to utilize them in various embodiments and with various modifications required by their particular applications or uses thereof. It is intended that the appended claims be construed to include alternative embodiments to the extent permitted by the prior art.

What is claimed is:

1. A method for determining whether a fault exists in a cable conductor including a cable conductor end adjacent to a testing apparatus, comprising:

providing a testing apparatus including a directional coupler and detecting means for supplying an output indicative of whether a fault exists in a cable conductor;

connecting a cable conductor end to said testing apparatus;

transmitting a transmit signal to the cable conductor using said testing apparatus;

receiving by said testing apparatus after said transmitting step a return signal when a fault exists in the cable conductor;

using said directional coupler in communication with said transmit signal to avoid applying said transmit signal to said detecting means, wherein said output of said detecting means, when said transmit signal is present, is the same as occurs in the absence of said transmit; and determining using said detecting means that a fault exists in the cable conductor when said return signal is received by said testing apparatus, wherein said return signal changes said output of said detecting means.

2. A method, as claimed in claim 1, wherein:
said step of connecting includes matching an impedance of the cable conductor having the cable conductor end with an impedance in said testing apparatus.

3. A method, as claimed in claim 2, wherein:
said step of matching includes matching the cable conductor impedance to a single resistor in said testing apparatus.

4. An apparatus for determining whether a fault exists in a cable conductor including a cable conductor end adjacent to a testing apparatus, comprising:

transmitter/receiver means for transmitting a transmit signal to a cable conductor connected thereto and for receiving a return signal from the cable conductor when a fault exists therein, said transmitter/receiver means including a directional coupler in communication with said transmit signal; and determining means including detecting means for determining that a fault exists in the cable conductor when said return signal is received by said transmitter/receiver means, with at least a signal related to said return signal being applied to said detecting means, wherein said directional coupler is used to prevent said transmit signal from changing said input to said detecting means and wherein said signal related to said return signal changes said input to said detecting means.

5. An apparatus, as claimed in claim 4, wherein:
said transmitter/receiver means includes a pulse generator and a driver for receiving a pulse outputted by said pulse generator.

6. An apparatus, as claimed in claim 4, wherein:
said directional coupler means includes a balun device.

7. An apparatus, as claimed in claim 4, wherein:
said transmitter/receiver means includes impedance matching means having an impedance substantially corresponding to an impedance of the cable conductor.

8. An apparatus as claimed in claim 4, wherein:
said transmitter/receiver means includes a conductor line electrically connecting the connector end of the cable conductor to remaining portions of said transmitter/receiver means, the length of said conductor line being at least less than 20 feet.

9. An apparatus, as claimed in claim 8, wherein:
said transmitter/receiver means conductor line is contained in a housing and the connector end of the cable conductor is connected to said housing using said transmitter/receiver means conductor line.

10. An apparatus for determining the presence of a fault in a cable conductor, comprising:
first means for producing a transmit signal and for receiving signal, with said return signal being indicative of a first cable conductor fault in the cable conductor;
impedance matching means operatively connected to said first means for matching an impedance of the cable conductor having the first cable conductor fault, said impedance matching means including a plurality of impedance means having only one impedance element and said one impedance element being one of a fixed impedance and a variable impedance set to one impedance value; and
determining means including detecting means for determining at least one of a magnitude and a location related to the first cable conductor fault, said detecting means being in signal communication with only one of said impedance means when said at least one of said magnitude and said location is determined.

11. An apparatus, as claimed in claim 10, wherein:
said first means includes directional coupler means that includes a balun device for use in producing a common mode signal.

12. An apparatus, as claimed in claim 10, wherein:
said only one impedance element is a single resistor having substantially the same resistance as the cable conductor having the first cable conductor fault.

13. An apparatus, as claimed in claim 10, wherein:
said determining means includes second means for determining a magnitude related to said return signal and third means for determining a magnitude related to a location of the first cable conductor fault.

14. An apparatus, as claimed in claim 13, wherein:
said second means includes comparator means for comparing a valise related to said return signal with a predetermined threshold.

15. An apparatus, as claimed in claim 14, wherein:
said second means includes digital/analog converter means having an output connected to said comparator means.

16. An apparatus, as claimed in claim 15, wherein:
said digital/analog converter means includes a variable input that is modifiable by processing means.

17. An apparatus, as claimed in claim 13, wherein:
said third means includes monitoring means for monitoring time related to said return signal.

18. An apparatus, as claimed in claim 17, wherein:
said monitoring means includes means for changing an output indicating receipt of said return signal by said first means and counting means for keeping track of an interval of time until said output of said means for changing changes, said counting means communicating with said first means.

19. An apparatus for determining the presence of a fault in a cable conductor; and
first means for producing a transmit signal and for receiving a return signal, with said return signal being indicative of a first cable conductor fault in the cable conductor; and
determining means for determining at least one of a magnitude and a location related to the first cable conductor fault, said determining means including second means for determining a magnitude related to said return signal and third means for determining a magnitude related to a location of the first cable conductor fault, said third means including monitoring means for monitoring time related to said return signal, said determining means including masking means for controlling the determination of the presence of a cable conductor fault, said masking means for use in providing an output related to the presence of a second cable conductor fault that generates a return signal less in magnitude than the first cable conductor fault and with the second cable conductor fault being located at a greater distance from a cable conductor connector end than is the first cable conductor fault.

* * * * *